(12) United States Patent
Nozaki et al.

(10) Patent No.: US 10,363,733 B2
(45) Date of Patent: *Jul. 30, 2019

(54) PHOTOSENSITIVE RESIN COMPOSITION, PLANOGRAPHIC PRINTING PLATE PRECURSOR, METHOD FOR PRODUCING PLANOGRAPHIC PRINTING PLATE, AND POLYMER COMPOUND

(71) Applicant: FUJIFILM CORPORATION, Minato-ku, Tokyo (JP)

(72) Inventors: Atsuyasu Nozaki, Shizuoka (JP); Takashi Sato, Shizuoka (JP); Rena Mukaiyama, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 15/448,570

(22) Filed: Mar. 2, 2017

(65) Prior Publication Data

US 2017/0173938 A1 Jun. 22, 2017

Related U.S. Application Data

(63) Continuation of application No. PCT/JP2015/074803, filed on Aug. 31, 2015.

(30) Foreign Application Priority Data

Sep. 26, 2014 (JP) .................. 2014-196598

(51) Int. Cl.
| | | |
|---|---|---|
| G03F 7/32 | (2006.01) |
| B41C 1/10 | (2006.01) |
| G03F 7/00 | (2006.01) |
| G03F 7/004 | (2006.01) |
| G03F 7/039 | (2006.01) |
| G03F 7/095 | (2006.01) |
| B41N 1/14 | (2006.01) |
| C08G 73/02 | (2006.01) |
| G03F 7/11 | (2006.01) |
| G03F 7/20 | (2006.01) |

(52) U.S. Cl.
CPC .............. *B41C 1/1008* (2013.01); *B41N 1/14* (2013.01); *C08G 73/026* (2013.01); *G03F 7/00* (2013.01); *G03F 7/004* (2013.01); *G03F 7/039* (2013.01); *G03F 7/095* (2013.01); *G03F 7/11* (2013.01); *G03F 7/20* (2013.01); *G03F 7/322* (2013.01)

(58) Field of Classification Search
CPC ........................................................ G03F 7/32
See application file for complete search history.

(56) References Cited

U.S. PATENT DOCUMENTS

2005/0069812 A1* 3/2005 Maemoto .............. B41C 1/1008
430/270.1

FOREIGN PATENT DOCUMENTS

| EP | 2343195 A1 * | 7/2011 | ........... B41C 1/1008 |
|---|---|---|---|
| EP | 2343195 A1 | 7/2011 | |
| EP | 3128369 A1 | 2/2017 | |
| JP | H02-156241 A | 6/1990 | |
| JP | 2005-106910 A | 4/2005 | |
| PL | 99753 B1 | 8/1978 | |

OTHER PUBLICATIONS

Written Opinion of the ISA issued in International Application No. PCT/JP2015/074803 dated Dec. 8, 2015.
Extended European Search Report dated Jul. 25, 2017, issued in corresponding EP Patent Application No. 15843927.3.
Office Action dated May 7, 2019, issued by the EPO in corresponding EP Patent Application No. EP15843927.3.

* cited by examiner

*Primary Examiner* — Chanceity N Robinson
(74) *Attorney, Agent, or Firm* — Solaris Intellectual Property Group, PLLC

(57) ABSTRACT

Provided are a photosensitive resin composition which enables production of a lithographic printing plate precursor having a non-image portion which has good solubility in an alkali aqueous solution and which enables production of a lithographic printing plate having excellent chemical resistance and excellent printing durability, a lithographic printing plate precursor obtained by using the photosensitive resin composition, a method for producing a lithographic printing plate, and a new polymer compound. The photosensitive resin composition of the present invention contains: a polymer compound which has an amine bond or a quaternary ammonium salt bond, and at least one bond selected from the group consisting of a urea bond, a urethane bond, and a carbonate bond in the main chain and has a sulfonamide group or a phenolic hydroxyl group in the main chain and/or the side chain; and an infrared absorbing material.

11 Claims, No Drawings

PHOTOSENSITIVE RESIN COMPOSITION, PLANOGRAPHIC PRINTING PLATE PRECURSOR, METHOD FOR PRODUCING PLANOGRAPHIC PRINTING PLATE, AND POLYMER COMPOUND

CROSS-REFERENCE TO RELATED APPLICATIONS

This application is a continuation application of International Application No. PCT/JP2015/074803, filed Aug. 31, 2015, the disclosure of which is incorporated herein by reference in its entirety. Further, this application claims priority from Japanese Patent Application No. 2014-196598, filed Sep. 26, 2014, the disclosure of which is incorporated herein by reference in its entirety.

BACKGROUND OF THE INVENTION

1. Field of the Invention

The present invention relates to a photosensitive resin composition, a lithographic printing plate precursor, a method for producing a lithographic printing plate, and a polymer compound.

2. Description of the Related Art

In recent years, the development of lasers has been remarkable, and in particular, solid lasers and semiconductor lasers having an emission region in a near infrared region to an infrared region, with a high output and a small size, have become easily available. In the field of lithographic printing, as an exposure light source when manufacturing a printing plate directly from digital data from a computer or the like, these lasers are very useful.

A positive type lithographic printing plate precursor for infrared laser has an alkali-soluble binder resin and an IR dye which absorbs light and generates heat, as essential components. In the unexposed portion (image portion), the IR dye and the like act as a development restrainer which substantially decreases the solubility of a binder resin in a developer due to an interaction with the binder resin, and in the exposed portion (non-image portion), the interaction between the IR dye and the like and the binder resin weakens due to generated heat, and the IR dye and the like dissolve in an alkaline developer, and as a result, a lithographic printing plate is formed.

As the lithographic printing plate in the related art, the lithographic printing plates described in JP1990-156241A (JP-H02-156241A) or JP2005-106910A are known.

SUMMARY OF THE INVENTION

Since the image forming capability of a positive type lithographic printing plate precursor for infrared laser as described above depends on the heat generated by infrared laser exposure to the recording layer surface, in the vicinity of a support, an image is formed by diffusion of heat to the support, that is, the heat quantity to be used for solubilization of the recording layer is reduced, and thus, sensitivity becomes low. Therefore, there is a problem in which development restraining ability loss effects of the recording layer in the non-image portion are not sufficiently obtained, the difference between the image portion and the non-image portion is reduced, and thus, highlight reproducibility is insufficient.

In addition, to solve the above-described problem of the highlight reproducibility, using a recording layer formed of a material having characteristics in which a non-image portion can be more easily developed, that is, the solubility in an alkali aqueous solution is better may be considered, but there is a problem in which such a recording layer is chemically weakened even in the image portion region and easily damaged by an ink washing solvent used in the developer or during printing, or the plate cleaner, that is, is poor in chemical resistance, and in the unexposed portion region, there is demand for a resin material having characteristics in which the chemical resistance and the durability of the coating film are excellent and the developability thereof becomes excellent after the dissolution suppressing action is removed by exposure.

For the same purpose as described above, various improved techniques have been proposed, and for example, a technique for a lithographic printing plate precursor in which a recording layer containing a polyurethane resin having sulfonamide in the main chain which is insoluble in water and soluble in an alkaline aqueous solution, a photosensitive composition containing a photosensitive compound which acts as a positive type (for example, refer to JP1990-156241A (JP-H02-156241A)) or a water-insoluble and alkali-soluble resin having an active hydrogen in the main chain, on a support, and an infrared absorbent, of which the solubility in an alkaline aqueous solution is increased by exposure is provided has been disclosed (for example, refer to JP2005-106910A). According to these lithographic printing plate precursors, it is possible to provide a positive type lithographic printing plate precursor having excellent printing durability and excellent chemical resistance.

However, in recent years, diversifying and varying of print materials (paper, ink, and the like) have progressed, and even in the case of using the same printing plate, there is a problem in which the number of printable sheets (hereinafter, referred to as "printing durability") is greatly reduced depending on the type of a print material, in the former technique, chemical resistance is excellent, but there is problem in which, in particular, since the film hardness of the resin used in the underlayer is not sufficient, the printing durability in printing using a low quality print material (paper or ink) is greatly reduced and since the development speed (developability) to an alkali aqueous solution is not sufficient, the difference between the image portion and the non-image portion is reduced, and thus, highlight reproducibility is not sufficient, and in the latter technique, the printing durability and the highlight reproducibility in printing using a high quality print material (paper or ink) are excellent, but there is problem in which, in particular, since the film hardness of the resin used in the underlayer is not sufficient, the printing durability in printing using a low quality print material (paper or ink) is greatly reduced, and thus, this technique also has room for improvement. Therefore, it is difficult to maintain and improve a plurality of characteristics such as printing durability depending on the film hardness of the underlayer, chemical resistance, the development speed (highlight reproducibility) to an alkali aqueous solution.

An object of the present invention is to provide a photosensitive resin composition which enables production of a lithographic printing plate precursor having good solubility in an alkali aqueous solution at the time of development of the lithographic printing plate precursor and which enables production of a lithographic printing plate having excellent chemical resistance and excellent printing durability, a lithographic printing plate precursor obtained by using the photosensitive resin composition, a method for producing a lithographic printing plate, and a new polymer compound.

The above-described object of the present invention has been achieved by the means according to the following <1>, <9>, and <13> to <16>. <1>, <9>, and <13> to <16> are described below with <2> to <8>, <10> to <12>, and <17> to <19> which are preferable embodiments.

<1> A photosensitive resin composition containing: a polymer compound which has an amine bond or a quaternary ammonium salt bond, and at least one bond selected from the group consisting of a urea bond, a urethane bond, and a carbonate bond in the main chain and has a sulfonamide group or a phenolic hydroxyl group in the main chain and/or the side chain; and an infrared absorbing material.

<2> The photosensitive resin composition according to <1>, in which the polymer compound has at least one constitutional unit represented by the following Formula 1 or 2 in the main chain.

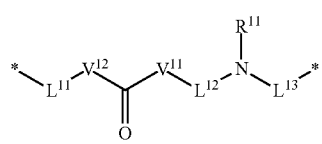

(1)

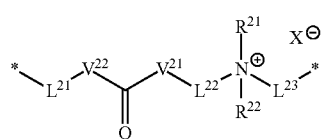

(2)

In Formulae 1 and 2, $R^{11}$ represents a hydrogen atom or a monovalent organic group, $L^{11}$ to $L^{13}$ each independently represent a divalent linking group, $V^{11}$ and $V^{12}$ each independently represent —N($R^{14}$)— or —O—, $R^{14}$ represents a hydrogen atom or a monovalent organic group, $R^{21}$ and $R^{22}$ each independently represent a hydrogen atom or a monovalent organic group, $L^{21}$ to $L^{23}$ each independently represent a divalent linking group, $V^{21}$ and $V^{22}$ each independently represent —N($R^{24}$)— or —O—, $R^{24}$ represents a hydrogen atom or a monovalent organic group, X represents an inorganic or organic conjugate base, and the "*" portions each independently represent a binding position with another structure.

<3> The photosensitive resin composition according to <2>, in which $V^{11}$ and $V^{12}$ represent —N($R^{14}$)—, and $V^{21}$ and $V^{22}$ represent —N($R^{24}$)—.

<4> The photosensitive resin composition according to <2> or <3>, in which at least one of $L^{11}$, $L^{12}$, or $L^{13}$ represents a linking group having a sulfonamide group or a phenolic hydroxyl group, and at least one of $L^{21}$, $L^{22}$, or $L^{23}$ represents a linking group having a sulfonamide group or a phenolic hydroxyl group.

<5> The photosensitive resin composition according to any one of <2> to <4>, in which $L^{11}$ represents a linking group having a sulfonamide group or a phenolic hydroxyl group, and $L^{21}$ represents a linking group having a sulfonamide group or a phenolic hydroxyl group.

<6> The photosensitive resin composition according to any one of <2> to <5>, in which $L^{11}$ and/or $L^{21}$ is represented by the following Formula A-1.

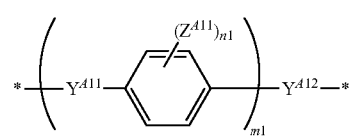

(A-1)

In Formula A-1, $Y^{411}$ and $Y^{412}$ each independently represent a single bond or a divalent linking group, $Z^{411}$'s each independently represent a sulfonamide group or a hydroxy group, m1 represents an integer of 1 or greater, n1 represents an integer of 1 to 4, and the "*" portions each independently represent a binding position with another structure.

<7> The photosensitive resin composition according to any one of <2> to <5>, in which $L^{11}$ and/or $L^{21}$ is represented by the following Formula A-2.

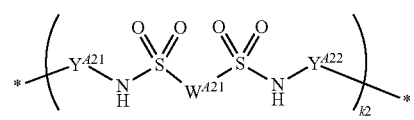

(A-2)

In Formula A-2, $Y^{421}$ and $Y^{422}$ each independently represent a divalent linking group, $W^{421}$ represents an arylene group or a combination of an arylene group and a divalent linking group, k2 represents an integer of 1 or greater, and the "*" portions each independently represent a binding position with another structure.

<8> The photosensitive resin composition according to any one of <2> to <5>, in which $L^{11}$ and/or $L^{21}$ is represented by the following Formula A-3.

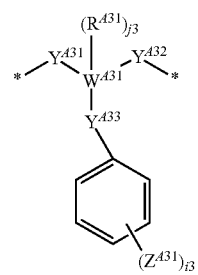

(A-3)

In Formula A-3, $R^{431}$ represents a hydrogen atom or a monovalent organic group, $Y^{431}$, $Y^{432}$, and $Y^{433}$ each independently represent a divalent linking group, $W^{431}$ represents a carbon atom or a nitrogen atom, $Z^{431}$'s each independently represent a sulfonamide group or a hydroxy group, i3 represents an integer of 1 to 5, j3 represents 1 or 0, and the "*" portions each independently represent a binding position with another structure.

<9> A lithographic printing plate precursor comprising: a recording layer which contains the photosensitive resin composition according to any one of <1> to <8>, on a support having a hydrophilic surface.

<10> The lithographic printing plate precursor according to <9>, which is of a positive type.

<11> The lithographic printing plate precursor according to <9> to <10>, which is formed to include the recording layer having an underlayer and an upper layer in this order, on the support having a hydrophilic surface, in which at least one of the underlayer or the upper layer contains the photosensitive resin composition.

<12> The lithographic printing plate precursor according to any one of <9> to <11>, comprising: an undercoat between the support and the recording layer.

<13> A method for producing a lithographic printing plate, comprising in the following order: an exposure step of image-wise exposing the lithographic printing plate precursor according to any one of <9> to <12>; and a development step of developing using an alkali aqueous solution having a pH of 8.5 to 13.5.

<14> A polymer compound comprising: an amine bond or a quaternary ammonium salt bond, and at least one bond selected from the group consisting of a urea bond, a urethane bond, and a carbonate bond in the main chain; and a constitutional unit represented by the following Formula A-4 in the main chain.

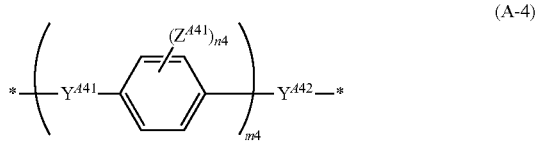
(A-4)

In Formula A-4, $Y^{A41}$ and $Y^{A42}$ each independently represent a single bond, or a divalent linking group, $Z^{A41}$'s each independently represent a sulfonamide group or a hydroxy group, m4 represents an integer of 1 or greater, n4 represents an integer of 1 to 4, and the "*" portions each independently represent a binding position with another structure.

<15> A polymer compound comprising: an amine bond or a quaternary ammonium salt bond, and at least one bond selected from the group consisting of a urea bond, a urethane bond, and a carbonate bond in the main chain; and a constitutional unit represented by the following Formula A-5 in the main chain.

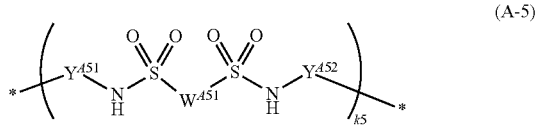
(A-5)

In Formula A-5, $Y^{A51}$ and $Y^{A52}$ each independently represent a divalent linking group, $W^{A51}$ represents an arylene group or a combination of an arylene group and a divalent linking group, k5 represents an integer of 1 or greater, and the "*" portions each independently represent a binding position with another structure.

<16> A polymer compound comprising: an amine bond or a quaternary ammonium salt bond, and at least one bond selected from the group consisting of a urea bond, a urethane bond, and a carbonate bond in the main chain; and a constitutional unit represented by the following Formula A-6 in the main chain.

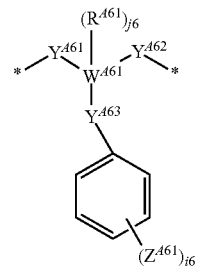
(A-6)

In Formula A-6, $R^{A61}$ represents a hydrogen atom or a monovalent organic group, $Y^{A61}$, $Y^{A62}$, and $Y^{A63}$ each independently represent a divalent linking group, $W^{A61}$ represents a carbon atom or a nitrogen atom, $Z^{A61}$'s each independently represent a sulfonamide group or a hydroxy group, i6 represents an integer of 1 to 5, j6 represents 1 or 0, and the "*" portions each independently represent a binding position with another structure.

<17> The polymer compound according to <14>, in which $Y^{A41}$ and $Y^{A42}$ each independently represent a single bond, an alkylene group, or an arylene group.

<18> The polymer compound according to <15>, in which $Y^{A51}$ and $Y^{A52}$ each independently represent an alkylene group or an arylene group.

<19> The polymer compound according to <16>, in which $Y^{A61}$, $Y^{A62}$ and $Y^{A63}$ each independently represent an alkylene group or an arylene group.

According to the present invention, it is possible to provide a photosensitive resin composition which enables production of a lithographic printing plate precursor having good solubility in an alkali aqueous solution at the time of development of the lithographic printing plate precursor and which enables production of a lithographic printing plate having excellent chemical resistance and excellent printing durability, a lithographic printing plate precursor obtained by using the photosensitive resin composition, a method for producing a lithographic printing plate, and a new polymer compound.

DESCRIPTION OF THE PREFERRED EMBODIMENTS

Hereinafter, the content of the present invention will be described in detail. The description of the constitutive elements as described below is based on representative embodiments of the present invention, but the present invention is not limited to such embodiments. Moreover, in the present specification, "to" is used to show a range in which the numerical values described before and after "to" indicate the upper limit value and the lower limit value.

Regarding the description of a group (atomic group) in the present specification, when the description does not indicate whether a group is substituted or unsubstituted, the description includes both a group having a substituent and a group not having a substituent. For example, "alkyl group" includes not only an alkyl group (an unsubstituted alkyl group) which does not have a substituent, but also an alkyl group (a substituted alkyl group) which has a substituent.

In addition, the chemical structural formulae in the present specification are described using simplified structural formulae in which hydrogen atoms have been omitted, in some cases.

Moreover, in the present specification, "(meth)acrylate" represents acrylate and methacrylate, "(meth)acrylic" represents acrylic and methacrylic, and "(meth)acryloyl" represents acryloyl and methacryloyl.

In addition, in the present invention, "% by mass" has the same meaning as "% by weight", and "part(s) by mass" has the same meaning as "part(s) by weight".

In the present invention, a "constitutional unit represented by Formula 1" is also simply referred to as a "constitutional unit 1".

Further, the "*" portions in the chemical formulae each independently represent a binding position with another structure.

In addition, in the present invention, preferable aspects in a combination are more preferable.

(Photosensitive Resin Composition)

A photosensitive resin composition of the present invention contains a polymer compound which has an amine bond or a quaternary ammonium salt bond, and at least one bond selected from the group consisting of a urea bond, a urethane bond, and a carbonate bond in the main chain and has a sulfonamide group or a phenolic hydroxyl group in the main chain and/or the side chain; and an infrared absorbing material.

In the present invention, a "main chain" indicates relatively the longest bonding chain in a molecule of a polymer compound constituting a resin and a "side chain" indicates a carbon chain branched from the main chain.

Further, in the present invention, a "phenolic hydroxyl group" indicates a hydroxyl group directly bonded to an aromatic hydrocarbon ring and the expression "having a phenolic hydroxyl group in the main chain or in the side chain" means that the main chain or the side chain has a divalent aromatic hydrocarbon group to which a hydroxyl group is directly bonded.

As a result of conducting extensive studies, the inventors of the present invention found that it is possible to provide a lithographic printing plate precursor having excellent chemical resistance, printing durability, and non-image portion development time when the photosensitive resin composition contains a polymer compound which has an amine bond or a quaternary ammonium salt bond, and at least one bond selected from the group consisting of a urea bond, a urethane bond, and a carbonate bond in the main chain and has a sulfonamide group or a phenolic hydroxyl group in the main chain and/or the side chain; and an infrared absorbing material.

Although the action mechanism of the excellent effects due to containing the above materials is not clear, it is estimated as follows.

By studies by the present inventors, it was found that the film hardness of a resin is important to the printing durability in printing and the film hardness is significantly influenced by an interaction between binders. In particular, in low quality print materials, the effect is significant, and in general acrylic resins or polyurethane resins, sufficient film hardness is less likely to be imparted. It is thought that this is because inorganic salt particles (calcium carbonate, kaolin, or the like) included in a print material (paper, ink, or the like) are eluted during printing, this polishes to the image portion of the printing plate, and as a result, abrasion is promoted. In contrast, the binder polymer of the present invention has a plurality of bonds having a very high interaction such as a urea bond, a urethane bond, or a carbonate bond, in addition to an amine bond or an ammonium salt bond in the main chain, and thus, the binder polymer has excellent printing durability. It is estimated that this is caused by improvement of the film hardness of the resin and effects of suppressing abrasion of the image portion of the printing plate.

In addition, by studies by the present inventors, it was found that it is effective for chemical resistance to increase the polarity of a binder polymer. The binder polymer of the present invention has a bond such as a urea bond, a urethane bond, or a carbonate bond and a high-polar group such as a phenolic hydroxyl group or a sulfonamide group, in addition to an amine bond or an ammonium salt bond in the main chain, and thus, the binder polymer has excellent chemical resistance. As a result, it is thought that both hardness and chemical resistance of an image portion can be achieved.

Hereinafter, first, a polymer compound and an infrared absorbing material which are essential components of the photosensitive resin composition of the present invention will be described.

<Polymer Compound>

The polymer compound used in the present invention (hereinafter, also referred to as a "specific polymer compound") has an amine bond or a quaternary ammonium salt bond, and at least one bond selected from the group consisting of a urea bond, a urethane bond, and a carbonate bond in the main chain and has a sulfonamide group or a phenolic hydroxyl group in the main chain and/or the side chain.

[Amine Bond or Quaternary Ammonium Bond]

In the specific polymer compound, the amine bond indicates a divalent bond represented by —$NR^x$— and $R^x$ represents a hydrogen atom or a monovalent organic group, preferably a hydrogen atom, an alkyl group, or an aryl group, more preferably a hydrogen atom, an alkyl group having 6 or less carbon atoms, or an aryl group having 6 to 10 carbon atoms, still more preferably a hydrogen atom, an alkyl group having 3 or less carbon atoms, or a phenyl group, and particularly preferably a hydrogen atom or a methyl group.

The quaternary ammonium salt bond indicates a divalent bond represented by —$N^+R^yR^z$— and $R^y$ and $R^z$ each independently represent a hydrogen atom or a monovalent organic group, preferably a hydrogen atom, an alkyl group, or an aryl group, more preferably a hydrogen atom, an alkyl group having 6 or less carbon atoms, or an aryl group having 6 to 10 carbon atoms, still more preferably a hydrogen atom, an alkyl group having 3 or less carbon atoms, or a phenyl group, and particularly preferably a hydrogen atom or a methyl group.

[Urea Bond, Urethane Bond, and Carbonate Bond]

The specific polymer compound has at least one bond selected from the group consisting of a urea bond, a urethane bond, and a carbonate bond and it is preferable that the main chain skeleton thereof is at least one bond selected from the group consisting of a urea bond, a urethane bond, and a carbonate bond. From the viewpoints of image formability, printing durability, and production suitability, a urethane bond is preferable as the main chain skeleton of the specific polymer compound. Further, from the viewpoints of chemical resistance, printing durability, and developability, a urea bond is preferable as the main chain skeleton.

[Sulfonamide Group or Phenolic Hydroxyl Group]

The specific polymer compound has a sulfonamide group or a phenolic hydroxyl group in the main chain and/or the side chain and it is preferable that the specific polymer compound has a sulfonamide group or a phenolic hydroxyl group in the main chain.

[Constitutional Unit Represented by Formula 1 or 2]

It is preferable that the specific polymer compound has at least one constitutional unit represented by the following Formula 1 or 2 in the main chain.

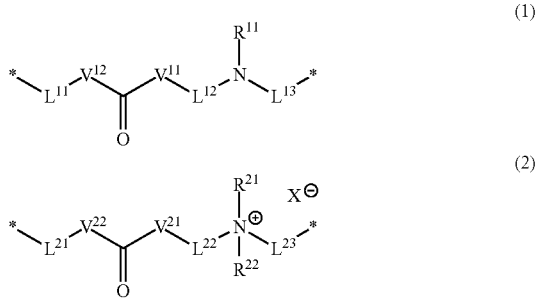

In Formula 1, $R^{11}$ represents a hydrogen atom or a monovalent organic group, preferably a hydrogen atom, an alkyl group, or an aryl group, more preferably a hydrogen atom, an alkyl group having 6 or less carbon atoms, or an aryl group having 6 to 10 carbon atoms, and still more preferably a hydrogen atom, an alkyl group having 3 or less carbon atoms, or a phenyl group.

Further, $R^{11}$ may be substituted with an acidic group and preferred examples of the acidic group include a sulfonamide group or a phenolic hydroxyl group.

$L^{11}$ to $L^{13}$ each independently represent a divalent linking group, preferably an alkylene group, an arylene group, a sulfonamide group, a phenolic hydroxyl group, or a linking group having a combination of these, and more preferably an alkylene group having 4 or less carbon atoms, an arylene group having 6 to 10 carbon atoms, a sulfonamide group, a phenolic hydroxyl group, or a linking group having a combination of these.

Further, it is preferable that at least one of $L^{11}$, $L^{12}$, or $L^{13}$ represents a linking group having a sulfonamide group or a phenolic hydroxyl group and more preferable that $L^{11}$ represents a linking group having a sulfonamide group or a phenolic hydroxyl group.

In a case where $L^{11}$ represents a linking group having a sulfonamide group or a phenolic hydroxyl group, it is preferable that $L^{12}$ represents a divalent linking group represented by $—V^{11\prime}—N(=O)—V^{12\prime}—$, an alkylene group, an arylene group, or a linking group having a combination of these, and $L^{13}$ represents an alkylene group. $V^{11\prime}$ and $V^{12\prime}$ each independently represent $—N(R^{14\prime})—$ or $—O—$ and it is preferable that both of $V^{11\prime}$ and $V^{12\prime}$ represent $—N(R^{14\prime})—$ and also preferable that both of $V^{11\prime}$ and $V^{12\prime}$ represent the same structure represented by $V^{11}$ and $V^{12}$ described below. In this case, it is preferable that $L^{12}$ and $L^{13}$ do not include a sulfonamide group or a phenolic hydroxyl group.

$V^{11}$ and $V^{12}$ each independently represent $—N(R^{14})—$ or $—O—$ and it is preferable that both of $V^{11}$ and $V^{12}$ represent $—N(R^{14})—$. $R^{14}$ represents a hydrogen atom or a monovalent organic group and is preferably a hydrogen atom.

In addition, $R^{11}$ and $L^{13}$ in a linking group represented by Formula 1 may be bonded to $R^{11}$ and $L^{13}$ in another linking group represented by Formula 1 to form a ring.

In Formula 2, $R^{21}$ and $R^{22}$ each independently represent a hydrogen atom or a monovalent organic group, preferably a hydrogen atom, an alkyl group, or an aryl group, more preferably a hydrogen atom, an alkyl group having 6 or less carbon atoms, or an aryl group having 6 to 10 carbon atoms, and still more preferably a hydrogen atom, an alkyl group having 3 or less carbon atoms, or a phenyl group. Further, it is preferable that at least one of $R^{21}$ or $R^{22}$ represents a hydrogen atom.

$L^{21}$ to $L^{23}$ each independently represent a divalent linking group, preferably an alkylene group, an arylene group, a combination of these, or a linking group having sulfonamide group or a phenolic hydroxyl group, and more preferably an alkylene group having 4 or less carbon atoms, an arylene group having 6 to 10 carbon atoms, a combination of these, or a linking group having a sulfonamide group or a phenolic hydroxyl group.

In addition, it is preferable that at least one of $L^{21}$, $L^{22}$, or $L^{23}$ represents a linking group having a sulfonamide group or a phenolic hydroxyl group and more preferable that $L^{21}$ represents a linking group having a sulfonamide group or a phenolic hydroxyl group.

In a case where $L^{21}$ represents a linking group having a sulfonamide group or a phenolic hydroxyl group, it is preferable that $L^{22}$ represents a divalent linking group represented by $—V^{21\prime}—N(=O)—V^{22\prime}—$, an alkylene group, an arylene group, or a linking group having a combination of these, and $L^{23}$ represents an alkylene group. $V^{21\prime}$ and $V^{22\prime}$ each independently represent $—N(R^{24\prime})—$ or $—O—$ and it is preferable that both of $V^{21\prime}$ and $V^{22\prime}$ represent $—N(R^{24\prime})—$ and also preferable that both of $V^{21\prime}$ and $V^{22\prime}$ represent the same structure represented by $V^{21}$ and $V^{22}$ described below. In this case, it is preferable that $L^{22}$ and $L^{23}$ do not include a sulfonamide group or a phenolic hydroxyl group.

$V^{21}$ and $V^{22}$ each independently represent $—N(R^{24})—$ or $—O—$ and it is preferable that both of $V^{21}$ and $V^{22}$ represent $—N(R^{24})—$. $R^{24}$ represent a hydrogen atom or a monovalent organic group and preferably a hydrogen atom.

X represents an inorganic or organic conjugate base and preferably an organic anion. The above-described organic or inorganic anion may be a monovalent anion or a di- or higher valent anion. It is preferable that these anions are present such that the amount thereof is electrically the same as that of cations such as an ammonium group and the like in the specific polymer compound.

Examples of the organic anion include an alkane or arene sulfonate ion, an alkyl or aryl carboxylate ion. Specific examples thereof include a methane sulfonate ion, a benzene sulfonate ion, a toluene sulfonate ion, and an acetate ion.

Examples of the inorganic anion include a halide ion, a sulfate ion, and a phosphate ion, and a halide ion is preferable and examples of the halide ion include a chloride ion and a bromide ion.

Further, it is preferable that X represents an anion derived from a monovalent acidic compound described below.

The constitutional unit 2 is obtained by neutralization of an amino group of the constitutional unit 1 with an acid.

Further, it is preferable that the resin composition contains a monovalent acidic compound described below in order to generate the constitutional unit 2 from the constitutional unit 1.

The proportion of the constitutional unit 1 is preferably in a range of 1% to 50% by mass, more preferably in a range of 1% to 30% by mass, and still more preferably in a range of 1% to 15% by mass with respect to the total mass of the specific polymer compound used in the present invention. The proportion of the constitutional unit 2 is preferably in a range of 1% to 50% by mass, more preferably in a range of 1% to 30% by mass, and still more preferably in a range of 1% to 15% by mass with respect to the total mass of the specific polymer compound used in the present invention.

The proportion of the constitutional unit 2 is preferably in a range of 30% to 100% by mass and more preferably in a range of 50% to 100% by mass with respect to the total mass of the constitutional unit 1 and the constitutional unit 2 in the specific polymer compound used in the present invention.

It is preferable that the specific polymer compound contains a constitutional unit represented by Formula 2 in the main chain.

When the polymer compound contains the constitutional unit 2, a lithographic printing plate having excellent chemical resistance and printing durability is obtained.

[Linking Group A-1]

In Formula 1 or 2, it is preferable that $L^{11}$ and/or $L^{21}$ is represented by the following Formula A-1.

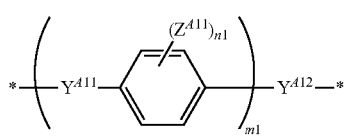

(A-1)

In Formula A-1, $Y^{411}$ and $Y^{412}$ each independently represent a single bond or a divalent linking group, preferably a single bond, an alkylene group, or an arylene group, more preferably a single bond, an alkylene group having 4 or less carbon atoms, an arylene group having 6 to 10 carbon atoms, and still more preferably a single bond.

It is preferable that $Y^{411}$ and $Y^{412}$ directly bonded to binding sites with another structure which are represented by the symbol "*" each independently represent a single bond and more preferable that both of $Y^{411}$ and $Y^{412}$ represent a single bond.

It is preferable that $Y^{411}$ not directly bonded to a binding site with another structure which is represented by the symbol "*" represents a single bond, an alkylene group having 3 or less carbon atoms, or a sulfonyl group and more preferable that $Y^{411}$ represents a single bond or an alkylene group having 3 or less carbon atoms. The alkylene group may be substituted and examples of the substituent include an alkyl group having 6 or less carbon atoms, an aryl group having 6 to 10 carbon atoms, a halogen atom, or a combination of these.

Further, $Y^{411}$ may have an acidic group such as a phenolic hydroxyl group.

$Z^{411}$'s each independently represent a sulfonamide group or a hydroxy group and preferably a hydroxy group.

m1 represents an integer of 1 or greater, preferably 1 or 2, and more preferably 2.

n1 represents an integer of 1 to 4, preferably 1 or 2, and more preferably 1.

It is preferable that a linking group A-1 in the specific polymer compound is a linking group having a structure derived from the following exemplified compound.

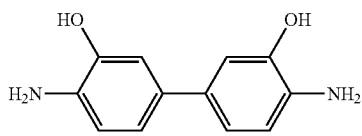

DADHB

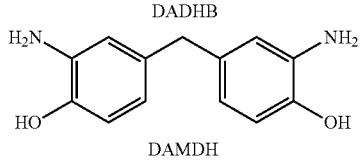

DAMDH

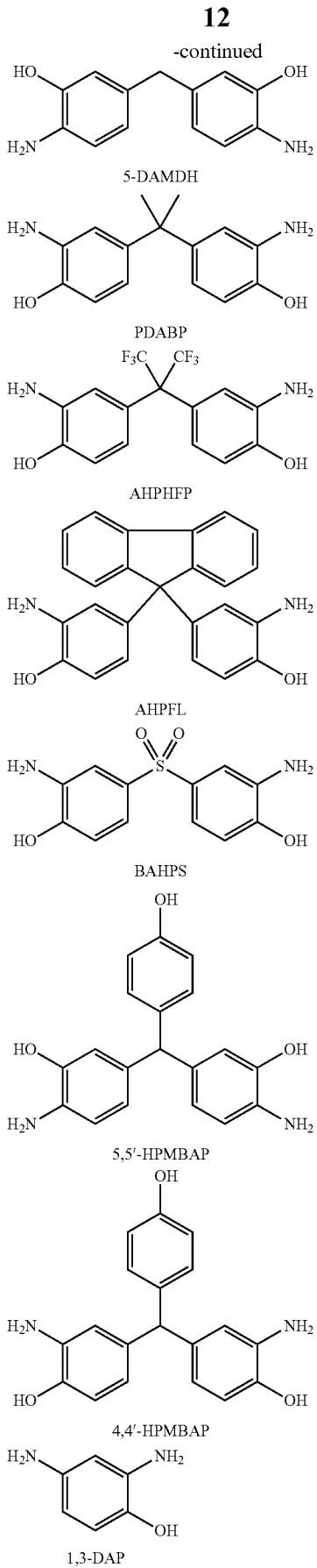

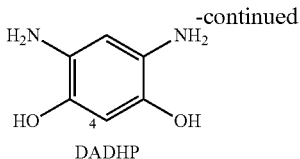

DADHP

[Linking Group A-2]

In the photosensitive resin composition of the present invention, it is preferable that $L^{11}$ and/or $L^{21}$ is represented by the following Formula A-2.

Hereinafter, each constitutional unit of the above-described polymer compounds and a combination of the constitutional units will be described.

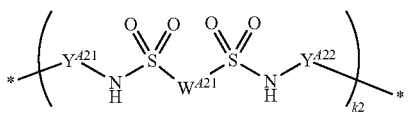 (A-2)

In Formula A-2, $Y^{A21}$ and $Y^{A22}$ each independently represent a divalent linking group, preferably an alkylene group or an arylene group, more preferably an alkylene group having 6 or less carbon atoms or an arylene group having 6 to 10 carbon atoms, and still more preferably an alkylene group having 2 or less carbon atoms or a phenylene group.

$W^{A21}$ represents an arylene group or a combination of an arylene group and a divalent linking group and preferably an arylene group.

As the arylene group, an arylene group having 6 to 10 carbon atoms is preferable and a phenylene group is more preferable.

In a case where $W^{A21}$ represents a phenylene group, it is preferable that two sulfonamide groups in the linking group A-2 are bonded at the meta position.

In a case where $W^{A21}$ represents a combination of an arylene group and a divalent linking group, a phenylene group is preferable as the arylene group and an ether bond (—O—) or a sulfonyl group is preferable as the divalent linking group.

Further, in a case where $W^{A21}$ represents a combination of a phenylene group and an ether bond (—O—) or a sulfonyl group, it is preferable that $W^{A21}$ represents a group represented by the following Formula (A-2-1).

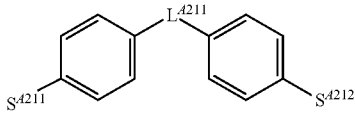 (A-2-1)

In Formula A-2-1, $L^{A211}$ represents an ether bond (—O—) or a sulfonyl group and $S^{A211}$ and $S^{A212}$ each independently represent a binding site with a sulfur atom of a sulfonamide group in the linking group A-2.

k2 represents an integer of 1 or greater, preferably 1 to 3, and more preferably 1.

In Formula 1 or 2, in a case where $V^{A21}$ represents an oxygen atom and $V^{A22}$ represents a nitrogen atom, $Y^{A21}$ and $Y^{A22}$ are preferably an alkylene group or an arylene group and more preferably an alkylene group having 4 or less carbon atoms. The alkylene group or the arylene group as $Y^{A21}$ and $Y^{A22}$ may be substituted. As the substituent, an alkyl group having 6 or less carbon atoms, an alkoxy group having 6 or less carbon atoms, or a halogen atom is preferable. Further, it is more preferable that the alkylene group or the arylene group is substituted with an alkyl group having 4 or less carbon atoms or is unsubstituted.

In Formula A-2, in a case where both of $V^{A21}$ and $V^{A22}$ represent an oxygen atom, $Y^{A21}$ and $Y^{A22}$ represent preferably an alkylene group or an arylene group and more preferably an alkylene group having 4 or less carbon atoms. The alkylene group or the arylene group as $Y^{A21}$ and $Y^{A22}$ may be substituted. As the substituent, an alkyl group having 6 or less carbon atoms, an alkoxy group having 6 or less carbon atoms, or a halogen atom is preferable. Further, it is more preferable that the alkylene group or the arylene group is substituted with an alkyl group having 4 or less carbon atoms or is unsubstituted.

Further, it is preferable that the linking group A-2 in the specific polymer compound is a linking group having a structure derived from the following exemplified compound.

SP-1

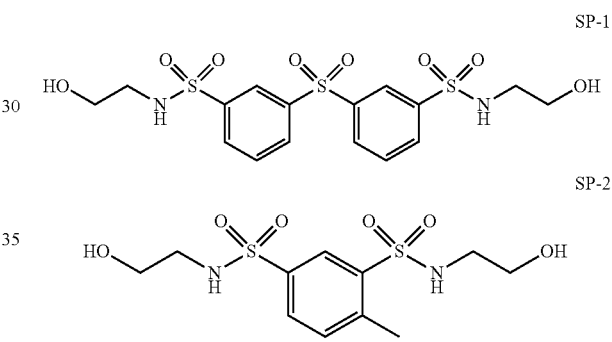

SP-2

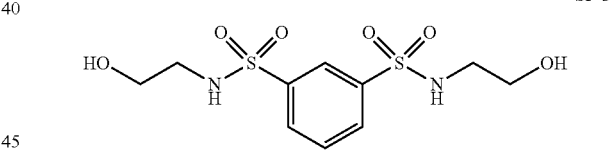

SP-3

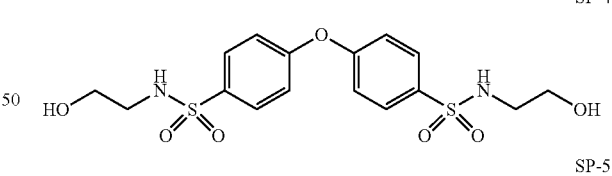

SP-4

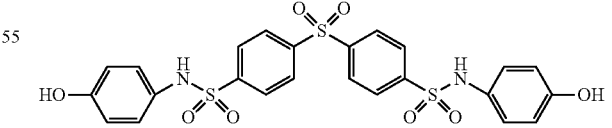

SP-5

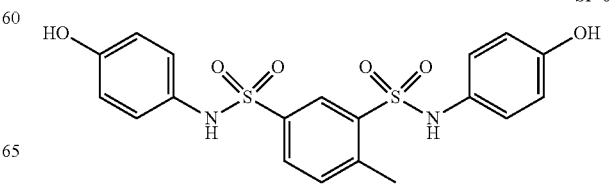

SP-6

-continued

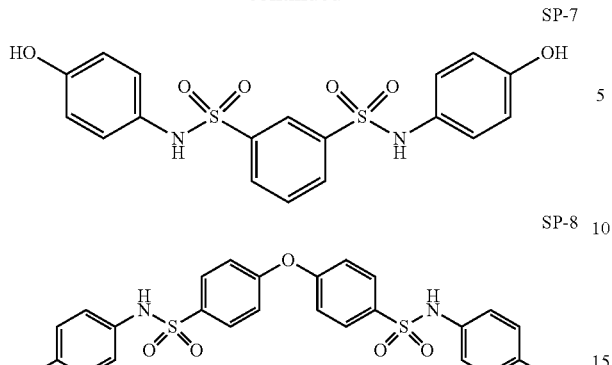
SP-7

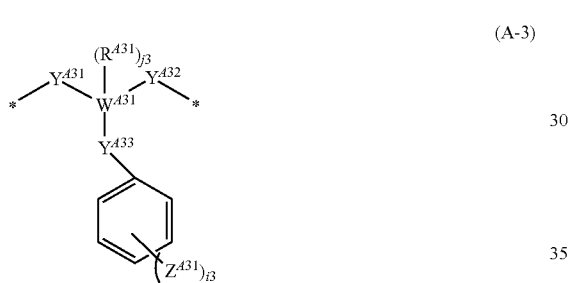
SP-8

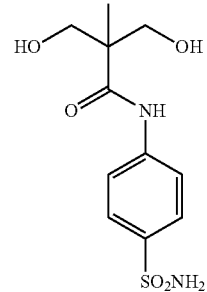
SP-9

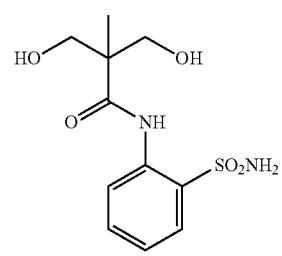
SP-10

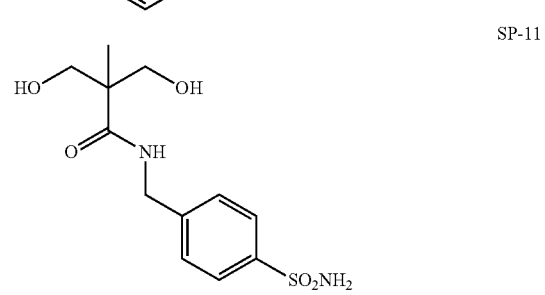
SP-11

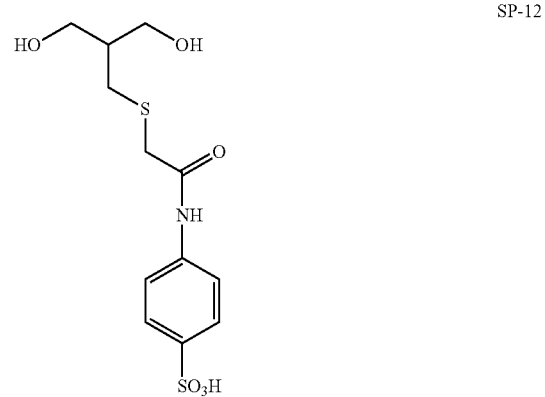
SP-12

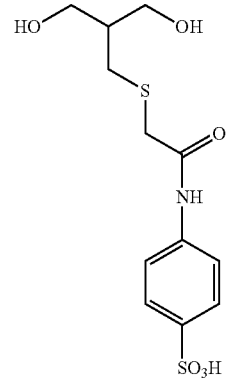
SP-13

[Linking Group A-3]

In the photosensitive resin composition of the present invention, it is preferable that $L^{11}$ and/or $L^{21}$ is represented by the following Formula A-3.

Hereinafter, each constitutional unit of the above-described polymer compounds and a combination of the constitutional units will be described.

$$\overset{*}{\phantom{X}}\overset{Y^{A31}}{\phantom{X}}\overset{(R^{A31})_{j3}}{\underset{Y^{A33}}{W^{A31}}}\overset{Y^{A32}}{\phantom{X}}\overset{*}{\phantom{X}} \quad \text{(A-3)}$$

In Formula A-3, $R^{A31}$ represents a hydrogen atom or a monovalent organic group, preferably a hydrogen atom, an alkyl group, or an aryl group, more preferably a hydrogen atom, an alkyl group having 4 or less carbon atoms, or an arylene group having 6 to 10 carbon atoms, and still more preferably a hydrogen atom.

$Y^{A31}$, $Y^{A32}$, and $Y^{A33}$ each independently represent a divalent linking group. $Y^{A31}$ and $Y^{A32}$ each independently represent preferably an alkylene group or an arylene group and more preferably an alkylene group having 4 or less carbon atoms. The alkylene group or the arylene group as $Y^{A31}$ and $Y^{A32}$ may be substituted. As the substituent, an alkyl group having 6 or less carbon atoms, an alkoxy group having 6 or less carbon atoms, or a halogen atom is preferable. Further, it is more preferable that the alkylene group or the arylene group is substituted with an alkyl group having 4 or less carbon atoms or is unsubstituted. $Y^{A33}$ is preferably an amide or an amide having thioether and more preferably an amide.

$W^{A31}$ represents a carbon atom or a nitrogen atom and is preferably a carbon atom.

$Z^{A31}$'s each independently represent a sulfonamide group or a hydroxy group and is preferably a sulfonamide group.

i3 represents an integer of 1 to 5 and preferably 1.

j3 represents 1 or 0. j3 represents 1 in a case where $W^{A31}$ represents a carbon atom and represents 0 in a case where $W^{A31}$ represents a nitrogen atom.

Further, it is preferable that the linking group A-3 in the specific polymer compound used in the present invention is a linking group having a structure derived from the following exemplified compound.

—Polymer Compound in which $L^{11}$ and/or $L^{21}$ is Represented by Formula A-1, A-2, or A-3—

It is preferable that the specific polymer compound used in the present invention is a polymer generated by a sequential polymerization reaction of a compound having two or more isocyanate groups and a compound having two or more amino groups or generated by a sequential polymerization reaction of a compound having two or more isocyanate groups and a compound having two or more hydroxy groups. It is preferable that $L^{11}$ and/or $L^{21}$ represent a linking group having a structure derived from the compound having two or more amino groups or the compound having two or more hydroxy groups.

Further, it is preferable that $L^{12}$ and/or $L^{22}$ represent a linking group having a structure derived from the compound having two or more isocyanate groups.

It is preferable that the polymer compound, in which $L^{11}$ and/or $L^{21}$ is represented by Formula A-1, A-2, or A-3, used in the present invention is a linear polymer compound.

Further, it is preferable that X in the constitutional unit 2 used in the present invention represents an anion derived from a monovalent acidic compound described below.

It is preferable that the polymer compound, in which $L^{11}$ and/or $L^{21}$ is represented by Formula A-1, A-2, or A-3, used in the present invention further includes a constitutional unit represented by Formula A-1, A-2, or A-3 in addition to $L^{11}$ and/or $L^{21}$.

The content of the constitutional unit represented by Formula A-1, A-2, or A-3 in the specific polymer compound is preferably in a range of 1% to 70% by mass, more preferably in a range of 20% to 70% by mass, and still more preferably in a range of 30% to 60% by mass.

As an example of the specific polymer compound, the structural formula of a neutralized product of p-toluenesulfonic acid of PU-2 in Table 1 shown below is described below. In the chemical formula, the numerical values next to the parentheses indicate the content ratios (molar ratios).

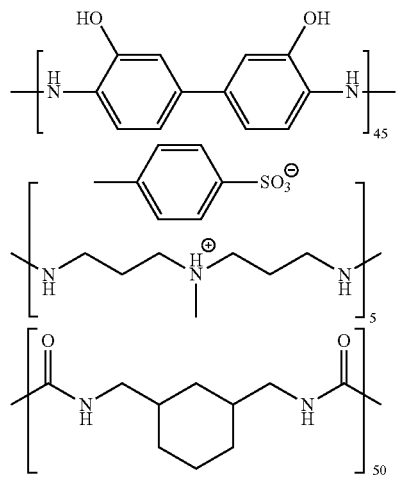

Examples of the main chain structure of the specific polymer compound include polyurea, polyurethane, polycarbonate, and polyester. These may be used alone or in combination of plural kinds thereof, but polyurethane is preferable from the viewpoints of image formability, printing durability, and production suitability and polyurea is most preferable from the viewpoints of chemical resistance, printing durability, and developability.

Hereinafter, polymers having a preferable main chain structure will be described.

[Polyurea Having Amine Bond or Quaternary Ammonium Salt Bond in Main Chain]

In the present invention, the polyurea having an amine bond or a quaternary ammonium salt bond in the main chain is a polymer generated by a sequential polymerization reaction of a compound having two or more isocyanate groups and a compound having two or more anilines, containing at least one tertiary amine, or amino groups and is not particularly limited as long as the polyurea has an amine bond or an ammonium salt bond in the main chain.

Specific preferred examples of the polyurea which can be used in the present invention are shown in Tables 1 and 2. Specific examples PU-1 to PU-25 indicate specific polymer compounds formed by reacting a diamine compound containing at least one tertiary amine, a compound having two or more anilines, containing at least one phenolic hydroxyl group or sulfonamide group, or amino groups, and a compound having two or more isocyanate groups listed in Tables 1 and 2 at ratios (molar ratios) listed in Tables 1 and 2.

In addition, the tables show molar ratios used for synthesis of polyureas and weight-average molecular weights (Mw) of obtained specific polyureas, but the polyurea used in the present invention is not limited to these.

Moreover, the weight-average molecular weight of a polymer is a value measured according to the GPC method.

TABLE 1

| | Diisocyanate compound (molar ratio contained) | | Diamine compound (molar ratio contained) | | Mw (ten thousand) |
|---|---|---|---|---|---|
| PU-1 | H6 XDI 50 | — | DADHB 47.5 | BAPMA 2.5 | 4.8 |
| PU-2 | H6 XDI 50 | — | DADHB 45 | BAPMA 5 | 5.1 |
| PU-3 | H6 XDI 50 | — | DADHB 40 | BAPMA 10 | 4.9 |
| PU-4 | H6 XDI 50 | — | DADHB 47.5 | BAPPRZ 2.5 | 5.5 |
| PU-5 | H6 XDI 50 | — | DADHB 45 | BAPPRZ 5 | 5.8 |
| PU-6 | H6 XDI 50 | — | DADHB 40 | BAPPRZ 10 | 5.6 |
| PU-7 | TMHDI 50 | — | DADHB 45 | BAPMA 5 | 5.3 |
| PU-8 | H6 XDI 50 | — | DADHB 40 | BAPMA 10 | 4.7 |
| PU-9 | TMHDI 50 | — | DADHB 45 | BAPPRZ 5 | 5.1 |
| PU-10 | TMHDI 25 | H6 XDI 25 | DADHB 40 | BAPPRZ 10 | 5.2 |
| PU-11 | TMHDI 25 | H6 XDI 25 | DADHB 40 | BAPMA 10 | 5.4 |
| PU-12 | XDI 50 | — | DADHB 45 | BAPMA 5 | 4.5 |
| PU-13 | XDI 50 | — | DADHB 40 | BAPPRZ 5 | 4.6 |

TABLE 2

| | Diisocyanate compound (molar ratio contained) | | Diamine compound (molar ratio contained) | | Mw (ten thousand) |
|---|---|---|---|---|---|
| PU-14 | H6 XDI 50 | — | SA-1 40 | BAPMA 10 | 5.1 |
| PU-15 | H6 XDI 50 | — | SA-1 35 | BAPMA 15 | 5.3 |
| PU-16 | H6 XDI 50 | — | SA-1 30 | BAPMA 20 | 5.2 |
| PU-17 | H6 XDI 50 | — | SA-1 40 | BAPPRZ 10 | 5.6 |
| PU-18 | H6 XDI 50 | — | SA-1 35 | BAPPRZ 15 | 4.5 |

TABLE 2-continued

| Diisocyanate compound (molar ratio contained) | | Diamine compound (molar ratio contained) | | Mw (ten thousand) |
|---|---|---|---|---|
| PU-19 | H6 XDI 50 | — | SA-1 30 | BAPPRZ 20 | 4.7 |
| PU-20 | XDI 50 | — | SA-1 40 | BAPMA 10 | 5.9 |
| PU-21 | XDI 50 | — | SA-1 35 | BAPMA 15 | 5.6 |
| PU-22 | XDI 50 | — | SA-1 30 | BAPMA 20 | 4.8 |
| PU-23 | XDI 50 | — | SA-1 40 | BAPPRZ 10 | 5.4 |

TABLE 2-continued

| Diisocyanate compound (molar ratio contained) | | Diamine compound (molar ratio contained) | | Mw (ten thousand) |
|---|---|---|---|---|
| PU-24 | XDI 50 | — | SA-1 35 | BAPPRZ 15 | 5.4 |
| PU-25 | XDI 50 | — | SA-1 30 | BAPPRZ 20 | 5.2 |

Specific structures of preferable compounds which include the compounds listed in Tables 1 and 2 and are used for synthesis of polyurea used in the present invention are as follows.

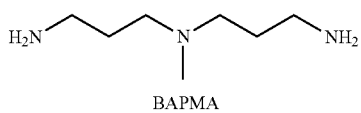

BAPMA

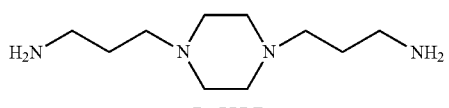

BAPPRZ

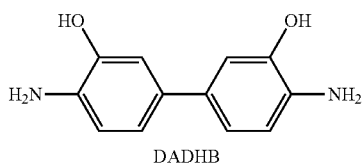

DADHB

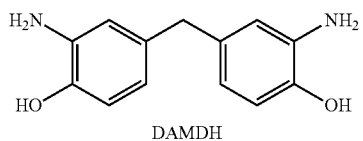

DAMDH

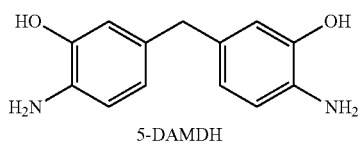

5-DAMDH

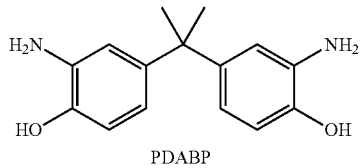

PDABP

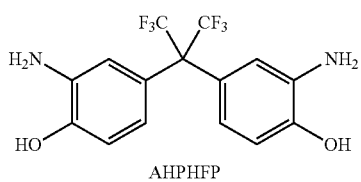

AHPHFP

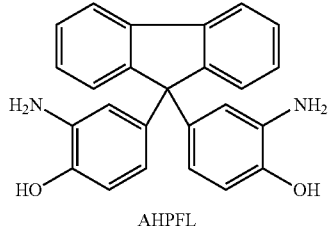

AHPFL

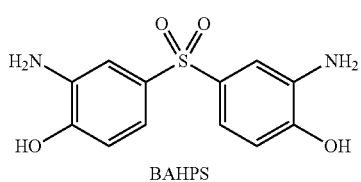

BAHPS

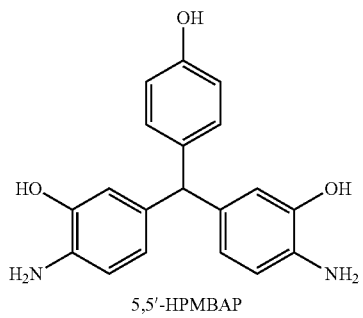

5,5'-HPMBAP

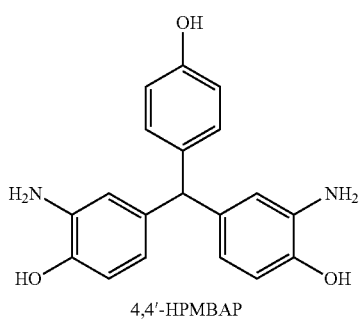

4,4'-HPMBAP

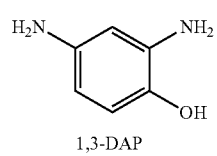

1,3-DAP

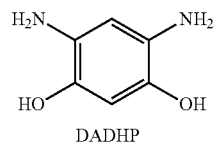

DADHP

-continued
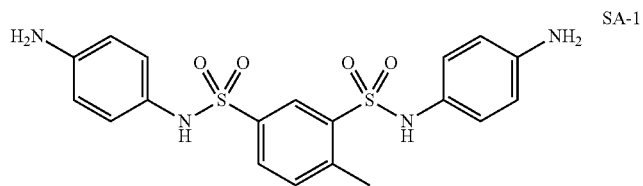
SA-1
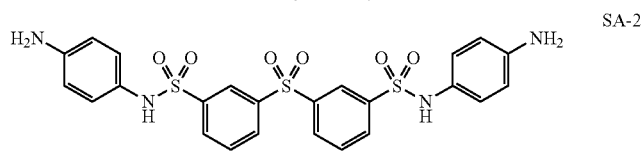
SA-2
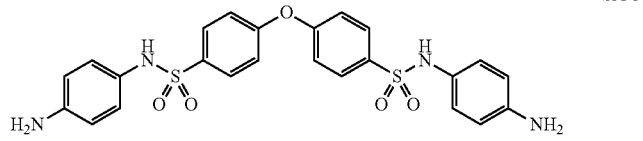
SA-3
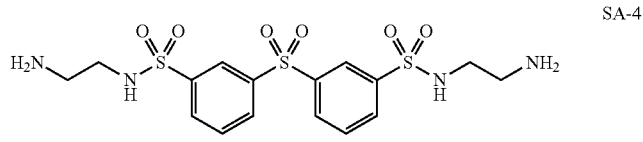
SA-4
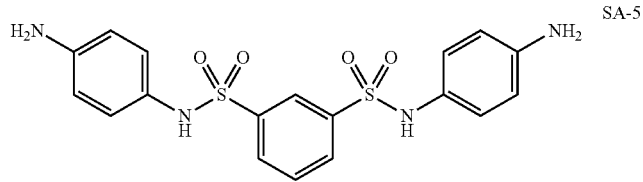
SA-5
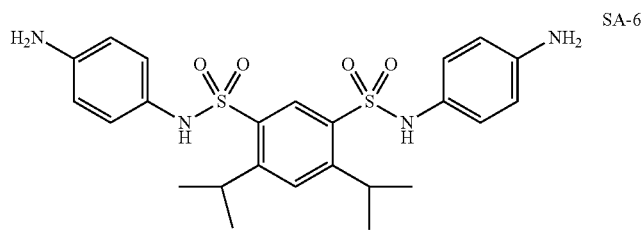
SA-6
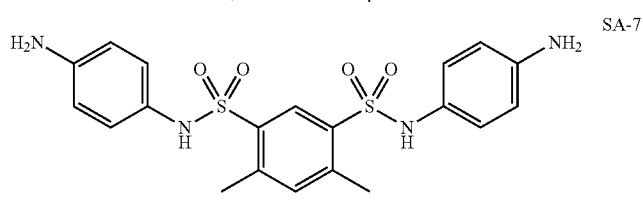
SA-7
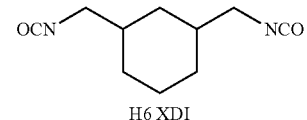
MDI
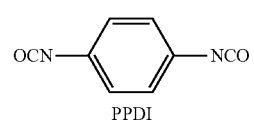
H6 XDI
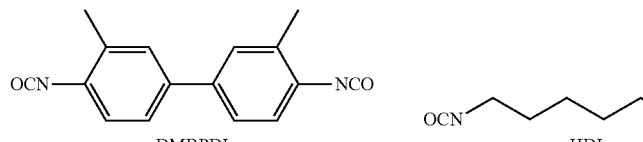
PPDI
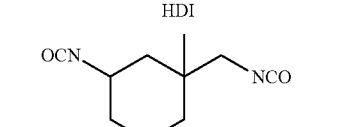
DMBPDI
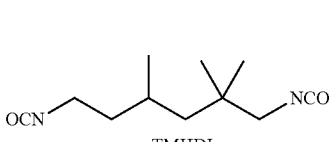
HDI
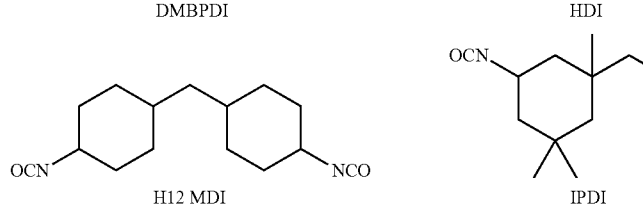
TMHDI
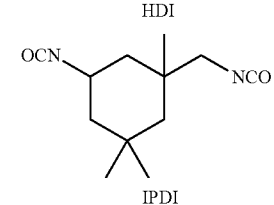
H12 MDI
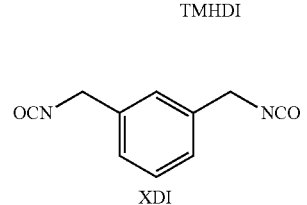
IPDI
XDI -continued

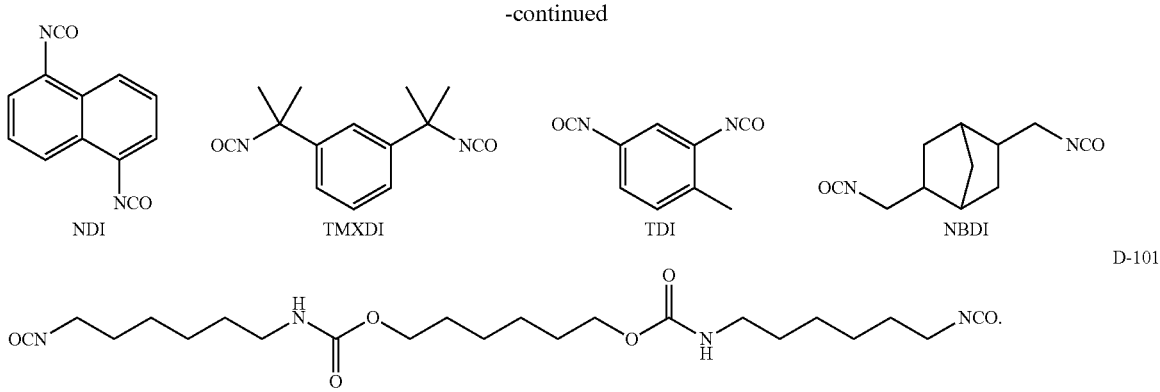

Among these, PU-2, PU-4, PU-5, PU-12, and PU-13 are preferable as polyurea.

[Polyurethane Having Amine Bond or Quaternary Ammonium Salt Bond in Main Chain]

In the present invention, the polyurethane having an amine bond or a quaternary ammonium salt bond in the main chain is a polymer generated by a sequential polymerization reaction of a compound having two or more isocyanate groups and a diol compound having at least one tertiary amine and is not particularly limited as long as the polyurethane has an amine or an ammonium salt in the main chain.

Specific preferred examples of the polyurethane which can be used in the present invention are shown in Table 3. Specific examples PT-1 to PT-15 indicate specific polymer compounds formed by reacting a diol compound containing at least one tertiary amine, a diol compound having at least one sulfonamide group, and a compound having two or more isocyanate groups listed in Table 3 at ratios (molar ratios) listed in Table 3. In addition, the table shows molar ratios used for synthesis of polyurethanes and weight-average molecular weights (Mw) of obtained polyurethanes, but the polyurethane used in the present invention is not limited to these.

Moreover, the weight-average molecular weight of a polymer is a value measured according to the GPC method.

TABLE 3

| | Diisocyanate compound (molar ratio contained) | | Diol compound (molar ratio contained) | | Mw (ten thousand) |
|---|---|---|---|---|---|
| PT-1 | HDI | — | SP-1 | DA-1 | 5.6 |
| | 50 | — | 40 | 10 | |

TABLE 3-continued

| | Diisocyanate compound (molar ratio contained) | | Diol compound (molar ratio contained) | | Mw (ten thousand) |
|---|---|---|---|---|---|
| PT-2 | H6 XDI | — | SP-1 | DA-1 | 5.2 |
| | 50 | — | 40 | 10 | |
| PT-3 | XDI | — | SP-1 | DA-1 | 4.8 |
| | 50 | — | 40 | 10 | |
| PT-4 | HDI | — | SP-2 | DA-3 | 5.2 |
| | 50 | — | 35 | 15 | |
| PT-5 | HDI | — | SP-2 | DA-3 | 5.1 |
| | 50 | — | 40 | 10 | |
| PT-6 | HDI | — | SP-2 | DA-1 | 5.1 |
| | 50 | — | 40 | 10 | |
| PT-7 | HDI | — | SP-2 | DA-1 | 5.3 |
| | 50 | — | 35 | 15 | |
| PT-8 | HDI | — | SP-2 | DA-1 | 4.8 |
| | 50 | — | 30 | 20 | |
| PT-9 | H6 XDI | — | SP-2 | DA-1 | 5.1 |
| | 50 | — | 40 | 10 | |
| PT-10 | H6 XDI | — | SP-2 | DA-1 | 6.1 |
| | 50 | — | 35 | 15 | |
| PT-11 | TMHDI | H6 XDI | SP-2 | DA-1 | 4.5 |
| | 25 | 25 | 40 | 10 | |
| PT-12 | XDI | HDI | SP-2 | DA-1 | 4.2 |
| | 25 | 25 | 40 | 10 | |
| PT-13 | XDI | HDI | SP-2 | DA-3 | 4.6 |
| | 25 | 25 | 40 | 10 | |
| PT-14 | H6 XDI | HDI | SP-2 | DA-1 | 5.1 |
| | 25 | 25 | 40 | 10 | |
| PT-15 | H6 XDI | HDI | SP-2 | DA-3 | 4.9 |
| | 25 | 25 | 40 | 10 | |

Specific structures of preferable compounds which include the compounds listed in Table 3 and are used for synthesis of polyurethane used in the present invention are as follows.

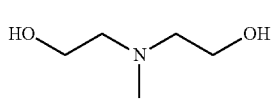

DA-1

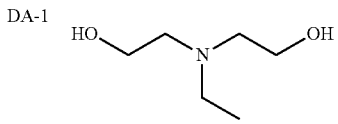

DA-2

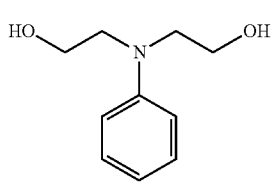

DA-3

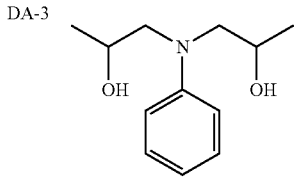

DA-4

-continued

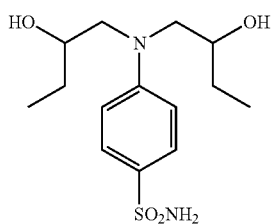
DA-5

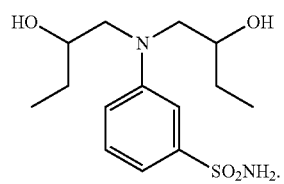
DA-6

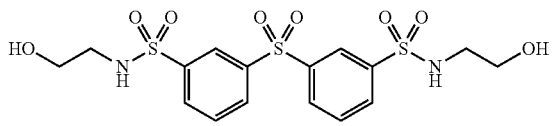
SP-1

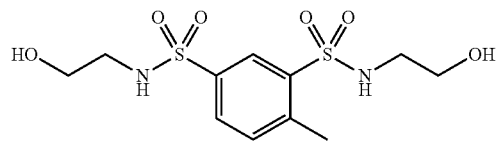
SP-2

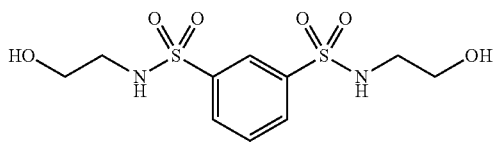
SP-3

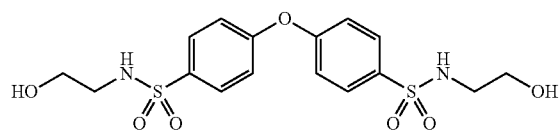
SP-4

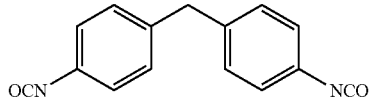
MDI

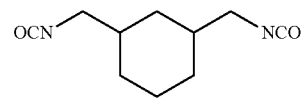
H6XDI

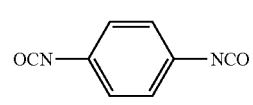
PPDI

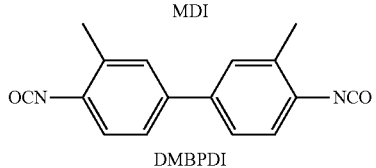
DMBPDI

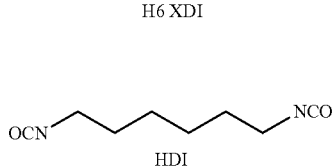
HDI

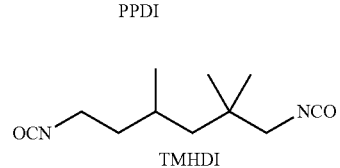
TMHDI

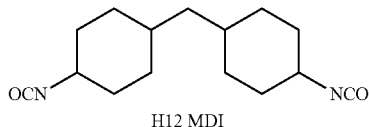
H12MDI

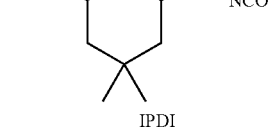
IPDI

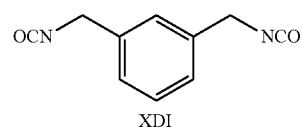
XDI

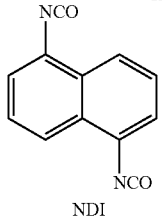
NDI

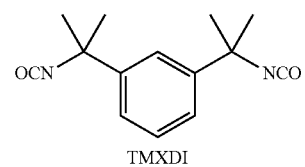
TMXDI

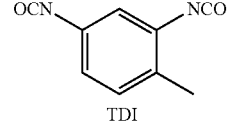
TDI

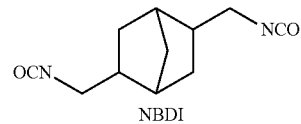
NBDI

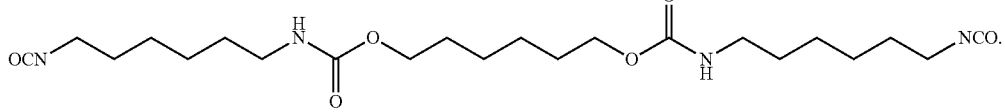
D-101

Among these, PT-1, PT-2, PT-3, and PT-7 are preferable as polyurethane.

[Polycarbonate Having Amine Bond or Quaternary Ammonium Salt Bond in Main Chain]

The polycarbonate having an amine bond or a quaternary ammonium salt bond in the main chain, used in the present invention, is a polymer generated by a sequential polymerization reaction of a compound having a carbonate group such as alkyl carbonate and a diol compound having at least one tertiary amine and is not particularly limited as long as the polycarbonate has an amine or an ammonium salt in the main chain.

Specific preferred examples of the polycarbonate which can be used in the present invention are shown in Table 4. Specific examples PK-1 to PK-11 indicate specific polymer compounds formed by reacting, with diethyl carbonate, a diol compound containing at least one tertiary amine, a diol compound having at least one acidic group, and a diol compound which does not have any of those described above listed in Table 4 at ratios (molar ratios) listed in Table 4. In addition, the table shows molar ratios used for synthesis of polycarbonates and weight-average molecular weights (Mw) of obtained polycarbonates, but the polycarbonate used in the present invention is not limited to these.

Moreover, the weight-average molecular weight of a polymer is a value measured according to the GPC method.

TABLE 4

| | Diol compound having acidic group (molar ratio contained) | Diol compound having amine (molar ratio contained) | | Diol compound (molar ratio contained) | Mw (ten thousand) |
|---|---|---|---|---|---|
| PK-1 | SP-1 70 | DA-1 10 | — | DO-1 20 | 4.1 |
| PK-2 | SP-1 60 | DA-1 20 | — | DO-1 20 | 4.2 |
| PK-3 | SP-1 60 | DA-1 40 | — | — | 4.6 |
| PK-4 | SP-1 70 | DA-3 30 | — | — | 4.8 |

TABLE 4-continued

| | Diol compound having acidic group (molar ratio contained) | Diol compound having amine (molar ratio contained) | | Diol compound (molar ratio contained) | Mw (ten thousand) |
|---|---|---|---|---|---|
| PK-5 | SP-2 60 | DA-1 30 | — | DO-9 10 | 5.2 |
| PK-6 | SP-2 60 | DA-1 30 | — | DO-10 10 | 4.7 |
| PK-7 | SP-2 60 | DA-1 30 | — | DO-11 10 | 4.6 |
| PK-8 | SP-9 80 | DA-6 20 | — | — | 4.5 |
| PK-9 | SP-2 50 | DA-1 20 | — | DO-7 30 | 4.3 |
| PK-10 | SP-2 60 | DA-6 30 | — | DO-10 10 | 4.0 |
| PK-11 | SP-3 50 | DA-1 20 | DA-6 20 | DO-10 10 | 5.0 |

Specific structures of preferable compounds which include the compounds listed in Table 4 and are used for synthesis of polycarbonate used in the present invention are as follows.

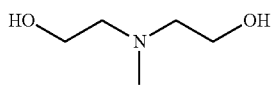

DA-1

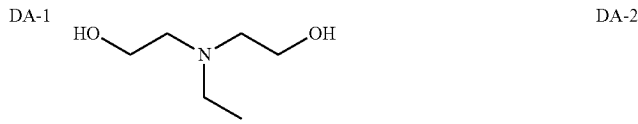

DA-2

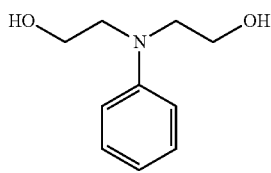

DA-3

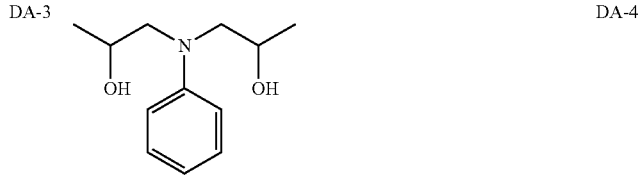

DA-4

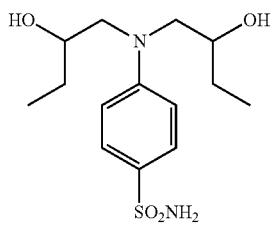

DA-5

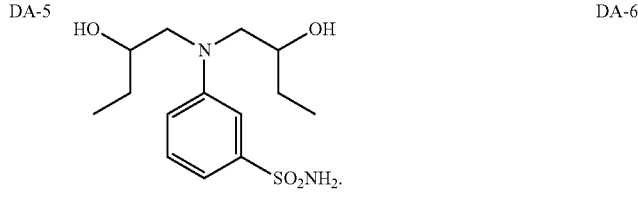

DA-6

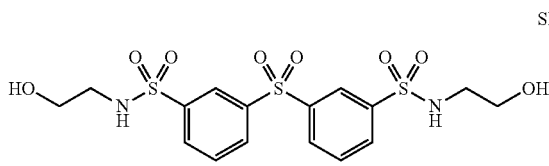

SP-1

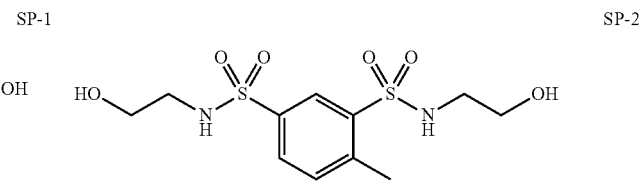

SP-2

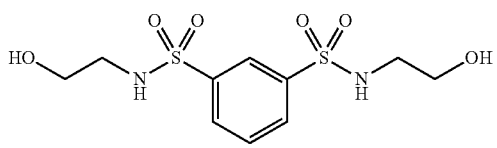

SP-3

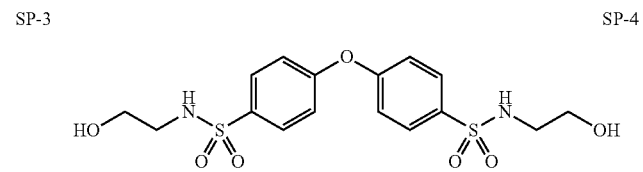

SP-4

-continued
SP-5
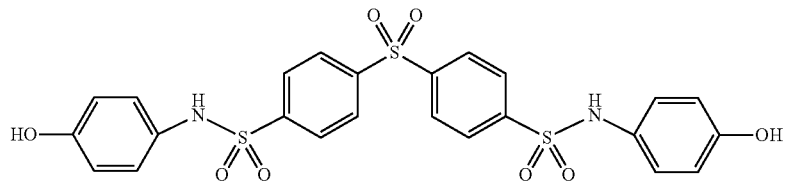
SP-6
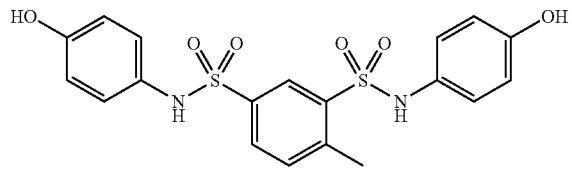
SP-7
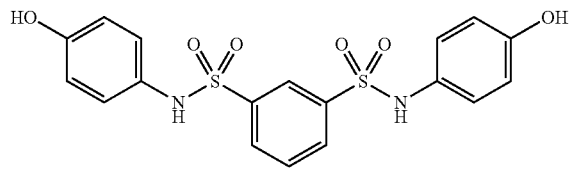
SP-8
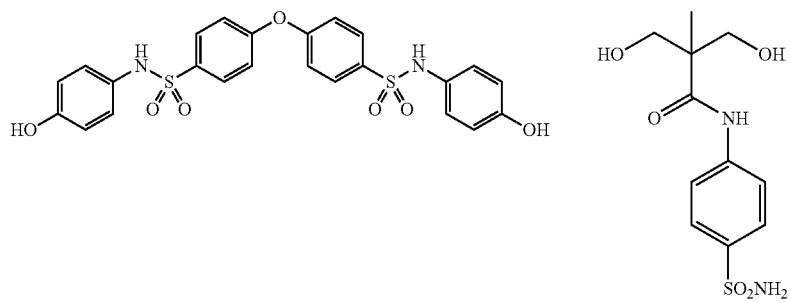
SP-9
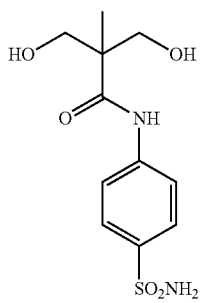
SP-10
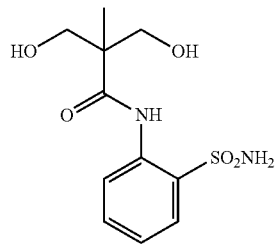
SP-11
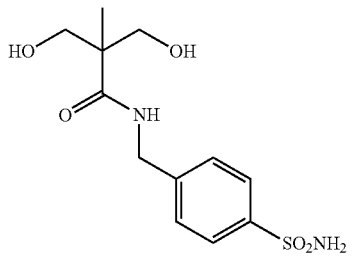
SP-12
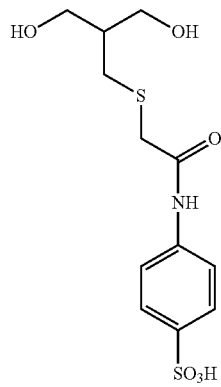
SP-13
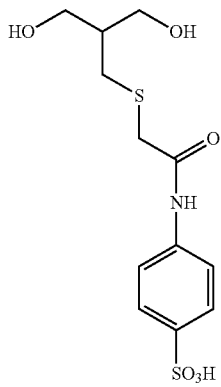
DO-1
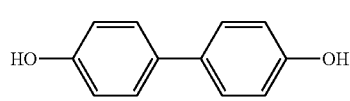
DO-2
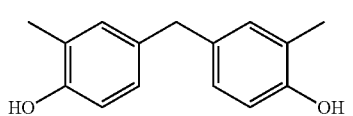

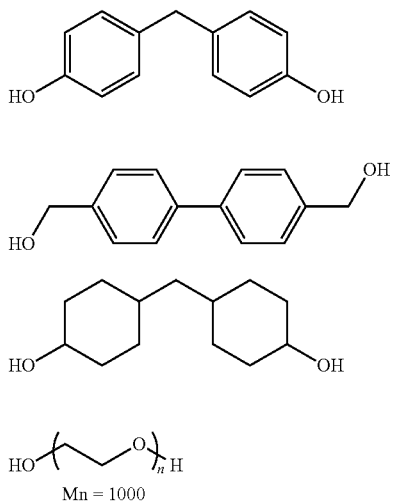

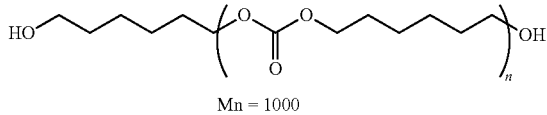
Mn = 1000

Among these, PK-2, PK-3, PK-5, PK-6, and PK-9 are preferable as polycarbonate.

<Infrared Absorbing Material>

The photosensitive resin composition of the present invention contains an infrared absorbing material.

The infrared absorbing material is not particularly limited as long as it is a dye which generates heat by absorbing infrared light, and various dyes known as an infrared absorbent can be used.

As the infrared absorbent which can be used in the present invention, commercially available dyes or known dyes described in documents (for example, "Dye Handbook", compiled by the Society of Synthetic Organic Chemistry, published in 1970) can be used. Specifically, dyes such as azo dyes, metal complex azo dyes, pyrazolone azo dyes, anthraquinone dyes, phthalocyanine dyes, carbonium dyes, quinone imine dyes, methine dyes, and cyanine dyes are exemplified. In the present invention, among these dyes, a dye absorbing at least infrared light or near infrared light is preferable from the viewpoint of being suitable for use in laser emitting infrared light or near infrared light, and a cyanine dye is particularly preferable.

Examples of such a dye absorbing at least infrared light or near infrared light include the cyanine dyes described in JP1983-125246A (JP-S58-125246A), JP1984-84356A (JP-S59-84356A), JP-1984-202829A (JP-S59-202829A), or JP1985-78787A (JP-S60-78787A), the methine dyes described in JP1983-173696A (JP-S58-173696A), JP1983-181690A (JP-S58-181690A), or JP1983-194595A (JP-S58-194595A), the naphthoquinone dyes described in JP1983-112793A (JP-S58-112793A), JP1983-224793A (JP-S58-224793A), JP1984-48187A (JP-S59-48187A), JP1984-73996A (JP-S59-73996A), JP1985-52940A (JP-S60-52940A), or JP1985-63744A (JP-S60-63744A), the squarylium coloring agents described in JP1983-112792A (JP-S58-112792A), and the cyanine dyes described in GB434875B.

In addition, as the dye, the near infrared absorbing sensitizers described in U.S. Pat. No. 5,156,938A are also suitably used, also, the substituted aryl benzo(thio)pyrylium salts described in U.S. Pat. No. 3,881,924A, the trimethinecyanine thiapyrylium salts described in JP1982-142645A (JP-S57-142645A) (U.S. Pat. No. 4,327,169A), the pyrylium-based compounds described in JP1983-181051A (JP-S58-181051A), JP1983-220143A (JP-S58-220143A), JP1984-41363A (JP-S59-41363A), JP1984-84248A (JP-S59-84248A), JP1984-84249A (JP-S59-84249A), JP1984-146063A (JP-S59-146063A), or JP1984-146061A (JP-S59-146061A), the cyanine coloring agents described in JP1984-216146A (JP-S59-216146A), the pentamethinethiopyrylium salts described in U.S. Pat. No. 4,283,475A, or the pyrylium compounds described in JP1993-13514B (JP-H05-13514B) or JP1993-19702B (JP-H05-19702B) are used, and as commercially available products, Epolight III-178, Epolight III-130, Epolight III-125, or the like manufactured by Epolin Inc. is particularly preferably used.

In addition, particularly preferable another examples of the dye include near infrared absorbing dyes described as Formula (I) or (II) in U.S. Pat. No. 4,756,993A.

Among these dyes, examples of a particularly preferable dye include a cyanine coloring agent, a phthalocyanine dye, an oxonol dye, a squarylium coloring agent, a pyrylium salt, a thiopyrylium dye, and a nickel thiolate complex. Furthermore, in a case where a cyanine coloring agent represented by the following Formula (a) is used in the upper layer in the present invention, a high polymerization activity is given and the stability and the economic efficiency become excellent, and thus, the cyanine coloring agent is most preferable.

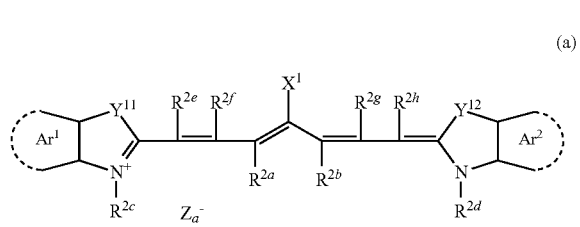

(a)

In Formula (a), $X^1$ represents a hydrogen atom, a halogen atom, a diarylamino group (—NPh$_2$), $X^2$-$L^1$, or a group shown below. $X^2$ represents an oxygen atom or a sulfur atom. $L^1$ represents a hydrocarbon group having 1 to 12 carbon atoms, an aromatic ring having a heteroatom, or a hydrocarbon group having 1 to 12 carbon atoms including a heteroatom. Here, the heteroatom represents N, S, O, a halogen atom, or Se.

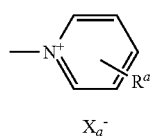

In the formula, $X_a^-$ has the same definition as $Z_a^-$ described below, and $R^a$ represents a substituent selected from a hydrogen atom, an alkyl group, an aryl group, a substituted or unsubstituted amino group, and a halogen atom.

$R^{2a}$ and $R^{2b}$ each independently represent a hydrocarbon group having 1 to 12 carbon atoms. From the viewpoint of storage stability of a photosensitive layer coating solution, each of $R^{2a}$ and $R^{2b}$ is preferably a hydrocarbon group having two or more carbon atoms, and $R^{2a}$ and $R^{2b}$ are particularly preferably bonded to each other to form a 5-membered ring or a 6-membered ring.

$Ar^1$ and $Ar^2$ may be the same as or different from each other, and $Ar^1$ and $Ar^2$ each represent an aromatic hydrocarbon group which may have a substituent. Examples of a preferable aromatic hydrocarbon group include a benzene ring and a naphthalene ring. In addition, examples of a preferable substituent include a hydrocarbon group having 12 or less carbon atoms, a halogen atom, and an alkoxy group having 12 or less carbon atoms.

$Y^{11}$ and $Y^{12}$ may be the same as or different from each other, and $Y^{11}$ and $Y^{12}$ each represent a sulfur atom or a dialkyl methylene group having 12 or less carbon atoms. $R^{2c}$ and $R^{2d}$ may be the same as or different from each other, and $R^{2c}$ and $R^{2d}$ each represent a hydrocarbon group having 20 or less carbon atoms which may have a substituent. Examples of a preferable substituent include an alkoxy group having 12 or less carbon atoms, a carboxyl group, and a sulfo group.

$R^{2e}$, $R^{2f}$, $R^{2g}$ and $R^{2h}$ may be the same as or different from each other, and $R^{2e}$, $R^{2f}$, $R^{2g}$, and $R^{2h}$ each represent a hydrogen atom or a hydrocarbon group having 12 or less carbon atoms. From the viewpoint of availability of a raw material, each of $R^{2e}$, $R^{2f}$, $R^{2g}$, and $R^{2h}$ is preferably a hydrogen atom. In addition, $Z_a^-$ represents a counter anion. Here, the cyanine coloring agent represented by Formula (a) has an anionic substituent in the structure thereof, and in a case where neutralization of the charge is not necessary, $Z_a^-$ is not necessary. From the viewpoint of storage stability of a photosensitive layer coating solution, $Z_a^-$ is preferably a halide ion, a perchlorate ion, a tetrafluoroborate ion, a hexafluorophosphate ion, or a sulfonate ion, and particularly preferably a perchlorate ion, a hexafluorophosphate ion, or an arylsulfonate ion.

Specific examples of the cyanine coloring agent represented by Formula (a) which can be suitably used include the cyanine coloring agents described in paragraphs 0017 to 0019 of JP2001-133969A, paragraphs 0012 to 0038 of JP2002-40638A, and paragraphs 0012 to 0023 of JP2002-23360A.

The infrared absorbent contained in the upper layer is particularly preferably a cyanine dye A shown below.

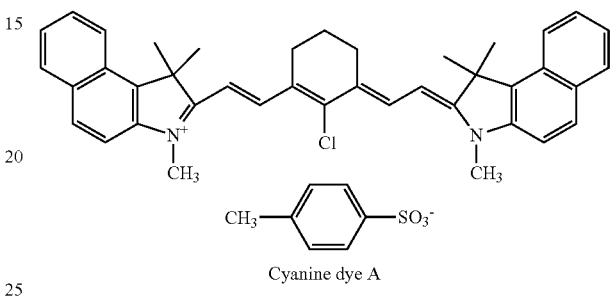

Cyanine dye A

The addition amount when an infrared absorbing material is added to the photosensitive resin composition of the present invention is preferably 0.01% to 50% by mass, more preferably 0.1% to 30% by mass, and particularly preferably 1.0% to 30% by mass, with respect to the total solid content in the photosensitive resin composition. If the addition amount is 0.01% by mass or greater, the layer becomes high sensitive, and if the addition amount is 50% by mass or less, the uniformity of the layer is good and the durability of the layer is excellent.

Other components may be contained in the photosensitive resin composition of the present invention, as desired, as long as the effects of the present invention are not impaired.

Hereinafter, a monovalent acidic compound which is a preferable component of the photosensitive resin composition of the present invention, other alkali-soluble resins, an acid generator, an acid proliferative agent, and other additives which are arbitrary components of the photosensitive resin composition of the present invention will be described.

<Monovalent Acidic Compound>

It is preferable that the photosensitive resin composition of the present invention includes a monovalent acidic compound.

The monovalent acidic compound used in the present invention means a monovalent acidic compound capable of forming the constitutional unit 1 and the salt structure in the specific polymer compound, and preferred examples thereof include an inorganic acid such as hydrochloric acid or nitric acid; and an organic acid such as alkyl carboxylic acid, cyclic alkyl carboxylic acid, aromatic carboxylic acid, alkylsulfonic acid, cyclic alkylsulfonic acid, aromatic sulfonic acid, phosphoric acid, cyclic alkyl phosphoric acid, or aromatic phosphoric acid.

In addition, "form a salt structure" in the present invention means that the compound or the group defined there as it is becomes a salt, and the compound or a part of the salt are combined to becomes a salt. For example, after the cation of a specific compound dissociates, only the anion portion may form an amino group and a salt. In addition, the "salt structure" may be present in a dissociated state in the layer of the photosensitive resin composition.

Among the examples of the monovalent acidic compound which can be used in the present invention, alkyl carboxylic acid, cyclic alkyl carboxylic acid, aromatic carboxylic acid, alkylsulfonic acid, cyclic alkylsulfonic acid, aromatic sulfonic acid, phosphoric acid, cyclic alkyl phosphoric acid, or aromatic phosphoric acid is preferable and monovalent acidic compounds shown below, that is, monovalent acidic compounds having structures represented by the following Formulae A to F are preferably exemplified.

  (A)

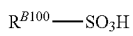  (B)

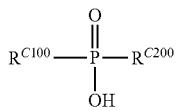  (C)

In Formulae A, B, and C, $R^{A100}$, $R^{B100}$, $R^{C100}$, and $R^{C200}$ each independently represent an alkyl group having 1 to 20 carbon atoms or an aryl group having 6 to 20 carbon atoms, and $R^{C100}$ and $R^{C200}$ may be bonded to each other to form a ring. The alkyl group or the aryl group may further have a substituent such as a hydroxy group, an amide group, or an ester group.

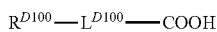  (D)

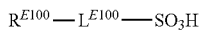  (E)

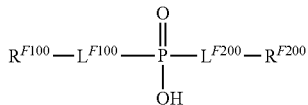  (F)

In Formulae D, E, and F, $R^{D100}$, $R^{E100}$, $R^{F100}$, and $R^{F200}$ each independently represent an alkyl group having 1 to 20 carbon atoms or an aryl group having 6 to 20 carbon atoms, and $R^{F100}$ and $R^{F200}$ may be bonded to each other to form a ring. The alkyl group or the aryl group may further have a substituent such as a hydroxy group, an amide group, or an ester group.

$L^{D100}$, $L^{E100}$, $L^{F100}$, and $L^{F200}$ each independently represent an alkyl group having 1 to 20 carbon atoms or an aryl group having 6 to 20 carbon atoms and the alkyl group and the aryl group may have a substituent such as a hydroxy group, an amide group, or an ester group.

Specific examples of the monovalent acidic compounds which have preferable chemical structures represented by Formulae (A) to (F) and can be used in the present invention will be described below, but the present invention is not limited thereto.

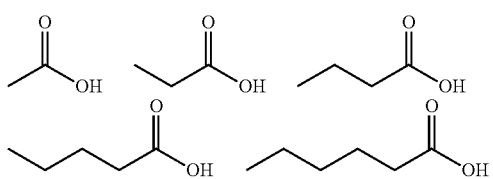

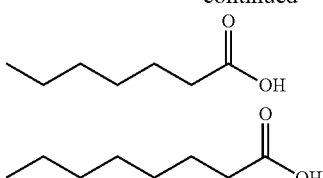
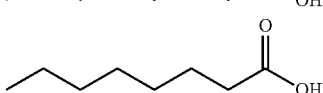
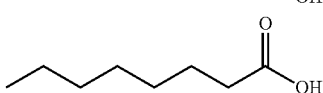
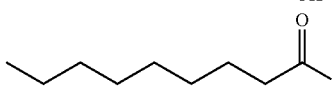
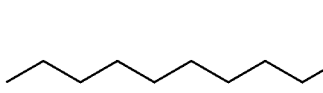
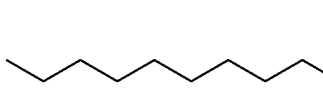
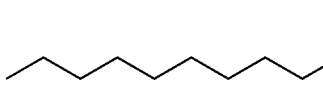
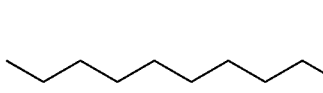
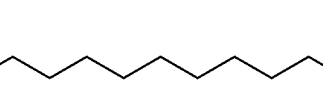
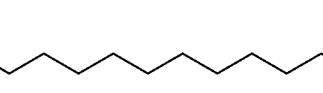
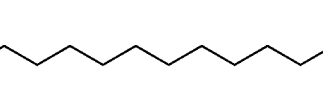
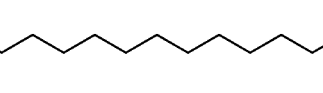
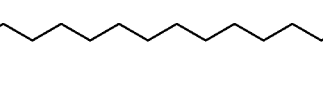
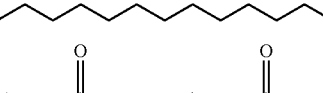
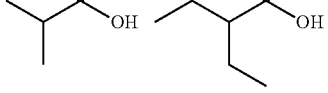
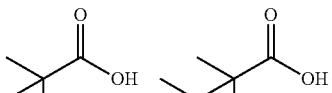
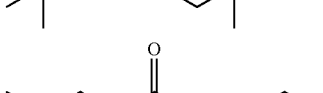
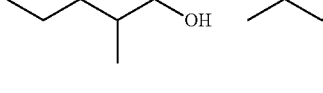

37
-continued
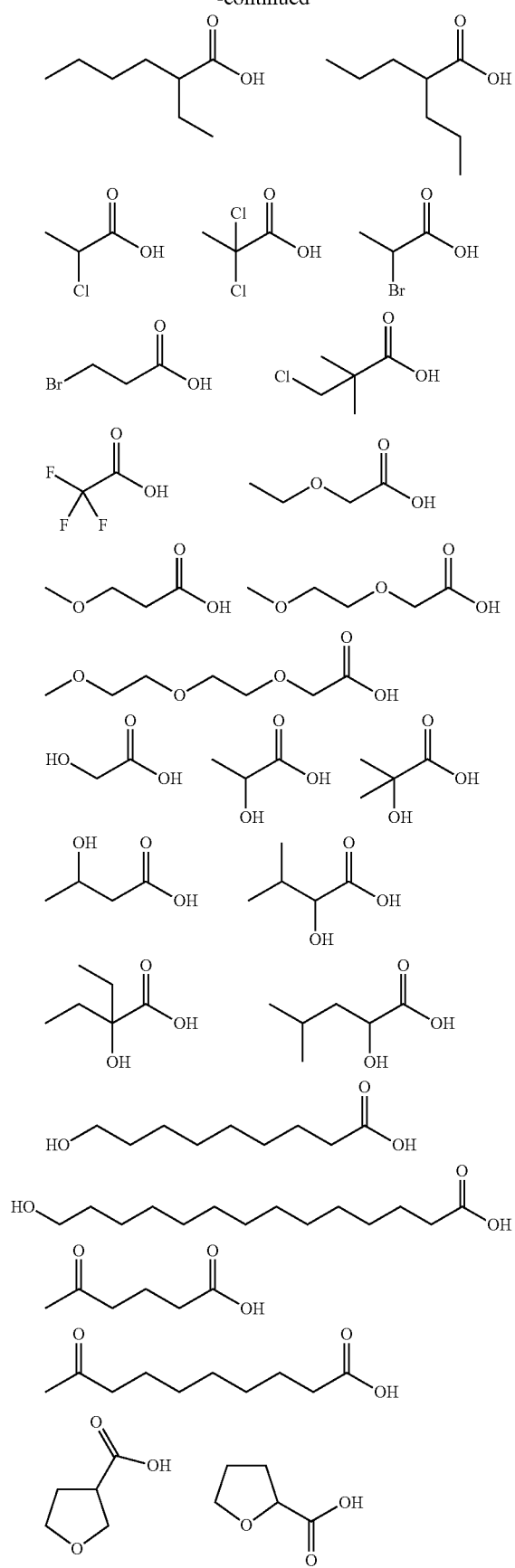
38
-continued
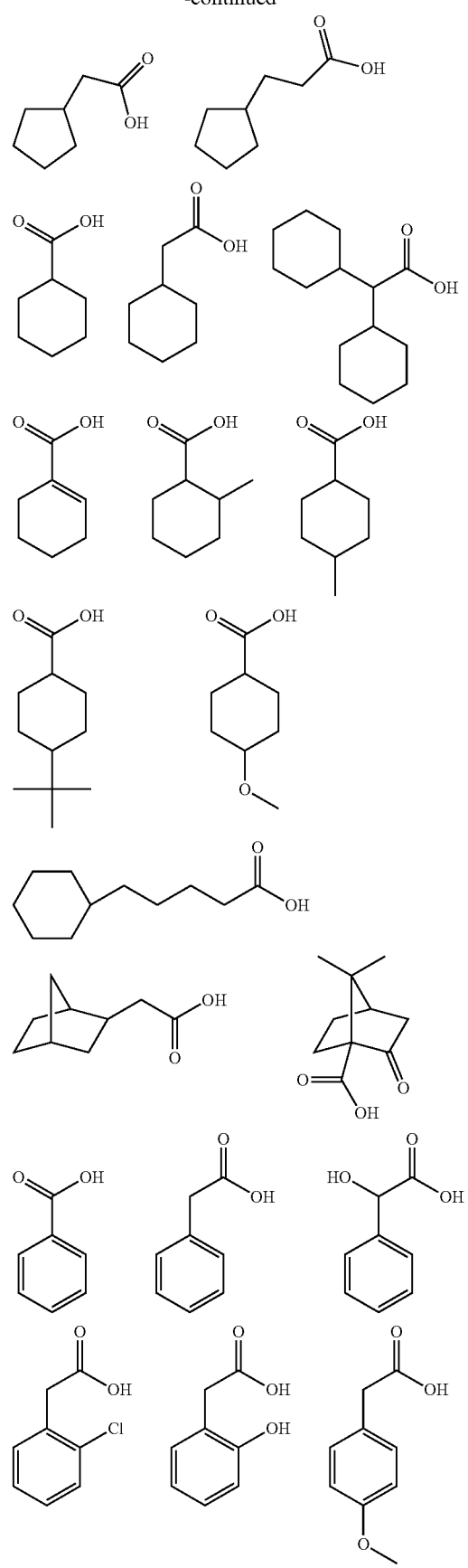

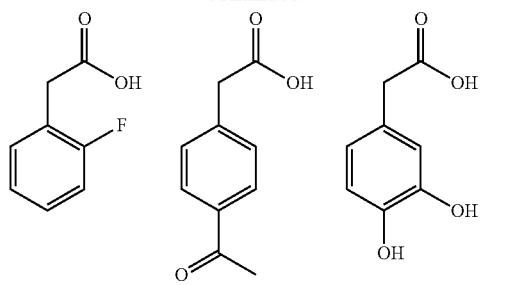
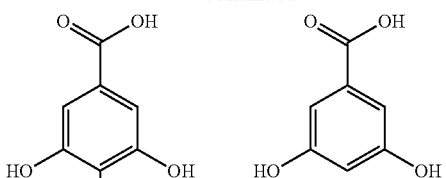
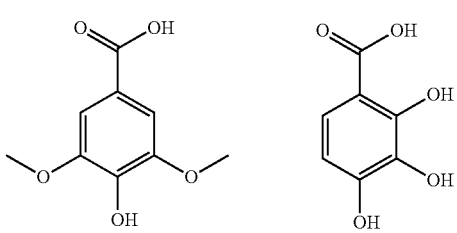
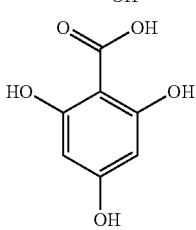
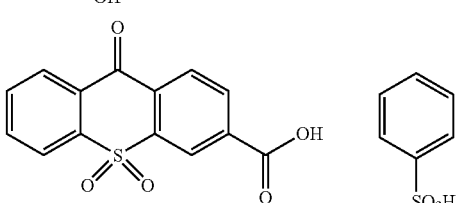
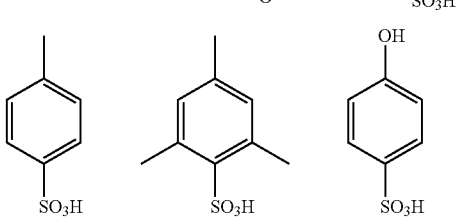
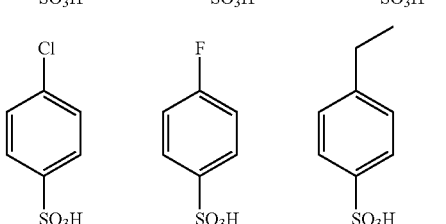
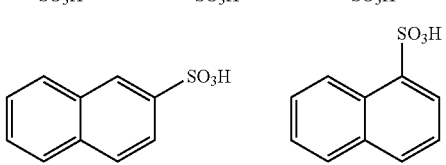
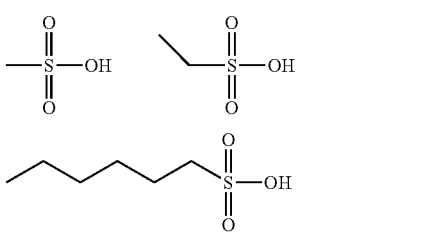

-continued

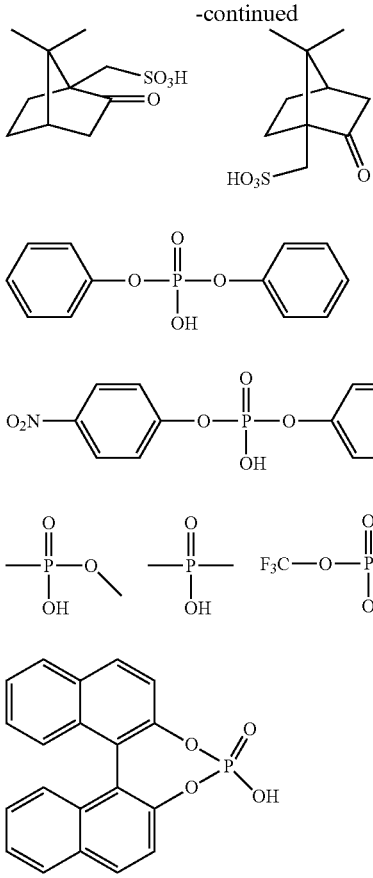

These monovalent acidic compounds may be used alone or in combination of two or more types thereof.

The amount of the acidic compound to be added to the photosensitive resin composition of the present invention is preferably in a range of 0.01% to 30% by mass and more preferably in a range of 0.5% to 20% by mass with respect to the total solid content mass of the resin composition.

In the photosensitive resin composition of the present invention, by adding a specific polymer compound and the monovalent acidic compound described above, it is preferable that at least some of the nitrogen atoms in an amine bond which the specific polymer compound has in the system forms a salt structure with the monovalent acidic compound.

From the viewpoints of interlayer mixing suppression, developability, and printing durability, the amount (neutralization amount) of the monovalent acidic compound to be added to the specific polymer composition is preferably 30 mol % to 100 mol %, more preferably in a range of 50 mol % to 100 mol %, and most preferably in a range of 80 mol % to 100 mol % with respect to 100 mol % of the basic group.

Specific examples of the specific polymer compound which is suitable in the present invention and has the salt structure formed of the specific polymer compound and the monovalent acidic compound in a molecule are shown below.

Moreover, the specific polymer compound used in the present invention is not limited to the specific examples.

TABLE 5

| Specific polymer compound having salt structure | Specific polymer compound | Monovalent acidic compound | Addition amount of monovalent acidic compound (mol %) |
|---|---|---|---|
| PA-1 | PU-2 | p-toluenesulfonic acid | 5 |
| PA-2 | PU-2 | 1-naphthalenesulfonic acid | 5 |
| PA-3 | PU-2 | Diphenyl phosphoric acid | 5 |
| PA-4 | PU-2 | 1-decanoic acid | 5 |
| PA-5 | PU-2 | 2-ethylhexanoic acid | 5 |
| PA-6 | PT-2 | p-toluenesulfonic acid | 10 |
| PA-7 | PT-2 | 1-naphthalenesulfonic acid | 10 |
| PA-8 | PT-2 | Diphenyl phosphoric acid | 10 |
| PA-9 | PT-2 | 1-decanoic acid | 10 |
| PA-10 | PT-2 | 2-ethylhexanoic acid | 10 |
| PA-11 | PK-2 | p-toluenesulfonic acid | 10 |
| PA-12 | PK-2 | 1-naphthalenesulfonic acid | 10 |
| PA-13 | PK-2 | Diphenyl phosphoric acid | 10 |
| PA-14 | PK-2 | 1-decanoic acid | 10 |
| PA-15 | PK-2 | 2-ethylhexanoic acid | 10 |

In the photosensitive resin composition of the present invention, in addition to the method of adding a specific polymer compound and the monovalent acidic compound described above to form the monovalent acidic compound and the salt structure of the specific polymer compound in the system, a method of reacting a specific polymer compound with a monovalent sulfonic acid ester compound and quaternizing an amine to form a monovalent salt structure of the specific polymer compound may be used.

[Formation of Salt Structure Using Reaction with Sulfonic Acid Ester Compound]

Among examples of the monovalent sulfonic acid ester compound which can be used in the present invention, aromatic sulfonic acid is preferable and a monovalent acidic compound having a structure represented by the following Formula (G) is preferably exemplified.

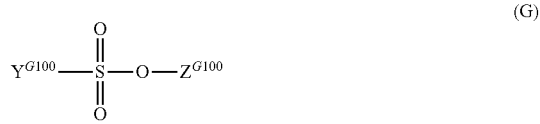

(G)

In Formula (G), $Y^{G100}$ represents an alkyl group having 1 to 20 carbon atoms or an aryl group having 6 to 20 carbon atoms. The alkyl group or the aryl group may further have a substituent such as a hydroxy group, an amide group, an ester group, or a halogen.

$Z^{G100}$ represents an alkyl group having 1 to 20 carbon atoms or an aryl group having 6 to 20 carbon atoms and $Y^{G100}$ and $Z^{G100}$ may be bonded to each other to form a ring. The alkyl group or the aryl group may further have a substituent such as a hydroxy group, an amide group, an ester group, or a halogen.

Hereinafter, specific preferred examples of the specific polymer compound suitable in the present invention which has the salt structure formed by a reaction between a specific polymer compound and a monovalent sulfonic acid ester compound in a molecule will be described.

Further, the specific polymer compound used in the present invention is not limited to these specific examples.

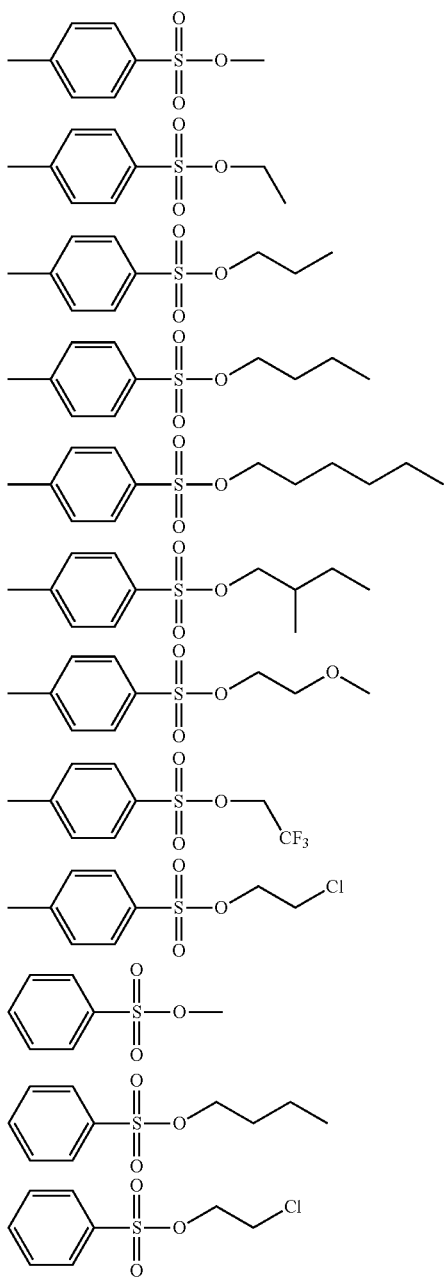

These sulfonic acid ester compounds may be used alone or in combination of two or more types thereof.

The content of the above-described compound with respect to the photosensitive resin composition of the present invention is preferably in a range of 0.01% to 30% by mass and more preferably in a range of 0.5% to 20% by mass with respect to the total solid content mass of the resin composition.

From the viewpoints of interlayer mixing suppression, developability, and printing durability, the addition amount (neutralization amount) of the monovalent acidic compound is preferably 30 mol % to 100 mol %, more preferably in a range of 50 mol % to 100 mol %, and most preferably in a range of 80 mol % to 100 mol % with respect to 100 mol % of the basic group.

Specific examples of the specific polymer compound which is suitable in the present invention and has the salt structure formed using a reaction between the specific polymer compound and the sulfonic acid ester compound in a molecule are shown below.

Moreover, the specific polymer compound used in the present invention is not limited to the specific examples.

TABLE 6

| Specific polymer compound having salt structure | Specific polymer compound | Sulfonic acid ester compound | Content of sulfonic acid ester (mol %) |
|---|---|---|---|
| PS-1 | PU-2 | Methyl p-toluenesulfonate | 5 |
| PS-2 | PU-2 | Ethyl p-toluenesulfonate | 5 |
| PS-3 | PU-2 | Butyl p-toluenesulfonate | 5 |
| PS-4 | PU-2 | Methyl p-toluenesulfonate | 10 |
| PS-5 | PU-2 | Ethyl p-toluenesulfonate | 10 |
| PS-6 | PT-2 | Butyl p-toluenesulfonate | 10 |
| PS-7 | PT-2 | Methyl p-toluenesulfonate | 10 |
| PS-8 | PT-2 | Ethyl p-toluenesulfonate | 10 |
| PS-9 | PT-2 | Butyl p-toluenesulfonate | 10 |

As described above, when a monovalent acidic compound is contained in the photosensitive resin composition of the present invention, excellent chemical resistance and image formability are obtained.

Though the detailed mechanism thereof is unclear, in general, in a case where a salt structure is formed by a base in the binder polymer and an acidic compound, there is concern that durability (printing durability) is reduced. However, it is thought that, even in such a case, in the preferable aspect according to the present invention, by selecting and using a resin containing at least one constitutional unit of the constitutional unit 1 or 2 in the main chain structure of the binder polymer, reduction in the durability (printing durability) is effectively suppressed, and the chemical resistance and the image formability can be further improved.

Moreover, the reason why the excellent effects are exhibited in the "monovalent" acidic compound is estimated as follows. That is, if a crosslinked structure is made by a di- or higher polyvalent compound, for example, a base in the specific polymer compound, the developability and the development latitude are likely to deteriorate. It is thought that in the case of a monovalent compound, such a crosslinked structure is not generated, and good characteristics can be obtained.

In addition, in a case where the photosensitive resin composition of the present invention is used in a printing plate precursor having a multilayer structure of the upper layer and the underlayer described below, from the viewpoint of suppressing the compatibility of these layers, the conjugate base of the acidic compound preferably has pKa of 1 to 6. On the other hand, since the above-described crosslinked structure is more easily made in the case of a di- or higher valent compound on such a strong base side, the developability and the development latitude become more inevitable. Also from this viewpoint, it is effective and preferable to apply a monovalent acidic compound in the present invention.

<Other Alkali-Soluble Resins>

In the present invention, the "alkali-soluble" means "being solubilized by a treatment for a standard development time in an alkali aqueous solution with a pH of 8.5 to 13.5".

Although the alkali-soluble resin other than the specific polymer compound used in the photosensitive resin composition of the present invention is not particularly limited as long as it has a characteristic of being dissolved by contact with an alkali developer, the alkali-soluble resin preferably has an acidic functional group such as a phenolic hydroxyl group, a sulfonate group, a phosphate group, a sulfonamide group, or an active imide group in the main chain and/or a side chain in the polymer, a resin including 10 mol % or greater of a monomer having such an acidic functional group imparting alkali-solubility is exemplified, and a resin including 20 mol % or greater is more preferable. If the copolymerization component of the monomer imparting alkali-solubility is 10 mol % or greater, sufficient alkali-solubility is obtained, and developability is excellent.

In addition, as the alkali-soluble resin, a novolac resin is also preferably exemplified.

As the novolac resin which can be used in the present invention, novolac resins such as a phenol formaldehyde resin, an m-cresol formaldehyde resin, a p-cresol formaldehyde resin, an m-/p-mixed cresol formaldehyde resin, a phenol/cresol (which may be any mixture of m-, p-, and m-/p-) mixed formaldehyde resin or pyrogallol acetone resins are preferably exemplified.

In addition, a polycondensate of phenol having an alkyl group having 3 to 8 carbon atoms as a substituent and formaldehyde, such as a t-butyl phenol formaldehyde resin or an octyl phenol formaldehyde resin, as described in U.S. Pat. No. 4,123,279A, is exemplified. In addition, the weight-average molecular weight (Mw) thereof is preferably 500 or greater, and more preferably 1,000 to 700,000. In addition, the number average molecular weight (Mn) thereof is preferably 500 or greater, and more preferably 750 to 650,000. The dispersity (weight-average molecular weight/number average molecular weight) is preferably 1.1 to 10.

Other alkali-soluble resins preferably have a weight-average molecular weight of 2,000 or greater and a number average molecular weight of 500 or greater, and more preferably have a weight-average molecular weight of 5,000 to 300,000 and a number average molecular weight of 800 to 250,000. The dispersity (weight-average molecular weight/number average molecular weight) of other alkali-soluble resins is preferably 1.1 to 10.

Other alkali-soluble resins included in the photosensitive resin composition of the present invention as desired may be used alone or in combination of two or more types thereof.

The content of other alkali-soluble resins with respect to the total solid content in the photosensitive resin composition of the present invention is preferably 0% to 98% by mass and more preferably 0% to 80% by mass. In addition, 80 parts by mass or less thereof is preferably included with respect to 100 parts by mass of the specific polymer compound used in the present invention.

<Acid Generator>

The photosensitive resin composition of the present invention preferably contains an acid generator, from the viewpoint of sensitivity improvement.

The acid generator in the present invention is a compound which generates an acid by light or heat, and indicates a compound which generates an acid due to decomposition by irradiation with infrared rays or heating at 100° C. or higher. The acid generated is preferably a strong acid having a pKa of 2 or less such as sulfonic acid or hydrochloric acid. The acid generated from the acid generator functions as a catalyst, due to this, the chemical bond in the acid-decomposable group is cleaved to become an acidic group, and as a result, the solubility of the recording layer in the alkali aqueous solution is further improved.

Examples of the acid generator suitably used in the present invention include onium salts such as an iodonium salt, a sulfonium salt, a phosphonium salt, and a diazonium salt. Specifically, the compounds described in U.S. Pat. No. 4,708,925A or JP1995-20629A (JP-H07-20629A) can be exemplified. In particular, an iodonium salt, a sulfonium salt, or a diazonium salt, which has a sulfonate ion as a counter ion, is preferable. As the diazonium salt, the diazonium compound described in U.S. Pat. No. 3,867,147A, the diazonium compound described in U.S. Pat. No. 2,632,703A, or the diazo resins described in JP1989-102456A (JP-H01-102456A) or JP1989-102457A (JP-H01-102457A) are also preferable. In addition, the benzyl sulfonates described in U.S. Pat. No. 5,135,838A or 5,200,544A are also preferable. Furthermore, the active sulfonic acid esters or the disulfonyl compounds described in JP1990-100054A (JP-H02-100054A), JP1990-100055A (JP-H02-100055A), or JP1996-9444 (JP-H08-9444) are also preferable. In addition, the haloalkyl-substituted S-triazines described in JP1995-271029A (JP-H07-271029A) are also preferable.

Furthermore, the compound described as an "acid precursor" in JP1996-220752A (JP-H08-220752A) or the compound described as "(a) a compound which can generates an acid by irradiation with active light" in JP1997-171254A (JP-H09-171254A) can also be applied as the acid generator of the present invention.

Among these, from the viewpoint of sensitivity and stability, an onium salt compound is preferably uses as an acid generator. The onium salt compound will be described below.

As the onium salt compound which can be suitably used in the present invention, compounds known as a compound which generates an acid due to decomposition by infrared ray exposure or heat energy generated from the infrared absorbent by exposure can be exemplified. As the onium salt compound suitable in the present invention, from the viewpoint of sensitivity, known thermal polymerization initiator compounds or compounds having an onium salt structure described below, having a bond with small bond dissociation energy can be exemplified.

Examples of the onium salt suitably used in the present invention include known diazonium salts, iodonium salts, sulfonium salts, ammonium salts, pyridinium salts, and azinium salts, and among these, sulfonate of triarylsulfonium or diaryliodonium, carboxylate, $BF_4^-$, $PF_6^-$, or $ClO_4^-$ is preferable.

Examples of the onium salt which can be used as an acid generator in the present invention include onium salts represented by the following Formulae (III) to (V).

$$Ar^{11}-I^+-Ar^{12} \quad Z^{11-} \qquad \text{Formula (III)}$$

$$Ar^{21}-N^+\equiv N \quad Z^{21-} \qquad \text{Formula (IV)}$$

$$\begin{array}{c} R^{31} \\ \diagdown \\ S^+-R^{33} \quad Z^{31-} \\ \diagup \\ R^{32} \end{array} \qquad \text{Formula (V)}$$

In Formula (III), $Ar^{11}$ and $Ar^{12}$ each independently represent an aryl group having 20 or less carbon atoms which may have a substituent. Examples of a preferably substituent in a case where the aryl group has a substituent include a halogen atom, a nitro group, an alkyl group having 12 or less carbon atoms, an alkoxy group having 12 or less carbon atoms, and an aryloxy group having 12 or less carbon atoms.

$Z^{11-}$ represents a counter ion selected from the group consisting of a halogen ion, a perchlorate ion, a tetrafluoroborate ion, a hexafluorophosphate ion, a sulfonate ion, or a sulfonate ion having a fluorine atom such as a perfluoroalkyl sulfonate ion, and a perchlorate ion, a hexafluorophosphate ion, an aryl sulfonate ion, or a perfluoroalkyl sulfonic acid is preferable.

In Formula (IV), $Ar^{21}$ represents an aryl group having 20 or less carbon atoms which may have a substituent. Examples of a preferable substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In Formula (V), $R^{31}$, $R^{32}$, and $R^{33}$ may be the same as or different from each other, and $R^{31}$, $R^{32}$, and $R^{33}$ each represent a hydrocarbon group having 20 or less carbon atoms which may have a substituent. Examples of a preferably substituent include a halogen atom, a nitro group, an alkyl group having 12 or less carbon atoms, an alkoxy group having 12 or less carbon atoms, and an aryloxy group having 12 or less carbon atoms. $Z^{31-}$ represents a counter ion having the same meaning as $Z^{11-}$.

Specific examples of onium salts (OI-1 to OI-10) represented by Formula (III), onium salts (ON-1 to ON-5) represented by Formula (IV), and onium salts (OS-1 to OS-6) represented by Formula (V) which can be suitably uses in the present invention are exemplified below.

[OI-1]
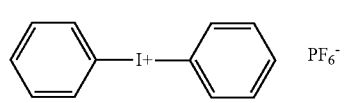

[OI-2]
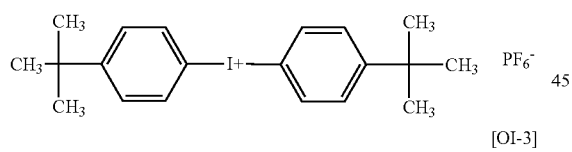

[OI-3]
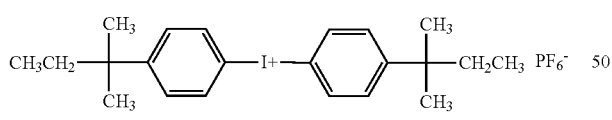

[OI-4]
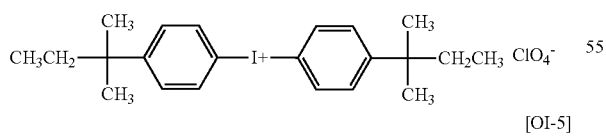

[OI-5]
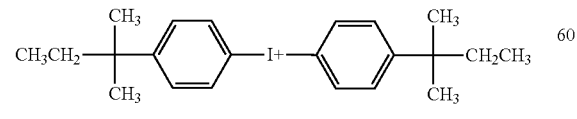

-continued

[OI-6]
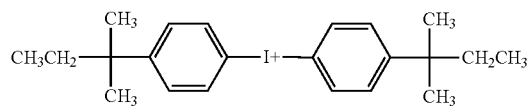

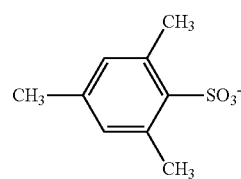

[OI-7]
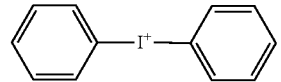

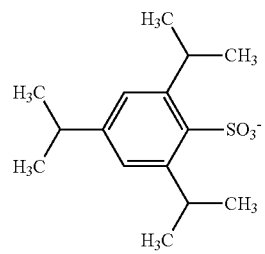

[OI-8]
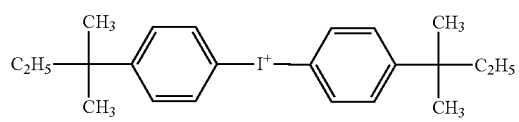

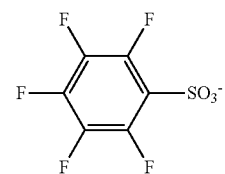

[OI-9]
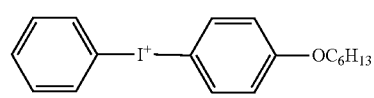

[OI-10]
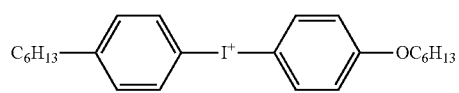

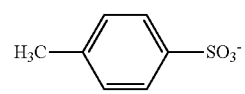

[ON-1]
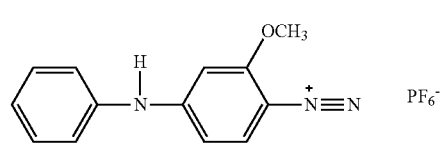

[ON-2]  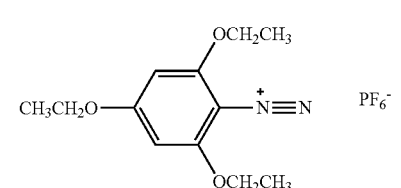  
[OS-2] 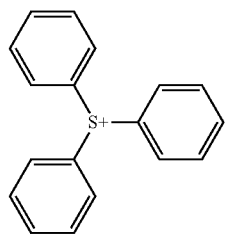 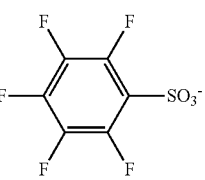
[ON-3] 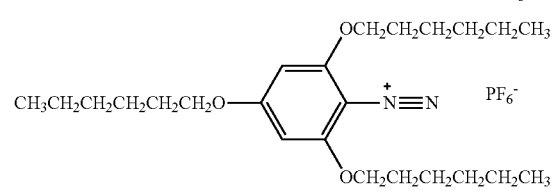  
[OS-3] 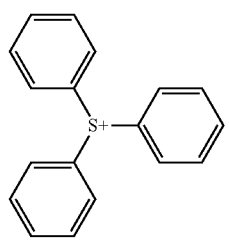 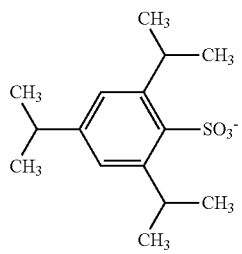
[ON-4] 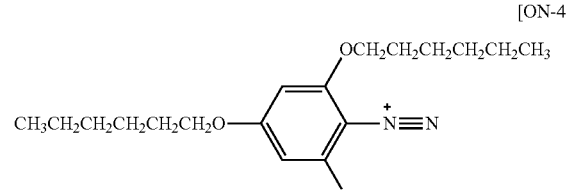 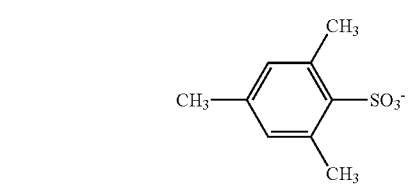  
[OS-4] 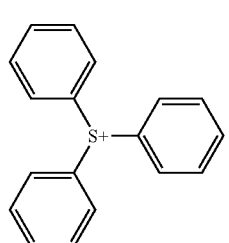 
[ON-5] 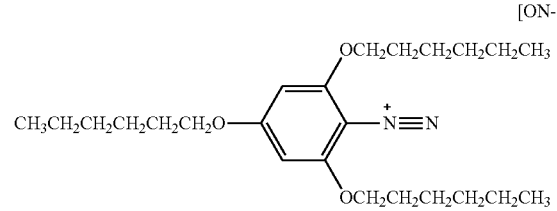
[OS-5]   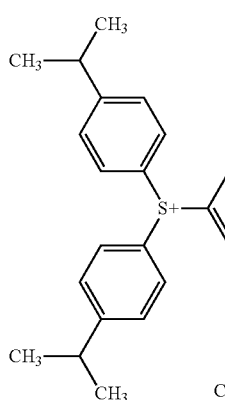 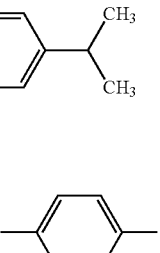
[OS-6]  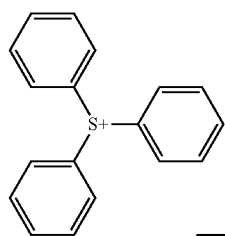 
[OS-1] 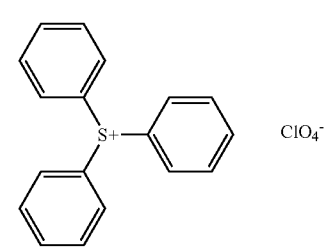  
In addition, as another example of the compounds represented by each of Formula (III) to (V), the compounds described as an example of a radical polymerization initiator in paragraphs 0036 to 0045 of JP2008-195018A can be suitably used as an acid generator in the present invention.

Another example of a preferable onium salt as the acid generator used in the present invention includes an azinium salt compound represented by the following Formula (VI).

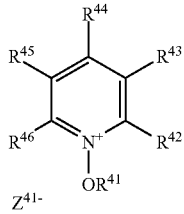

Formula (VI)

In Formula (VI), $R^{41}$, $R^{42}$, $R^{43}$, $R^{44}$, $R^{45}$, and $R^{46}$ may be the same as or different from each other, and $R^{41}$, $R^{42}$, $R^{43}$, $R^{44}$, $R^{45}$, and $R^{46}$ each represent a hydrogen atom, a halogen atom, or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, a substituted phosphono group, a phosphonate group, and a substituted phosphonate group, and in the case of being introducible, each of $R^{41}$, $R^{42}$, $R^{43}$, $R^{44}$, $R^{45}$, and $R^{46}$ may further have a substituent.

A compound (multimerized form) including two or more cation portions in the molecule as a result of bonding of the skeletons (cation portions) having a specific structure in the compound represented by Formula (VI) to each other through $R^{41}$ is also included in examples of the compound represented by Formula (VI), and such a compound is also suitably used.

$Z^{41-}$ represents a counter ion having the same meaning as $Z^{11-}$.

Specific examples of the azinium salt compound represented by Formula (VI) include the compounds described in paragraphs 0047 to 0056 of JP2008-195018A.

In addition, a compound group having an N—O bond described in JP1988-138345A (JP-S63-138345A), JP1988-142345A (JP-S63-142345A), JP1988-142346A (JP-S63-142346A), JP1988-143537A (JP-S63-143537A), or JP1971-42363B (JP-S46-42363B) is also suitably used as the acid generator in the present invention.

More preferable examples of the acid generator which can be used in the present invention include the following compounds (PAG-1) to (PAG-5).

PAG-1

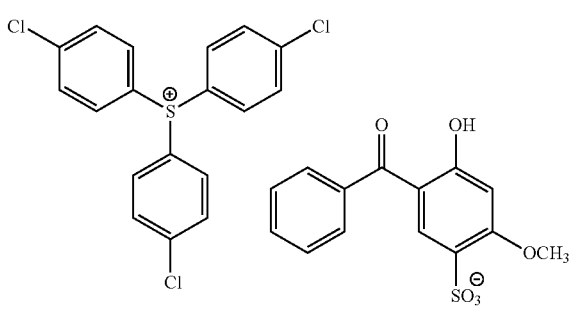

PAG-2

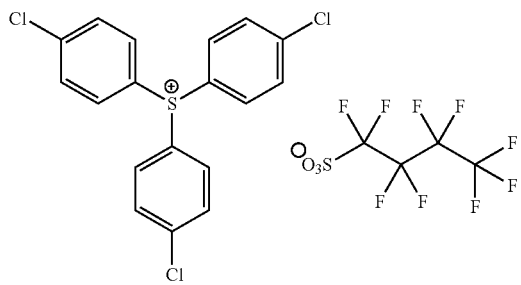

PAG-3

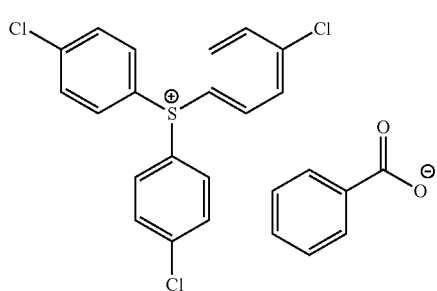

PAG-4

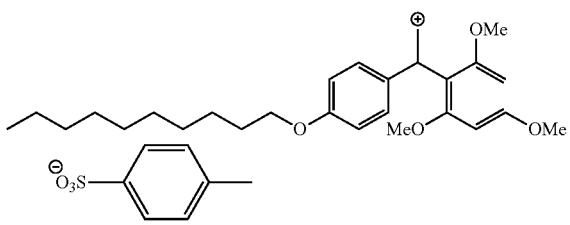

PAG-5

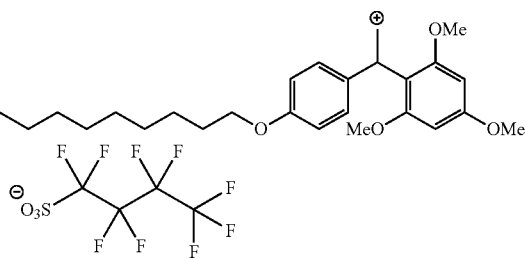

In a case where these acid generators are contained in the photosensitive resin composition of the present invention, these compounds may be used alone or in combination of two or more types thereof.

A preferable addition amount of acid generator is within the range of 0.01% to 50% by mass, preferably within the range of 0.1% to 40% by mass, and more preferably within the range of 0.5% to 30% by mass, with respect to the total solid content in the photosensitive resin composition. If the addition amount is within the above range, improvement of sensitivity which is the effect of the addition of an acid generator is observed, and an occurrence of a residual film at the time of development is suppressed.

<Acid Proliferative Agent>

An acid proliferative agent may be added to the recording layer of the present invention. The acid proliferative agent in the present invention is a compound substituted with a residue of a relatively strong acid, and a compound which newly generates an acid by being easily released in the presence of an acid catalyst. That is, the compound is decomposed by an acid catalyzed reaction, and generates an acid (hereinafter, referred to as ZOH in formulae) again. Since one or more acids per reaction are increased, and with the progress of the reaction, the acid concentration is increasingly increased, sensitivity is dramatically improved. The intensity of this generated acid is 3 or less as an acid dissociation constant (pKa), and preferably 2 or less. In the case of a weaker acid than this, it is not possible to cause the elimination reaction by an acid catalyst.

Examples of the acid used in such an acid catalyst include dichloroacetic acid, trichloroacetic acid, methanesulfonic acid, ethanesulfonic acid, benzenesulfonic acid, p-toluenesulfonic acid, naphthalenesulfonic acid, and phenyl sulfonic acid.

As the acid proliferative agent, the acid proliferative agents described in WO95/29968A, WO98/24000A, JP1996-305262A (JP-H08-305262A), JP1997-34106A (JP-H09-34106A), JP1996-248561A (JP-H08-248561A), JP1996-503082A (JP-H08-503082A), U.S. Pat. No. 5,445,917A, JP1996-503081A (JP-H08-503081A), U.S. Pat. Nos. 5,534,393A, 5,395,736A, 5,741,630A, 5,334,489A, 5,582,956A, 5,578,424A, 5,453,345A, 5,445,917A, EP665960B, EP757628B, EP665961B, U.S. Pat. No. 5,667,943A, or JP1998-1598A (JP-H10-1598A) can be used alone or in combination of two or more types thereof.

Preferable specific examples of the acid proliferative agent in the present invention include the compounds described in paragraphs 0056 to 0067 of JP2001-66765A. Among these, the following compounds described as an exemplary compound (ADD-1), (ADD-2), or (ADD-3) can be suitably used.

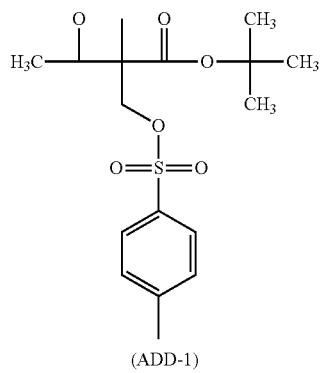

(ADD-1)

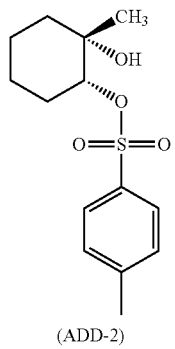

(ADD-2)

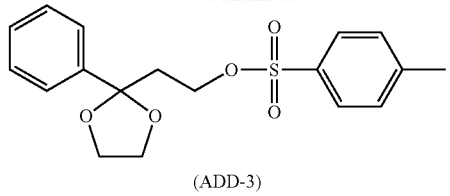

(ADD-3)

The addition amount in a case where the acid proliferative agent is added in an upper layer is within the range of 0.01% to 20% by mass, preferably within the range of 0.01% to 10% by mass, and more preferably within the range of 0.1% to 5% by mass, in terms of the solid content. If the addition amount of the acid proliferative agent is within the above range, effects of adding acid proliferative agent is sufficiently obtained, improvement in sensitivity is achieved, and film hardness reduction of an image portion is suppressed.

<Other Additives>

The photosensitive resin composition of the present invention may include a development accelerator, a surfactant, a print-out agent/colorant, a plasticizer, or a wax agent, as other additives.

[Development Accelerator]

For the purpose of improving sensitivity, acid anhydrides, phenols, or organic acids may be added to the photosensitive resin composition of the present invention.

As the acid anhydrides, cyclic acid anhydride is preferable, and specifically, as the cyclic acid anhydride, phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, α-phenylmaleic anhydride, succinic anhydride, or pyromellitic anhydride described in U.S. Pat. No. 4,115,128A can be used. As the non-cyclic acid anhydride, acetic anhydride is exemplified.

Examples of the phenols include bisphenol A, 2,2'-bishydroxysulfone, p-nitrophenol, p-ethoxyphenol, 2,4,4'-trihydroxybenzophenone, 2,3,4-trihydroxyb enzophenone, 4-hydroxybenxophenone, 4,4',4"-trihydroxytriphenyl methane, and 4,4',3",4"-tetrahydroxy-3,5,3',5'-tetramethyltriphenyl methane.

The organic acids are described in JP1985-88942A (JP-S60-88942A), JP1990-96755A (JP-H02-96755A), or the like, and specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The ratio of the acid anhydrides, the phenols, and the organic acids to the total solid content in the photosensitive resin composition is preferably 0.05% to 20% by mass, more preferably 0.1% to 15% by mass, and particularly preferably 0.1% to 10% by mass.

[Surfactant]

To improve coating property and stability of a treatment with respect to development conditions, a nonionic surfactant as described in JP1987-251740A (JP-S62-251740A) or JP1991-208514A (JP-H03-208514A), an amphoteric surfactant as described in JP1984-121044A (JP-S59-121044A) or JP1992-13149A (JP-H04-13149A), or a fluorine-containing monomer copolymer such as JP1987-170950A (JP-S62-170950A), JP1999-288093A (JP-H11-288093A), or JP2003-57820A can be added to the photosensitive resin composition of the present invention.

Specific examples of the nonionic surfactant include sorbitan tristearate, sorbitan monopalmitate, sorbitan trioleate, monoglyceride stearate, and polyoxyethylenenonylphenyl ether.

Specific examples of the amphoteric surfactant include alkyl di(aminoethyl)glycine, alkylpolyaminoethylglycine hydrochloride, 2-alkyl-N-carboxyethyl-N-hydroxyethyl imidazolinium betaine, and an N-tetradecyl-N,N-betaine type (for example, product name "AMOGEN K" manufactured by Dai-ichi Kogyo Seiyaku Co., Ltd.).

The ratio of the surfactant to the total solid content in the photosensitive resin composition is preferably 0.01% to 15% by mass, more preferably 0.01% to 5% by mass, and still more preferably 0.05% to 2.0% by mass.

[Print-Out Agent/Colorant]

A print-out agent for obtaining a visible image immediately after heating by exposure or a dye or a pigment as an image colorant can be added to the photosensitive resin composition of the present invention.

Examples of the print-out agent and the colorant are described in detail in paragraphs 0122 and 0123 of JP2009-229917A, and the compounds described here can be applied to the present invention.

The dye is preferably added in a ratio of 0.01% to 10% by mass and more preferably added in a ratio of 0.1% to 3% by mass, with respect to the total solid content of the photosensitive resin composition.

[Plasticizer]

To impart flexibility or the like to the coating film, a plasticizer may be added to the photosensitive resin composition of the present invention. For example, butylphthalyl polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer or a polymer of acrylic acid or methacrylic acid is used.

These plasticizers are preferably added in a ratio of 0.5% to 10% by mass and more preferably added in a ratio of 1.0% to 5% by mass, with respect to the total solid content of the photosensitive resin composition.

[Wax Agent]

For the purpose of imparting resistance against scratches, a compound for reducing the coefficient of static friction of the surface can also be added to the photosensitive resin composition of the present invention. Specifically, the compounds having an ester of a long chain alkyl carboxylic acid as described in U.S. Pat. No. 6,117,913A, JP2003-149799A, JP2003-302750A, or JP2004-12770A can be exemplified.

As a preferable addition amount thereof, the ratio of the wax agent to the total solid content of the photosensitive resin composition is preferably 0.1% to 10% by mass and more preferably 0.5% to 5% by mass.

<Compositional Ratio of Respective Components>

The content of the specific polymer compound is preferably 10% to 90% by mass, the content of the infrared absorbent is preferably 0.01% to 50% by mass, the content of the monovalent basic compound is preferably 0% to 30% by mass, the content of other alkali-soluble resins is preferably 0% to 80% by mass, the content of the acid generator is preferably 0% to 30% by mass, the content of the acid proliferative agent is preferably 0% to 20% by mass, the content of the development accelerator is 0% to 20% by mass, the content of the surfactant is preferably 0% to 5% by mass, the content of the print-out agent/colorant is preferably 0% to 10% by mass, the content of the plasticizer is preferably 0% to 10% by mass, and the content of the wax agent is preferably 0% to 10% by mass, with respect to the total solid content mass of the photosensitive resin composition of the present invention.

The photosensitive resin composition of the present invention can be applied to various fields requiring resin pattern formation excellent in durability, for example, various fields such as a resist, a display, a lithographic printing plate precursor, and the like, and since the photosensitive resin composition can be recorded with high sensitivity and has excellent image formability, and the durability of the image portion formed of the composition is good, by applying to an infrared sensitive positive type lithographic printing plate precursor described in detail below, the effects of the present invention can become significant.

(Lithographic Printing Plate Precursor)

The lithographic printing plate precursor of the present invention has a recording layer including the photosensitive resin composition of the present invention.

In addition, the lithographic printing plate precursor of the present invention is preferably a positive type lithographic printing plate precursor.

Furthermore, the lithographic printing plate precursor of the present invention is a positive type lithographic printing plate precursor having a recording layer in which an underlayer and an upper layer are disposed in this order on a support having a hydrophilic surface, and the photosensitive resin composition is preferably contained in the underlayer and/or the upper layer, more preferably contained in the underlayer or the upper layer, and still more preferably contained only in the underlayer.

<Recording Layer>

The recording layer used in the present invention can be formed by dissolving respective components of the photosensitive resin composition in a solvent and applying the resulting product to a suitable support.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, and toluene, and the present invention is not limited thereto. These solvents are used alone or in a mixture.

[Formation of Underlayer and Upper Layer]

In addition, the recording layer of the present invention is preferably a recording layer (hereinafter, also referred to as a "lithographic printing plate precursor having a two-layer structure") in which an underlayer and an upper layer are disposed in this order on a support.

The underlayer and the upper layer are preferably separately formed in principle.

As the method of separately forming the two layers, for example, a method of using the difference in the solvent solubilities between the components included in the underlayer and the components included in the upper layer and a method of rapidly drying and removing the solvent after application to the upper layer are exemplified. Since by using the latter method in combination, the separation between the layers is more favorably performed, the method is preferable.

These methods will be described in detail below, but the method of separately applying to the two layers is not limited thereto.

In the method of using the difference in the solvent solubilities between the components included in the underlayer and the components included in the upper layer, when applying a coating solution for an upper layer, a solvent system in which all the components included in the underlayer are insoluble is used. Thus, even in a case where two-layer coating is performed, a coating film can be formed such that each layer thereof is clearly separated. For example, by selecting a component insoluble in a solvent such as methyl ethyl ketone or 1-methoxy-2-propanol which dissolves an alkali-soluble resin which is the upper layer component, as the underlayer component, applying to the underlayer and drying using a solvent system which dissolves the underlayer component, dissolving the alkali-soluble resin-based upper layer in methyl ethyl ketone or 1-methoxy-2-propanol, and applying the resulting product and drying, bilayering is possible.

Next, the method of very rapidly drying the solvent after application to the second layer (upper layer) can be achieved by blowing high-pressure air from a slit nozzle provided substantially at a right angle with respect to the running direction of the web, applying heat energy as conductive heat from the lower surface of the web by a roll (heating roll) into which a heating medium such as steam has been supplied, or combining these.

The photosensitive resin composition of the present invention is preferably included in the upper layer and/or the underlayer, and more preferably included only in the underlayer.

The coating amount after drying of the underlayer applied to the support of the lithographic printing plate precursor of the present invention is preferably within the range of 0.5 to 4.0 g/m$^2$ and more preferably within the range of 0.6 to 2.5 g/m$^2$. If the coating amount is 0.5 g/m$^2$ or greater, printing durability is excellent, and if the coating amount is 4.0 g/m$^2$ or less, image reproducibility and sensitivity are excellent.

In addition, the coating amount after drying of the upper layer component is preferably 0.05 to 1.0 g/m$^2$ and more preferably 0.08 to 0.7 g/m$^2$. If the coating amount is 0.05 g/m$^2$ or greater, development latitude and scratch resistance are excellent, and if the coating amount is 1.0 g/m$^2$ or less, sensitivity is excellent.

The coating amount after drying of the underlayer and the upper layer is preferably within the range of 0.6 to 4.0 g/m$^2$ and more preferably within the range of 0.7 to 2.5 g/m$^2$. If the coating amount is 0.6 g/m$^2$ or greater, printing durability is excellent, and if the coating amount is 4.0 g/m$^2$ or less, image reproducibility and sensitivity are excellent.

<Upper Layer>

The upper layer of the lithographic printing plate precursor having a two-layer structure of the present invention can be preferably formed using the photosensitive resin composition of the present invention, and preferably formed using a resin composition other than the photosensitive resin composition of the present invention.

The upper layer of the lithographic printing plate precursor having a two-layer structure of the present invention is preferably an infrared sensitive positive type recording layer of which the solubility in an alkali aqueous solution is improved by heat.

The mechanism of improving the solubility in alkali aqueous solution by heat in the upper layer is not particularly limited, and any one can be used as long as it includes a binder resin and improves the solubility of the heated region. As the heat used in image formation, the heat generated in a case where the underlayer including an infrared absorbent is exposed is exemplified.

Preferable examples of the upper layer of which the solubility in an alkali aqueous solution is improved by heat include a layer including an alkali-soluble resin having a hydrogen-bonding capacity such as novolac or urethane, a layer including a water-insoluble and alkali-soluble resin and a compound having a dissolution suppressing action, and a layer including an ablation-possible compound.

In addition, by further adding an infrared absorbent to the upper layer, the heat generated from the upper layer can also be used in image formation. Preferable examples of the constitution of the upper layer including an infrared absorbent include a layer including an infrared absorbent, a water-insoluble and alkali-soluble resin, and a compound having a dissolution suppressing action, and a layer including an infrared absorbent, a water-insoluble and alkali-soluble resin, and an acid generator.

[Water-Insoluble and Alkali-Soluble Resin]

The upper layer according to the present invention preferably contains a water-insoluble and alkali-soluble resin. By containing the water-insoluble and alkali-soluble resin, an interaction is formed between the polar groups of the infrared absorbent and the water-insoluble and alkali-soluble resin, and a layer having a positive type photosensitivity is formed.

General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

The water-insoluble and alkali-soluble resin which can be used in the present invention is not particularly limited as long as it has a characteristic of being dissolved by contact with an alkali developer, and a homopolymer containing an acidic group in the main chain and/or a side chain in the polymer, a copolymer thereof, or a mixture thereof is preferable.

Such a water-insoluble and alkali-soluble resin having an acidic group preferably has a functional group such as a phenolic hydroxyl group, a carboxy group, a sulfonate group, a phosphate group, a sulfonamide group, or an active imide group. Therefore, such a resin can be suitably produced by copolymerizing a monomer mixture including one or more ethylenically unsaturated monomers having a functional group described above. As the ethylenically unsaturated monomer having a functional group described above, in addition to acrylic acid and methacrylic acid, a compound represented by the following formula and a mixture thereof can be preferably exemplified. Moreover, in the following formula, R$^{40}$ represents a hydrogen atom or a methyl group.

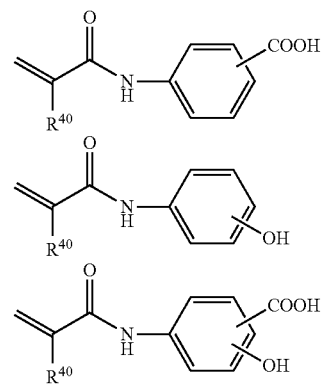

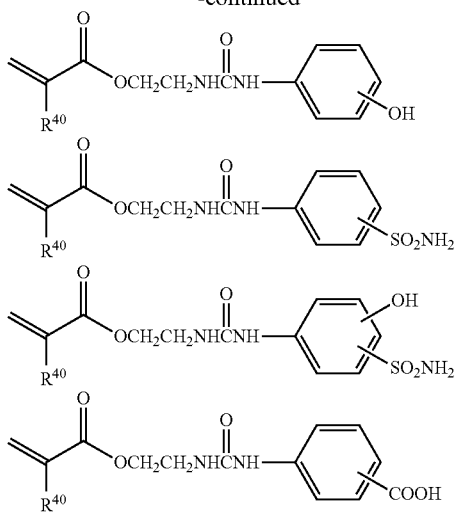

The water-insoluble and alkali-soluble resin which can be used in the present invention is preferably a polymer compound obtained by copolymerizing another polymerizable monomer in addition to the above-mentioned polymerizable monomers. As the copolymerization ratio in this case, a monomer imparting alkali-solubility such as a monomer having a functional group such as a phenolic hydroxyl group, a carboxy group, a sulfonate group, a phosphate group, a sulfonamide group, or an active imide group is preferably included in 10 mol % or greater, and more preferably included in 20 mol % or greater. If the copolymerization component of the monomer imparting alkali-solubility is 10 mol % or greater, sufficient alkali-solubility is obtained, and developability is excellent.

Examples of other usable polymerizable monomers include compounds exemplified below.

Alkyl acrylates or alkyl methacrylates such as methyl acrylate, ethyl acrylate, propyl acrylate, benzyl acrylate, methyl methacrylate, ethyl methacrylate, cyclohexyl methacrylate, and benzyl methacrylate. Acrylic acid esters or methacrylic acid esters having an aliphatic hydroxyl group such as 2-hydroxyethyl acrylate and 2-hydroxyethyl methacrylate. Acrylamides or methacrylamides such as acrylamide, methacrylamide, N-methylacrylamide, N-ethylacrylamide, and N-phenylacrylamide. Vinyl esters such as vinyl acetate, vinyl chloroacetate, vinyl butyrate, and vinyl benzoate. Styrenes such as styrene, α-methylstyrene, methyl styrene, and chloromethyl styrene. Other nitrogen atom-containing monomers such as N-vinyl pyrrolidone, N-vinyl pyridine, acrylonitrile, and methacrylonitrile. Maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, (meth)acrylic acid esters, (meth)acrylamides, maleimides, or (meth)acrylonitrile is suitably used.

In addition, as the alkali-soluble resin, a novolac resin exemplified as other alkali-soluble resin which is an arbitrary component of the photosensitive resin composition of the present invention may also be preferably exemplified.

In addition, the water-insoluble and alkali-soluble resin described above can also be used in the resin composition of the present invention.

Furthermore, in the upper layer of the present invention, other resins can be used in combination within a range not impairing the effects of the present invention. Since the upper layer is required to express alkali-solubility, in particular, in a non-image portion region, it is necessary to select a resin which does not impair this characteristic. From this viewpoint, as a resin usable in combination, a water-insoluble and alkali-soluble resin is exemplified. General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

In addition, the amount to be mixed is preferably 50% by mass or less with respect to the water-insoluble and alkali-soluble resin.

The water-insoluble and alkali-soluble resin preferably has a weight-average molecular weight of 2,000 or greater and a number average molecular weight of 500 or greater, and more preferably has a weight-average molecular weight of 5,000 to 300,000 and a number average molecular weight of 800 to 250,000. The dispersity (weight-average molecular weight/number average molecular weight) of the alkali-soluble resin is preferably 1.1 to 10.

The alkali-soluble resin in other resin compositions of the image recording material of the present invention as desired may be used alone or in combination of two or more types thereof.

The content of the alkali-soluble resin with respect to the total solid content in other resin compositions of the present invention is preferably 2.0% to 99.5% by mass, more preferably 10.0% to 99.0% by mass, and still more preferably 20.0% to 90.0% by mass, in the total solid content. If the addition amount of the alkali-soluble resin is 2.0% by mass or greater, the durability of a recording layer (photosensitive layer) is good, and if the addition amount of the alkali-soluble resin is 99.5% by mass or less, both the sensitivity and the durability are good.

[Infrared Absorbent]

An infrared absorbent may be included in other resin compositions described above.

The infrared absorbent is not particularly limited as long as it is a dye which generates heat by absorbing infrared light, and the infrared absorbent used in the resin composition of the present invention, described above, can also be used.

A particularly preferable dye is the cyanine dye represented by Formula (a).

When the upper layer contains an infrared absorbent, the sensitivity with respect to infrared rays is improved.

The addition amount of the infrared absorbent in the upper layer is preferably 0.01% to 50% by mass, more preferably 0.1% to 30% by mass, and particularly preferably 1.0% to 10% by mass, with respect to the total solid content in the upper layer. If the addition amount is 0.01% by mass or greater, the sensitivity is improved, and if the addition amount is 50% by mass or less, the uniformity of the layer is good and the durability of the layer is excellent.

[Other Components]

In addition, the upper layer of the lithographic printing plate precursor of the two-layer structure may include an acid generator, an acid proliferative agent, a development accelerator, a surfactant, a print-out agent/colorant, a plasticizer, or a wax agent.

As these components, respective components used in the resin composition of the present invention, described above, can also be used, and preferable aspects thereof are also the same.

<Underlayer>

The underlayer of the lithographic printing plate precursor having a two-layer structure of the present invention is preferably formed by applying the photosensitive resin composition of the present invention.

By using the photosensitive resin composition of the present invention in the underlayer, a printing plate having excellent image formability and printing durability can be obtained.

In addition, by using the photosensitive resin composition of the present invention in the underlayer, in a case where materials such as an ink and paper having particularly poor quality are used, the printing durability is improved.

Though the detailed mechanism by which the effects as described above are obtained is unclear, it is assumed that for the printing durability in printing, the film hardness of the resin used in the underlayer is important, and thus, it is assumed that, since the interaction (hydrogen bonding or the like) between the binders is strong, by using the photosensitive resin composition of the present invention having a high film hardness in the underlayer, the printing durability is improved.

In a case where the photosensitive resin composition of the present invention is used in the upper layer, the underlayer is also preferably formed of the photosensitive resin composition of the present invention, and the underlayer may be formed using a resin composition other than the photosensitive resin composition of the present invention. A preferable aspect of the underlayer in this case is the same as the preferable aspect of the upper layer described above.

<Support>

The support used in the image recording material of the present invention is not particularly limited as long as it is a dimensionally stable plate-shaped material having necessary strength and durability, and examples thereof include paper, paper on which plastic (for example, polyethylene, polypropylene, and polystyrene) has been laminated, a metal plate (for example, aluminum, zinc, and copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or a plastic film on which the above-described metals have been laminated or vapor-deposited.

Moreover, the support in a case where the image forming material of the present invention is applied to a lithographic printing plate precursor is preferably a polyester film or an aluminum plate, and among these, the aluminum plate which has good dimensional stability and is relatively inexpensive is particularly preferable. A suitable aluminum plate is a pure aluminum plate or an alloy plate which has aluminum as the main component and includes a small amount of other elements, or may be a plastic film on which aluminum has been laminated or vapor-deposited. Examples of other elements included in the aluminum alloy include silicon, iron, manganese, copper, magnesium, chromium, zinc, bismuth, nickel, and titanium. The content of other elements in the alloy is preferably 10% by mass or less.

Although particularly preferable aluminum in the present invention is pure aluminum, it is difficult to produce completely pure aluminum on refining technique, and thus, other elements may be slightly contained.

The composition of the aluminum plate applied to the present invention as described above is not particularly limited, and aluminum plates formed of known and used materials in the related art can be appropriately used. The thickness of the aluminum plate used in the present invention is preferably 0.1 to 0.6 mm, more preferably 0.15 to 0.4 mm, and particularly preferably 0.2 to 0.3 mm.

Such an aluminum plate may be subjected to a surface treatment such as a surface-roughening treatment and an anodization treatment, if necessary. As the surface treatment of the aluminum support, for example, a degreasing treatment with a surfactant, an organic solvent, or an alkaline aqueous solution, a roughening treatment of a surface, an anodization treatment, or the like, as described in detail in paragraphs 0167 to 0169 of JP2009-175195A, is suitably performed.

The aluminum surface on which an anodization treatment has been performed may be subjected to a hydrophilizing treatment, as necessary.

As the hydrophilizing treatment, the alkali metal silicate (for example, sodium silicate aqueous solution) method, the method of treating with potassium fluoride zirconate or polyvinylphosphonic acid, or the like, as disclosed in paragraph 0169 of JP2009-175195A, is used.

In addition, the supports described in JP2011-245844A can also be preferably used.

<Undercoat>

For example, in a case where the image recording material of the present invention is applied to a lithographic printing plate precursor, an undercoat can be provided between a support and an underlayer, if necessary.

As the undercoat component, various organic compounds can be used, and preferable examples thereof include phosphonic acids having an amino group such as carboxymethylcellulose or dextrin, an organic phosphonic acid, an organic phosphorus acid, an organic phosphinic acid, amino acids, and hydrochloride of an amine having a hydroxy group. In addition, these undercoat components may be used alone or in a mixture of two or more types thereof. Details of the compound used in the undercoat and the method of forming the undercoat are described in paragraphs 0171 and 0172 of JP2009-175195A, and those described here are also applied to the present invention.

The coating amount of the undercoat is preferably 2 to 200 mg/m$^2$ and more preferably 5 to 100 mg/m$^2$. If the coating amount is within the above range, sufficient printing durability is obtained.

<Back Coat Layer>

A back coat layer is provided on the rear surface of the support of the lithographic printing plate precursor of the present invention, if necessary. As the back coat layer, coating layers formed of an organic polymer compound described in JP1993-45885A (JP-H05-45885A) or a metal oxide obtained by hydrolyzing and polycondensing an organic or inorganic metal compound described in JP1994-35174A (JP-H06-35174A) are preferably used. Among these coating layers, alkoxy compounds of silicon such as $Si(OCH_3)_4$, $Si(OC_2H_5)_4$, $Si(OC_3H_7)_4$, and $Si(OC_4H_9)_4$ are easily available at low cost, and coating layers of metal oxides obtained from these have excellent developer resistance, and thus, these are particularly preferable.

(Production Method for Lithographic Printing Plate)

The production method of the lithographic printing plate of the present invention includes an exposure step of image-exposing the lithographic printing plate precursor and a development step of developing using a developer in this order.

According to the production method of the lithographic printing plate of the present invention, the developability change becomes good, the contamination due to the residual film of the non-image portion does not occur in the obtained lithographic printing plate, and the strength of the image portion and the durability are excellent.

Hereinafter, each step of production method of the present invention will be described in detail.

<Exposure Step>

The production method of the lithographic printing plate of the present invention includes an exposure step of exposing the lithographic printing plate precursor of the present invention in an image shape.

As a light source of active light used in image exposure of the lithographic printing plate precursor of the present invention, a light source having an emission wavelength in the near infrared region to the infrared region is preferable, and solid laser or semiconductor laser is more preferable. Among these, in the present invention, it is particularly preferable that image exposure is performed by solid laser or semiconductor laser emitting infrared rays having a wavelength of 750 to 1,400 nm.

The output of the laser is preferably 100 mW or greater, and to shorten the exposure time, a multibeam laser device is preferable used. In addition, the exposure time per pixel is preferably within 20 μseconds.

Energy with which the lithographic printing plate precursor is irradiated is preferably 10 to 300 mJ/cm$^2$. If the energy is within the above range, curing sufficiently proceeds and the laser ablation is suppressed, and thus, it is possible to prevent an image from being damaged.

In the exposure in the present invention, it is possible to expose by overlapping a light beam of the light source. The overlapping means that the sub-scanning pitch width is smaller than the beam diameter. For example, when the beam diameter is expressed by the half-value width (FWHM) of the beam intensity, the overlapping can be quantitatively expressed by FWHM/sub-scanning pitch width (overlap coefficient). In the present invention, this overlap coefficient is preferably 0.1 or greater.

The scanning method of the light source of an exposure apparatus which can be used in the present invention is not particularly limited, and a drum outer surface scanning method, a drum inner surface scanning method, a planar scanning method, or the like can be used. In addition, the channel of the light source may be a single channel or a multichannel, and in the case of drum outer surface scanning method, the multichannel is preferably used.

<Development Step>

The production method of the lithographic printing plate of the present invention includes a development step of developing using a developer.

The developer used in the development step is preferably an aqueous solution with a pH of 6.0 to 13.5 and more preferably an alkali aqueous solution with a pH of 8.5 to 13.5, A surfactant contributes to improvement of processability.

As the surfactant used in the developer, any of an anionic surfactant, a nonionic surfactant, a cationic surfactant, and an amphoteric surfactant can be used, and as described above, an anionic surfactant or a nonionic surfactant is preferable.

As the anionic surfactant, the nonionic surfactant, the cationic surfactant, and the amphoteric surfactant used in the developer of the present invention, the surfactants described in paragraphs 0128 to 0131 of JP2013-134341A can be used.

In addition, from the viewpoint of stable solubility or turbidity in water, a surfactant preferably has a HLB value of 6 or greater and more preferably has a HLB value of 8 or greater.

As the surfactant used in the developer, an anionic surfactant or a nonionic surfactant is preferable, and an anionic surfactant containing sulfonic acid or sulfonate or a nonionic surfactant having an aromatic ring and an ethylene oxide chain is particularly preferable.

The surfactant can be used alone or in combination of two or more types thereof.

The content of the surfactant in the developer is preferably 0.01% to 10% by mass, and more preferably 0.01% to 5% by mass.

If as a buffer, carbonate ions and hydrogencarbonate ions are included to maintain the pH of the developer at 8.5 to 13.5, it is possible to suppress variations in pH even in a case where the developer is used for a long period of time, and it is possible to suppress developability deterioration and a development scum occurrence due to the variation in pH. To make carbonate ions and hydrogencarbonate ions present in the developer, carbonate and hydrogencarbonate may be added to the developer, or by adjusting the pH after carbonate or hydrogencarbonate is added, carbonate ions and hydrogencarbonate ions may be generated. Although carbonate and hydrogencarbonate are not particularly limited, an alkali metal salt is preferable. Examples of the alkali metal include lithium, sodium, and potassium, and sodium is particularly preferable. These may be used alone or in combination of two or more types thereof.

The total amount of carbonate and hydrogencarbonate is preferably 0.3% to 20% by mass, more preferably 0.5% to 10% by mass, and still more preferably 1% to 5% by mass, with respect to the total mass of the developer. If the total amount is 0.3% by mass or greater, developability and processing capability are not reduced, and if the total amount is 20% by mass or less, a precipitate or a crystal is less likely to be produced and at the time of the waste liquid treatment of the developer, gelation when neutralizing is less likely to occur, and thus, trouble does not occur in the waste liquid treatment.

In addition, for the purpose of finely adjusting the alkali concentration or assisting dissolution of the non-image portion photosensitive layer, supplementarily, other alkali agents, for example, organic alkali agents may be used in combination. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. Other alkali agents are used alone or in combination of two or more types thereof.

In addition to the above materials, the developer may contain a wetting agent, a preservative, a chelate compound, an antifoaming agent, an organic acid, an organic solvent, an inorganic acid, an inorganic salt, or the like. If a water-soluble polymer compound is added, in particular, when the developer was fatigued, the plate surface is likely to be sticky, and thus, a water-soluble polymer compound is preferably not added.

As the wetting agent, the wetting agents described in paragraph 0141 of JP2013-134341A can be suitably used. The wetting agent may be used alone or in combination of two or more types thereof. The wetting agent is preferably used in an amount of 0.1% to 5% by mass with respect to the total mass of the developing agent.

As the preservative, the preservatives described in paragraph 0142 of JP2013-134341A can be suitably used. Two or more preservatives are preferably used in combination such that the preservatives have effect on various molds and bacteria. The addition amount of the preservative is an amount in which the effect is stably exhibited on bacteria, fungi, yeast or the like, and although the addition amount varies depending on the type of bacteria, molds, or yeast, the addition amount is preferably within the range of 0.01% to 4% by mass with respect to the total mass of the developer.

As the chelate compound, the chelate compounds described in paragraph 0143 of JP2013-134341A can be suitably used. As the chelating agent, a chelating agent which is stably present in the developer composition and does not impair the printability is selected. The addition amount is preferably 0.001% to 1.0% by mass with respect to the total mass of the developer.

As the antifoaming agent, the antifoaming agents described in paragraph 0144 of JP2013-134341A can be suitably used. The content of the antifoaming agent is preferably within the range of 0.001% to 1.0% by mass with respect to the total weight of the developer.

As the organic acid, the antifoaming agents described in paragraph 0145 of JP2013-134341A can be suitably used. The content of the organic acid is preferably 0.01% to 0.5% by mass with respect to the total mass of the developer.

Examples of the organic solvent include aliphatic hydrocarbons (hexane, heptane, "Isopar E, H, G" (manufactured by Exxon Chemical Company), gasoline, kerosene, and the like), aromatic hydrocarbons (toluene, xylene, and the like), halogenated hydrocarbons (methylene dichloride, ethylene dichloride, trichlene, monochlorobenzene, and the like), and polar solvents.

Examples of the polar solvent include alcohols (methanol, ethanol, propanol, isopropanol, benzyl alcohol, ethylene glycol monomethyl ether, 2-ethoxyethanol, and the like), ketones (methyl ethyl ketone, cyclohexanone, and the like), esters (ethyl acetate, methyl lactate, propylene glycol monomethyl ether acetate, and the like), others (triethyl phosphate, tricresyl phosphate, N-phenylethanolamine, N-phenyldiethanolamine, and the like).

In addition, in a case where the organic solvent is insoluble in water, it is also possible to use by solubilizing the organic solvent in water using a surfactant or the like. In a case where the developer contains an organic solvent, from the viewpoint of safety and inflammability, the concentration of the solvent is preferably less than 40% by mass.

Examples of the inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably 0.01% to 0.5% by mass with respect to the total mass of the developer.

Although the temperature of development is not particularly limited as long as, at the temperature, developing is possible, the temperature is preferably at 60° C. or lower, and more preferably 15° C. to 40° C. In the development treatment using an automatic developing device, the developer becomes fatigued according to the treatment amount, and thus, the processing capability may be restored using a replenisher or a fresh developer. As one example of the development or the treatment after the development, a method of performing alkali development, removing the alkali in a post-water washing step, performing a gum treatment in a gumming step, and drying in a drying step can be exemplified. In addition, as another example, a method of performing pre-water washing, developing, and gumming at the same time by using an aqueous solution containing carbonate ions, hydrogencarbonate ions, and a surfactant can be preferably exemplified. Thus, particularly, the pre-water washing may not be performed, and only by using one solution, pre-water washing, developing, and gumming are performed in one bath, and then, a drying step may be preferably performed. After developing, drying is preferably performed after the excess developer is removed using a squeeze roller or the like.

The development step can be suitably performed by an automatic processing machine equipped with a rubbing member. Examples of the automatic processing machine include an automatic processing machine which performs a rubbing treatment while transporting the lithographic printing plate precursor after image exposure, described in JP1990-220061A (JP-H02-220061A) and JP1985-59351A (JP-S60-59351A), and an automatic processing machine which performs a rubbing treatment on the lithographic printing plate precursor after image exposure, set on a cylinder while rotating the cylinder, described in U.S. Pat. Nos. 5,148,746A, 5,568,768A, and GB2297719B. Among these, as the rubbing member, an automatic processing machine using a rotating brush roll is particularly preferable.

The rotating brush roll used in the present invention can be suitably selected in consideration of the difficulty in flawing of the image portion and the stiffness of the support of the lithographic printing plate precursor. As the rotating brush roll, a known rotating brush roll formed by implanting a brush material into a plastic or metal roll can be used. For example, the brush rolls described in JP1983-159533A (JP-S58-159533A) or JP1991-100554A (JP-H03-100554A) or a brush roll formed by closely and radially wrapping a metal or plastic grooved material into which a brush material has been implanted in a row on a plastic or metal roll which becomes a core, as described in JP1987-167253Y (JP-S62-167253Y), can be used.

As the brush material, plastic fibers (for example, polyester-based synthetic fibers such as polyethylene terephthalate and polybutylene terephthalate, polyamide-based synthetic fibers such as nylon 6.6 and nylon 6.10, polyacryl-based synthetic fibers such as polyacrylonitrile and polyalkyl (meth)acrylate, and polyolefin-based synthetic fibers such as polypropylene and polystyrene) can be used, and for example, a plastic fiber having a diameter of a fiber hair of 20 to 400 μm and a length of a hair of 5 to 30 mm can be suitably used.

The outer diameter of the rotating brush roll is preferably 30 to 200 mm, and the circumferential speed of the front end of the brush rubbing the plate surface is preferably 0.1 to 5 m/sec. A plurality of the rotating brush rolls is preferably used.

Although the rotation direction of the rotating brush roll may be the same direction or may be the reverse direction, with respect to the transporting direction of the lithographic printing plate precursor, in a case where two or more rotating brush rolls are used, it is preferable that at least one rotating brush roll rotates in the same direction and at least one rotating brush roll rotates in the reverse direction. Thus, removal of the photosensitive layer of the non-image portion becomes more reliable. Furthermore, it is also effective to swing the rotating brush roller in the rotation axis direction of the brush roll.

After the development step, a continuous or discontinuous drying step is preferably performed. Drying is performed by hot air, infrared rays, or far infrared rays.

As the automatic processing machine preferably used in the production method of the lithographic printing plate of the present invention, an apparatus having a developing portion and a drying portion, and developing, and gumming are performed on the lithographic printing plate precursor in developer tank, and then, the lithographic printing plate precursor is dried in the drying portion, whereby a lithographic printing plate is obtained.

In addition, for the purpose of improving printing durability or the like, it is also possible to heat the printing plate after developing in very strong conditions. The heating temperature is preferably within the range of 200° C. to 500° C. If the temperature is low, sufficient image strengthening effects are not obtained, and in a case where the temperature is too high, there is a possibility that problems such as deterioration of the support or thermal decomposition of the image portion occur.

The lithographic printing plate obtained in this manner is mounted on an offset printing machine, and can be suitably used in printing a large number of sheets.

(Polymer Compound)

The polymer compound of the present invention has the same definition as that for the polymer compound used in the photosensitive resin composition of the present invention, and the preferable range thereof is the same as those described above.

According to a first preferred aspect of the present invention, the polymer compound has an amine bond or a quaternary ammonium salt bond, and at least one bond selected from the group consisting of a urea bond, a urethane bond, and a carbonate bond in the main chain and a constitutional unit represented by the following Formula A-4 in the main chain.

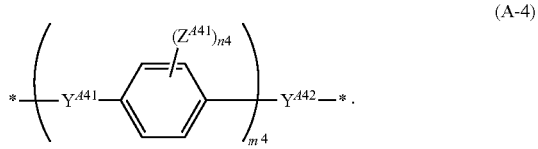

(A-4)

In Formula A-4, $Y^{A41}$ and $Y^{A42}$ each independently represent a single bond or a divalent linking group, $Z^{A41}$'s each independently represent a sulfonamide group or a hydroxy group, m4 represents an integer of 1 or greater, n4 represents an integer of 1 to 4, and the "*" portions each independently represent a binding position with another structure.

In Formula A-4, $Y^{A41}$, $Y^{A42}$, $Z^{A41}$, m4, and n4 have the same definitions as those for $Y^{A11}$, $Y^{A12}$, $Z^{A11}$, m1, and n1 of Formula A-1 and the preferable ranges thereof are the same as those described above.

According to a second preferred aspect of the present invention, the polymer compound has an amine bond or a quaternary ammonium salt bond, and at least one bond selected from the group consisting of a urea bond, a urethane bond, and a carbonate bond in the main chain and a constitutional unit represented by the following Formula A-5 in the main chain.

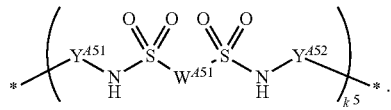

(A-5)

In Formula A-5, $Y^{A51}$ and $Y^{A52}$ each independently represent a divalent linking group, $W^{A51}$ represents an arylene group or a combination of an arylene group and a divalent linking group, k5 represents an integer of 1 or greater, and the "*" portions each independently represent a binding position with another structure.

In Formula A-5, $Y^{A51}$, $Y^{A52}$, $W^{A51}$, and k5 have the same definitions as those for $Y^{A21}$, $Y^{A22}$, $W^{A21}$, and k2 of Formula A-2 and the preferable ranges thereof are the same as those described above.

According to a third preferred aspect of the present invention, the polymer compound has an amine bond or a quaternary ammonium salt bond, and at least one bond selected from the group consisting of a urea bond, a urethane bond, and a carbonate bond in the main chain and a constitutional unit represented by the following Formula A-6 in the main chain.

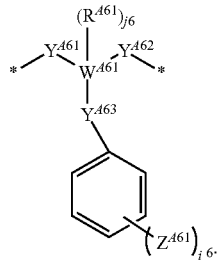

(A-6)

In Formula A-6, $R^{A61}$ represents a hydrogen atom or a monovalent organic group, $Y^{A61}$, $Y^{A62}$, and $Y^{A63}$ each independently represent a divalent linking group, $W^{A61}$ represents a carbon atom or a nitrogen atom, $Z^{A61}$'s each independently represent a sulfonamide group or a hydroxy group, i6 represents an integer of 1 to 5, j6 represents 1 or 0, and the "*" portions each independently represent a binding position with another structure.

In Formula A-6, $R^{A61}$, $Y^{A61}$ to $Y^{A63}$, $W^{A61}$, $Z^{A61}$, i6, and j6 have the same definitions as those for $R^{A31}$, $Y^{A31}$ to $Y^{A33}$, $W^{A31}$, $Z^{A31}$, i3, and j3 of Formula A-3 and the preferable ranges thereof are the same as those described above.

EXAMPLES

Hereinafter, the present invention will be described in detail using examples, but the present invention is not limited thereto. Moreover, "part" and "%" in the following examples respectively represent "part(s) by mass" and "% by mass" unless otherwise specified.

Synthesis Example

<Synthesis of PU-2>

3.89 g of 3,3'-dihydroxybenzidine (manufactured by Tokyo Chemical Industry Co., Ltd.), 0.29 g of N,N'-bis(3-aminopropylamine)methylamine (manufactured by Tokyo Chemical Industry Co., Ltd.), 0.0083 g of cyclohexylamine (manufactured by Tokyo Chemical Industry Co., Ltd.), and 35.72 g of N,N-dimethylacetamide (manufactured by Kanto Chemical Co., Inc.) were put into a three-neck flask provided with a condenser and a stirrer, and the temperature of the reaction solution was set to room temperature, thereby obtaining a uniform solution.

3.88 g of 1,3-bis(isocyanatomethyl)cyclohexane (manufactured by Tokyo Chemical Industry Co., Ltd.) was dissolved in 10.00 g of N,N-dimethylacetamide (manufactured by Kanto Chemical Co., Inc.), the resulting solution was added dropwise to the uniform solution using a dropping funnel at room temperature for 15 minutes, and stirred at room temperature for 30 minutes for a reaction, 0.30 g of cyclohexylamine (manufactured by Tokyo Chemical Industry Co., Ltd.) was added thereto, and the reaction solution was stirred for 15 minutes. Next, 10 mL of methanol was added thereto, reacted at 65° C. for 2 hours, cooled to room temperature, and then dissolved in the reaction solution.

The reaction solution was poured into a mixed solution of 0.3 L of pure water and 0.3 L of methanol, and as a result, a polymer was precipitated. The resultant was collected by filtration, washed, and dried, whereby 7.55 g of a binder polymer (PU-2) having a weight-average molecular weight of 51,000 was obtained.

It was confirmed from the NMR spectrum, the IR spectrum, and GPC (polystyrene conversion) that the obtained product was the target substance. In the same manner, PU-1 and PU-3 to PU-25 can be synthesized.

<Synthesis of PA-1>

3.89 g of 3,3'-dihydroxybenzidine (manufactured by Tokyo Chemical Industry Co., Ltd.), 0.29 g of N,N'-bis(3-aminopropylamine)methylamine (manufactured by Tokyo Chemical Industry Co., Ltd.), 0.0083 g of cyclohexylamine (manufactured by Tokyo Chemical Industry Co., Ltd.), and 35.72 g of N,N-dimethylacetamide (manufactured by Kanto Chemical Co., Inc.) were put into a three-neck flask provided with a condenser and a stirrer, and the temperature of the reaction solution was set to room temperature, thereby obtaining a uniform solution.

3.88 g of 1,3-bis(isocyanatomethyl)cyclohexane (manufactured by Tokyo Chemical Industry Co., Ltd.) was dissolved in 10.00 g of N,N-dimethylacetamide (manufactured by Kanto Chemical Co., Inc.), the resulting solution was added dropwise to the uniform solution using a dropping funnel at room temperature for 15 minutes, and stirred at room temperature for 30 minutes for a reaction, 0.30 g of cyclohexylamine (manufactured by Tokyo Chemical Industry Co., Ltd.) was added thereto, and the reaction solution was stirred for 15 minutes. Next, 10 mL of methanol was added thereto, reacted at 65° C. for 2 hours, cooled to room temperature, and then dissolved in the reaction solution by adding 0.38 g of p-toluenesulfonic acid monohydrate (manufactured by Wako Pure Chemical Industries, Ltd.) thereto.

The reaction solution was poured into a mixed solution of 0.3 L of pure water and 0.3 L of methanol, and as a result, a polymer was precipitated. The resultant was collected by filtration, washed, and dried, whereby 8.02 g of a binder polymer (PA-1) having a weight-average molecular weight of 51,000 was obtained.

It was confirmed from the NMR spectrum, the IR spectrum, and GPC (polystyrene conversion) that the obtained product was the target substance. In the same manner, PA-2 to PA-15 can be synthesized.

<Synthesis of PS-1>

3.89 g of 3,3'-dihydroxybenzidine (manufactured by Tokyo Chemical Industry Co., Ltd.), 0.29 g of N,N'-bis(3-aminopropylamine)methylamine (manufactured by Tokyo Chemical Industry Co., Ltd.), 0.0083 g of cyclohexylamine (manufactured by Tokyo Chemical Industry Co., Ltd.), and 35.72 g of N,N-dimethylacetamide (manufactured by Kanto Chemical Co., Inc.) were put into a three-neck flask provided with a condenser and a stirrer, and the temperature of the reaction solution was set to room temperature, thereby obtaining a uniform solution.

3.88 g of 1,3-bis(isocyanatomethyl)cyclohexane (manufactured by Tokyo Chemical Industry Co., Ltd.) was dissolved in 10.00 g of N,N-dimethylacetamide (manufactured by Kanto Chemical Co., Inc.), the resulting solution was added dropwise to the uniform solution using a dropping funnel at room temperature for 15 minutes, and stirred at room temperature for 30 minutes for a reaction, 0.30 g of cyclohexylamine (manufactured by Tokyo Chemical Industry Co., Ltd.) was added thereto, and the reaction solution was stirred for 15 minutes. Next, 10 mL of methanol was added to the reaction solution, the reaction solution was reacted at 65° C. for 2 hours, and then 0.37 g of methyl p-toluenesulfonate (manufactured by Wako Pure Chemical Industries, Ltd.) was added to the reaction solution for a reaction at 80° C. for 4 hours.

The reaction solution was poured into a mixed solution of 0.3 L of pure water and 0.3 L of methanol, and as a result, a polymer was precipitated. The resultant was collected by filtration, washed, and dried, whereby 8.21 g of a binder polymer (PS-1) having a weight-average molecular weight of 51,000 was obtained.

It was confirmed from the NMR spectrum, the IR spectrum, and GPC (polystyrene conversion) that the obtained product was the target substance. In the same manner, PS-2 to PS-9 can be synthesized.

<Synthesis of Sulfonamide-Containing Diol (SP-1)>

500.0 g of chlorosulfonic acid was put into a three-neck flask provided with a condenser and a stirrer, 130.96 g of diphenylsulfone (manufactured by Sigma-Aldrich Co. LLC.) was added thereto at room temperature, and the resulting solution was stirred at room temperature for 1 hour. The temperature of the reaction solution was raised to 80° C., and the reaction solution was stirred for 8 hours. This reaction solution was cooled to room temperature while being stirred, and crystallized in 2 L of ice-cold water, followed by stirring for 30 minutes. This was collected by filtration, and the collected product was dissolved in 6 L of ethyl acetate. This ethyl acetate solution was transferred to a separating funnel, washing with pure water and liquid-liquid separation was performed two times, and washing with saturated saline and liquid-liquid separation was performed. After the organic layer was transferred to an Erlenmeyer flask, 30 g of magnesium sulfate was added thereto, followed by stirring, the solid content was removed by filtration, the ethyl acetate was distilled off using an evaporator, and the resulting product was vacuum-dried at 40° C. for 24 hours, whereby 145 g of a precursor S-1 (disulfonic chloride) which was a target substance was obtained. It was confirmed from the NMR spectrum that the obtained product was the precursor (S-1). Analysis by $^1$NMR was performed on the precursor S-1. The result thereof is shown below.

$^1$NMR data (deuterated D tetrahydrofuran, 400 MHz, internal standard: tetramethylsilane)

δ (ppm)=8.00-8.04 (t, 2H), 8.43-8.48 (d, 2H), 8.56-8.59 (d, 2H), 8.76 (s, 2H)

30.54 g of 2-aminoethanol (manufactured by Tokyo Chemical Industry Co., Ltd.) and 30.0 g of tetrahydrofuran were weighed in a three-neck flask provided with a condenser and a stirrer, and the resulting solution was stirred while being cooled to 0° C. to 5° C. After 20.76 g of the precursor (S-1) obtained in the above-described manner was dissolved in 170 g of tetrahydrofuran, the solution was transferred to a dropping funnel, added dropwise to the three-neck flask during stirring for 1 hour, and stirred for 1 hour. After the temperature of the reaction solution was returned to room temperature and the reaction solution was stirred for 2 hours, the reaction solution was transferred to a separating funnel and dissolved in 1 L of ethyl acetate, washing with a hydrochloric acid aqueous solution, water, and saturated saline and liquid-liquid separation were performed three times, and an organic layer was collected. The organic layer was dried over magnesium sulfate and collected by filtration, and ethyl acetate was distilled off using an evaporator, thereby obtaining crystals. The crystals were vacuum-dried at 40° C. for 24 hours, whereby 20.1 g of a target substance (SP-1) was obtained. It was confirmed from the NMR spectrum that the obtained product was the target substance.

Analysis by $^1$NMR was performed on the target substance (SP-1). The result thereof is shown below.

$^1$NMR data (deuterated DMSO, 400 MHz, internal standard: tetramethylsilane)

δ (ppm)=2.80-2.83 (t, 4H), 3.32-3.36 (t, 4H), 4.67 (s, 2H), 7.86-7.90 (t, 2H), 7.94 (s, 2H), 8.11-8.13 (d, 2H), 8.24-8.26 (d, 2H), 8.35 (s, 2H)

In the same manner, SP-2 to SP-8 can be synthesized.

<Synthesis of PT-1>

18.58 g of SP-1, 1.19 g of N-methyldiethanolamine (manufactured by Tokyo Chemical Industry Co., Ltd.), and 65.76 g of N,N-dimethylacetamide (manufactured by Kanto Chemical Co., Inc.) were put into a three-neck flask provided with a condenser and a stirrer, and the temperature of the reaction solution was set to room temperature, thereby obtaining a uniform solution.

8.41 g of hexamethylene diisocyanate (manufactured by Tokyo Chemical Industry Co., Ltd.) was added dropwise to the uniform solution at room temperature for 10 minutes using a dropping funnel, 0.01 g of NEOSTANN U-600 (manufactured by NITTO KASEI CO., LTD.: bismuth catalyst) was added thereto, and the reaction solution was stirred for 10 minutes, heated to 60° C., and stirred for 6 hours. Next, 10 mL of methanol was added to the reaction solution for a reaction at 60° C. for 2 hours, and then the reaction solution was cooled to room temperature.

The reaction solution was poured into to a mixed solution of 1 L of pure water and 1 L of methanol, and as a result, a polymer was precipitated. The resultant was collected by filtration, washed, and dried, whereby 26.2 g of a binder polymer (PT-1) having a weight-average molecular weight of 56,000 was obtained.

It was confirmed from the NMR spectrum, the IR spectrum, and GPC (polystyrene conversion) that the obtained product was the target substance. In the same manner, PT-2 to PT-15 can be synthesized.

<Synthesis of PK-1 to PK-11>

40 parts by mass of a mixture of each monomer diol in total, 60 parts by mass of diethyl carbonate, and 60 parts by mass of a 20% sodium ethoxide ethanol solution were mixed with each other in a nitrogen-substituted three-neck flask provided with a stirrer and a reflux tube, and heated to 120° C. Thereafter, the pressure in the reactor was reduced by approximately 30 kPa and the mixture was stirred for 1 hour. Next, the mixture was further stirred in a vacuum at 0.1 kPa for 3 hours. The mixture was cooled to room temperature and the reactant was stirred and added dropwise to 500 parts by mass of pure water during stirring. The obtained white powder was collected by filtration and dried by blowing air, whereby a binder polymer (PK-2) having a weight-average molecular weight of 41,000 was obtained. It was confirmed from the NMR spectrum, the IR spectrum, and GPC (polystyrene conversion) that the obtained product was the target substance. In the same manner, PK-1 and PK-3 to PK-11 can be synthesized.

In the examples, "weight-average molecular weight" is calculated by a standard polystyrene conversion method using gel permeation chromatography (GPC). Here, as the GPC column, a column filled with polystyrene crosslinked gel (TSKgel SuperAWM-H; manufactured by Tosoh Corporation) was used, and as the GPC solvent, N-methylpyrrolidone (0.01 mol/L of each of phosphoric acid and lithium bromide) was used.

Examples 1 to 18 and Comparative Examples 1 to 3

<Production of Support>

An aluminum alloy plate having a thickness of 0.3 mm of a material 1S was subjected to the treatment shown in any of the following (A) to (F), whereby and a support for a lithographic printing plate was manufactured. Moreover, during all treatment steps, a washing treatment with water was performed, and after the washing treatment with water, liquid cutting was performed using a nip roller.

[Treatment A]

(A-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(A-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(A-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(A-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(A-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(A-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(A-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(A-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(A-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(A-j) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(A-k) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment B]

(B-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(B-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(B-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(B-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(B-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(B-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(B-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(B-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(B-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(B-j) First Stage of Anodization Treatment

A first stage of the anodization treatment was performed using an anodization apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm$^2$. The depth of the micropores was 27 μm, and the obtained coating amount was 0.13 g/m$^2$.

(B-k) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(B-l) Second Stage of Anodization Treatment

A second stage of the anodization treatment was performed using an anodization apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 55° C. and a current density of 20 A/dm$^2$. The obtained coating amount was 2.6 g/m$^2$.

(B-m) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (C)]

(C-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 1.0 g/m$^2$.

(C-b) Desmutting Treatment in Acidic Aqueous Solution (First Desmutting Treatment)

Next, a desmutting treatment was performed in an acidic aqueous solution. As the acidic aqueous solution used in the desmutting treatment, a sulfuric acid aqueous solution having a concentration of 150 g/L was used. The temperature was 30° C. The desmutting treatment was performed for 3 seconds by spraying the desmutting liquid using a spray. Thereafter, a washing treatment with water was performed.

(C-c) Electrochemical Roughening Treatment in Acidic Aqueous Solution

Next, an electrolytic surface-roughening treatment was performed using an electrolyte in which the concentration of hydrochloric acid was 14 g/L, the concentration of aluminum ions was 13 g/L, and the concentration of sulfuric acid was 3 g/L. The temperature of the electrolyte was 30° C. The concentration of aluminum ions was adjusted by adding aluminum chloride.

The waveform of AC was a sine wave in which the positive waveform and the negative waveform were symmetrical, the frequency was 50 Hz, the anode reaction time and the cathode reaction time at one period of AC was 1:1, and the current density was 75 A/dm² at the peak current value of AC waveform. In addition, the electric quantity was 450 C/dm² as the sum total of electric quantity which the aluminum plate taken in the anode reaction, and the electrolytic treatment was performed four times with an interval of 4 seconds by 125 C/dm². As the counter electrode of the aluminum plate, a carbon electrode was used. Thereafter, a washing treatment with water was performed.

(C-d) Alkali Etching Treatment

The aluminum plate after the electrochemical roughening treatment was subjected to an etching treatment by spraying a caustic soda aqueous solution in which the concentration of caustic soda was 5% by mass and the concentration of aluminum ions was 0.5% by mass using a spray tube at a temperature of 35° C. The amount of aluminum dissolved on the surface subjected to the electrochemical roughening treatment was 0.1 g/m². Thereafter, a washing treatment with water was performed.

(C-e) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(C-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(C-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Treatment (D)]

(D-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m².

(D-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(D-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm² as the peak current value, and 5% of the current from the power source was separately flowed to the auxiliary anode. The electric quantity (C/dm²) was 250 C/dm² as the sum total of electric quantity at the time of anodization of the aluminum plate. Thereafter, washing with water by spraying was performed.

(D-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m².

(D-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(D-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm² as the peak current value, and the electric quantity (C/dm²) in the hydrochloric acid electrolysis was 63 C/dm² as the sum total of electric quantity at the time of anodization of the aluminum plate. Thereafter, washing with water by spraying was performed.

(D-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m².

(D-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(D-i) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(D-j) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (E)]

(E-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(E-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(E-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodization of the aluminum plate. Thereafter, washing with water by spraying was performed.

(E-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(E-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(E-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(E-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(E-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(E-i) First Stage of Anodization Treatment

A first stage of the anodization treatment was performed using an anodization apparatus by DC electrolysis.

The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm$^2$. The depth of the micropores was 27 μm, and the obtained coating amount was 0.13 g/m$^2$.

(E-j) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(E-k) Second Stage of Anodization Treatment

A second stage of the anodization treatment was performed using an anodization apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 40° C. and a current density of 20 A/dm$^2$. The obtained coating amount was 2.6 g/m$^2$.

(E-l) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (F)]

(F-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(F-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(F-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodization of the aluminum plate. Thereafter, washing with water by spraying was performed.

(F-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(F-e) Desmutting Treatment in Acidic Aqueous Solution

Next, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed in a sulfuric acid aqueous solution. The desmutting treatment was performed for 3 seconds by spraying the desmutting liquid using a spray.

(F-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(F-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (G)]

(G-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(G-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(G-c) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(G-d) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(G-e) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (H)]

(H-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(H-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(H-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(H-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(H-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(H-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(H-g) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(H-h) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Formation of Undercoat]

An undercoat coating solution 1 shown below was applied to each of the supports A to F produced in the above manner, followed by drying at 80° C. for 15 seconds, whereby supports A-1 to F-1 provided with an undercoat were obtained. The coating amount after drying was 15 mg/m$^2$.

(Undercoat Coating Solution 1)

Following copolymer having a molecular weight of 28,000 (in the following structural formula, the subscripts in the bottom right of the parentheses represent the content (mol %) of each constitutional unit): 0.3 g
Methanol: 100 g
Water: 1 g

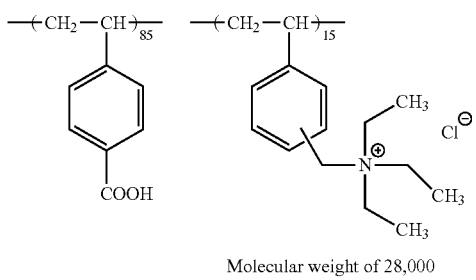

Molecular weight of 28,000

<Formation of Image Recording Layer>

After a coating solution composition (I) for forming an underlayer having the following compositional ratio was applied to the obtained supports A-1 to F-1 using a wire bar, the resulting product was dried in a drying oven at 150° C. for 40 seconds such that the coating amount became 1.0 g/m², whereby an underlayer was provided. After the underlayer was provided, a coating solution composition (II) for forming an upper layer having the following compositional ratio was applied using a wire bar, whereby an upper layer was provided. After application, the resulting product was dried at 150° C. for 40 seconds, whereby a lithographic printing plate precursor in which the amount of the underlayer and the upper layer coated was 1.2 g/m² was obtained.

(Coating Solution Composition (I) for Forming Underlayer)

Specific polymer compound described in Table 7: 3.5 parts
m, p-Cresol novolac (m/p ratio=6/4, weight-average molecular weight of 6,000): 0.6 parts
Infrared absorbent (IR coloring agent (1): following structure): 0.2 parts
4,4'-Bishydroxyphenyl sulfone: 0.3 parts
Tetrahydrophthalic acid: 0.4 parts
p-Toluenesulfonic acid: 0.02 parts
3-Methoxy-4-diazodiphenylamine hexafluorophosphate: 0.06 parts
Product obtained by replacing an counter ion of ethyl violet with 6-hydroxynaphthalenesulfonic acid: 0.15 parts
Fluorine-based surfactant (MEGAFAC F-780, manufactured by DIC Corporation): 0.07 parts
Methyl ethyl ketone: 30 parts
1-Methoxy-2-butyrolactone: 15 parts
γ-Butyrolactone: 15 parts IR coloring agent (1)

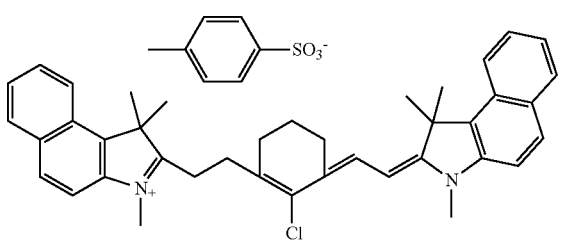

(Coating Solution Composition (II) for Forming Upper Layer)

Novolac resin (m-cresol/p-cresol/phenol=3/2/5, Mw of 8,000): 0.68 parts
Infrared absorbent (IR coloring agent (1): above structure): 0.045 parts
Fluorine-based surfactant (MEGAFAC F-780, manufactured by DIC Corporation): 0.03 parts
Methyl ethyl ketone: 15.0 parts
1-Methoxy-2-propanol: 30.0 parts
5-Benzoyl-4-hydroxy-2-methoxybenzenesulfonate of 1-(4-methylbenzyl)-1-phenylpiperidinium: 0.01 parts The following evaluations were performed on the obtained lithographic printing plate precursor, and the results are shown in the following Table 7.

<Evaluation of Non-Image Portion Development Time>

Drawing of a test pattern in an image was performed on the lithographic printing plate precursor using a Trendsetter VX manufactured by Creo company while changing the exposure energy. Thereafter, the resulting product was immersed in a developing bath charged with a developer XP-D (which was made to have a conductivity of 43 mS/cm by diluting) manufactured by Fujifilm Corporation, and the time required for developing the non-image portion at a developing temperature of 30° C. was measured. The immersion time in which the image density became equal to the image density of the Al support was taken as a non-Image portion development time. As the non-Image portion development time is shorter, an alkali aqueous solution developability (highlight reproducibility) is good. The results are shown in Table 7.

<Evaluation of Printing Durability>

Drawing of a test pattern in an image was performed on the lithographic printing plate precursor using a Trendsetter manufactured by Creo company at a beam intensity of 9 W and a drum rotation speed of 150 rpm. Thereafter, using PS PROCESSOR LP940H manufactured by Fujifilm Corporation charged with a developer XP-D (which was made to have a conductivity of 43 mS/cm by diluting) manufactured by Fujifilm Corporation, development was performed at a developing temperature of 30° C. The development time was made to be the non-Image portion development time added with 5 seconds. This was continuously printed using a printer LITHRONE manufactured by KOMORI Corporation. As the ink, a tokunen black ink manufactured by TOYO INK CO., LTD. which contains calcium carbonate, as a model of low-grade material was used. At this time, by visually observing how much sheets could be printed while maintaining a sufficient ink density, the printing durability was evaluated. As the number of sheets was larger, the printing durability was evaluated to be excellent. The results are shown in Table 7.

<Evaluation of Chemical Resistance>

Exposure, development, and printing were performed on the lithographic printing plate precursors of the examples in the same manner as in the evaluation of the printing durability. In this time, every time 5,000 sheets were printed, a step of wiping the plate surface with a cleaner (manufactured by Fujifilm Corporation, multi cleaner) was performed, and the chemical resistance was evaluated. The printing durability at this time was evaluated as 1 in a case where the number of printed sheets was 95% to 100% of the number of printing endurable sheets described above, evaluated as 2 in a case where the number of printed sheets was 80% or greater and less than 95%, evaluated as 3 in a case where the number of printed sheets was 60% or greater and less than 80%, and evaluated as 4 in a case where the number of printed sheets was less than 60%. Even in a case where the step of wiping the plate surface with a cleaner was performed, as the change in the printing durability index was smaller, the chemical resistance was evaluated to be excellent. The results are shown in the following Table 7.

TABLE 7

|  | Support | Specific polymer compound | Non-image portion developing time (seconds) | Printing durability number of printed sheets (×10000 sheets) | Chemical resistance |
|---|---|---|---|---|---|
| Example 1 | A-1 | PU-2 | 6 | 15 | 1 |
| Example 2 | B-1 | PU-2 | 6 | 15 | 1 |
| Example 3 | C-1 | PU-2 | 6 | 15 | 1 |
| Example 4 | D-1 | PU-2 | 6 | 15 | 1 |
| Example 5 | E-1 | PU-2 | 6 | 15 | 1 |
| Example 6 | F-1 | PU-2 | 6 | 15 | 1 |
| Example 7 | A-1 | PU-5 | 6 | 14 | 1 |
| Example 8 | A-1 | PU-12 | 5 | 13 | 1 |
| Example 9 | A-1 | PU-14 | 5 | 12 | 1 |
| Example 10 | A-1 | PU-17 | 4 | 12 | 1 |
| Example 11 | A-1 | PU-20 | 5 | 13 | 1 |
| Example 12 | A-1 | PT-1 | 5 | 12 | 2 |
| Example 13 | A-1 | PT-2 | 4 | 13 | 2 |
| Example 14 | A-1 | PT-3 | 6 | 13 | 2 |
| Example 15 | A-1 | PK-1 | 6 | 10 | 1 |
| Example 16 | A-1 | PK-2 | 7 | 10 | 1 |
| Example 17 | A-1 | PA-1 | 6 | 18 | 1 |
| Example 18 | A-1 | PS-1 | 6 | 18 | 1 |
| Comparative Example 1 | A-1 | CP-1 | 150 | 11 | 2 |
| Comparative Example 2 | A-1 | CP-2 | 150 | 7 | 3 |
| Comparative Example 3 | A-1 | CP-3 | 12 | 5 | 2 |

Synthesis Example of Comparative Example 1
(CP-1)

Into a three-neck flask provided with a condenser and a stirrer, 12.51 g of 4,4'-diaminodiphenylmethane (manufactured by Tokyo Chemical Industry Co., Ltd.) and 112.59 g of N-methylpyrrolidone (manufactured by Kanto Chemical Co., Inc.) were put, and by being stirred under ice-cooling, the solution became homogeneous. Next, into a dropping funnel, 5.95 g of methylenediphenyl 4,4'-diisocyanate (manufactured by Tokyo Chemical Industry Co., Ltd.) and 53.5 g of N-methylpyrrolidone (manufactured by Kanto Chemical Co., Inc.) were put, followed by dissolving, and the resulting solution was added dropwise to the reaction solution over a period of 1 hour. The resulting product was stirred at 0° C. to 10° C. for 1 hour, and allowed to react at room temperature for 2 hours. The reaction solution was added dropwise to a mixed solution of 0.5 L of pure water and 0.5 L of methanol, and as a result, a polymer was precipitated. This was collected by filtration, washed, and dried, whereby 14.8 g of a binder polymer (CP-1) having an average molecular weight of 76,000 was obtained. It was confirmed from the NMR spectrum, the IR spectrum, and GPC (polystyrene conversion) that the obtained product was the target substance.

Synthesis Example of Comparative Example 2
(CP-2)

Into a three-neck flask provided with a condenser and a stirrer, 6.97 g of 1,6-hexanediamine (manufactured by Tokyo Chemical Industry Co., Ltd.) and 53.9 g of N-methylpyrrolidone (manufactured by Kanto Chemical Co., Inc.) were put, and by being stirred at room temperature under a nitrogen flow, the solution became homogeneous. Next, 9.49 g of pyridine (manufactured by Kanto Chemical Co., Inc.) and 7.33 g of 4-dimethylaminopyridine (manufactured by Tokyo Chemical Industry Co., Ltd.) was added to the reaction solution, followed by dissolving. Next, 22.03 g of 4.4'-oxybis(b enzenesulfonylchloride) (manufactured by Tokyo Chemical Industry Co., Ltd.) was added to the flask, followed by stirring at room temperature for 1 hour, then, the temperature was raised to 60° C., and the resulting solution was allowed to react for 10 hours. The reaction solution was added dropwise to a mixed solution of 0.5 L of pure water and 0.5 L of methanol, and as a result, a polymer was precipitated. This was collected by filtration, washed, and dried, whereby 25.5 g of a binder polymer (CP-2) having an average molecular weight of 52,000 was obtained. It was confirmed from the NMR spectrum, the IR spectrum, and GPC (polystyrene conversion) that the obtained product was the target substance.

Synthesis Example of Comparative Example 3
(CP-3)

Into a three-neck flask provided with a condenser and a stirrer, 5.80 g of N,N'-dimethylformamide (manufactured by Wako Pure Chemical Industries, Ltd.) was put, and the solution was stirred at 65° C. for 30 minutes under a nitrogen flow. Next, into a dropping funnel, a 7.21 g of 4-methacrylamidebenzene sulfonamide (manufactured by FUJIFILM Finechemicals Co., Ltd.), 3.00 g of methyl methacrylate (manufactured by Wako Pure Chemical Industries, Ltd.), 2.12 g of acrylonitrile (manufactured by Tokyo Chemical Industry Co., Ltd.), 23.0 g of N,N'-dimethylformamide (manufactured by Wako Pure Chemical Industries, Ltd.), and 0.324 g of azobisisobutyronitrile (manufactured by Wako Pure Chemical Industries, Ltd.) were put, followed by dissolving, and the resulting solution was added dropwise to the flask over a period of 2 hours. The resulting product was stirred at 65° C. for 3 hours. The reaction solution was added dropwise to a mixed solution of 0.5 L of pure water and 0.5 L of methanol, and as a result, a polymer was precipitated. This was collected by filtration, washed, and dried, whereby 11.2 g of a binder polymer (CP-3) having an average molecular weight of 53,000 was obtained. It was confirmed from the NMR spectrum, the IR spectrum, and GPC (polystyrene conversion) that the obtained product was the target sub stance.

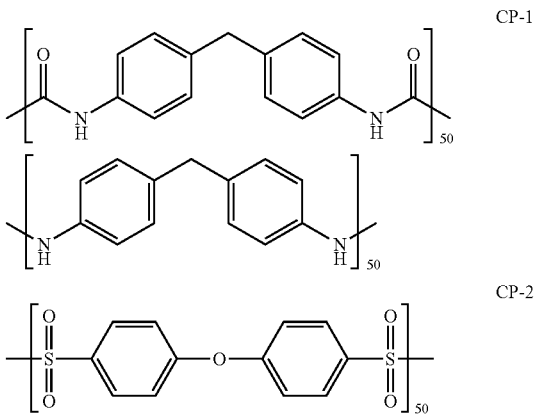

-continued

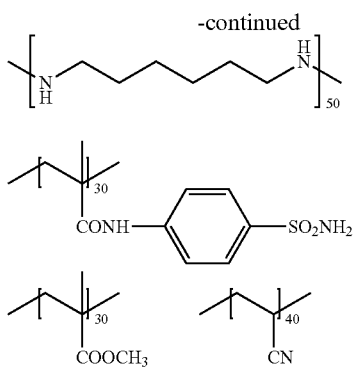

CP-3

As apparent from the results shown in Table 7, it is found that, in a case where the photosensitive resin composition of the present invention is used, developability and printing durability are improved.

Examples 19 to 36 and Comparative Examples 4 to 6

<Production of Support>

In the same manner as in Examples 1 to 18, supports A to F were produced.

<Formation of Undercoat>

In the same manner as in Examples 1 to 18, supports A-1 to F-1 having an undercoat were produced.

<Formation of Recording Layer>

After a coating solution composition (III) for forming an underlayer having the following compositional ratio was applied to the obtained supports A-1 to F-1 using a wire bar, the resulting product was dried in a drying oven at 150° C. for 40 seconds such that the coating amount became 1.0 g/m², whereby an underlayer was provided. After the underlayer was provided, a coating solution composition (IV) for forming an upper layer having the following compositional ratio was applied using a wire bar, whereby an upper layer was provided. After application, the resulting product was dried at 150° C. for 40 seconds, whereby a lithographic printing plate precursor in which the amount of the underlayer and the upper layer coated was 1.2 g/m² was obtained.

(Coating Solution Composition (III) for Forming Underlayer)

Copolymer (weight-average molecular weight of 65,000) of N-(p-aminosulfonylphenyl)methacrylamide/methyl methacrylate/acrylonitrile=35/35/30 (molar ratio): 3.5 parts m, p-Cresol novolac (m/p ratio=6/4, weight-average molecular weight of 6,000): 0.6 parts Infrared absorbent (above IR coloring agent (1)): 0.2 parts 4,4'-Bishydroxyphenyl sulfone: 0.3 parts Tetrahydrophthalic acid: 0.4 parts p-Toluenesulfonic acid: 0.02 parts 3-Methoxy-4-diazodiphenylamine hexafluorophosphate: 0.06 parts Product obtained by replacing a counter ion of ethyl violet with 6-hydroxynaphthalenesulfonic acid: 0.15 parts Fluorine-based surfactant (MEGAFAC F-780, manufactured by DIC Corporation): 0.07 parts Methyl ethyl ketone: 30 parts 1-Methoxy-2-butyrolactone: 15 parts γ-butyrolactone: 15 parts (Coating Solution Composition (IV) for Forming Upper Layer)

Specific polymer compound described in Table 8: 0.3 parts

Novolac resin (m-cresol/p-cresol/phenol=3/2/5, Mw 8,000): 0.4 parts

Infrared absorbent (above IR coloring agent (1)): 0.045 parts

Fluorine-based surfactant (MEGAFAC F-780, manufactured by DIC Corporation): 0.03 parts Methyl ethyl ketone: 15.0 parts 1-Methoxy-2-propanol: 30.0 parts 5-Benzoyl-4-hydroxy-2-methoxybenzenesulfonate of 1-(4-methylbenzyl)-1-phenylpiperidinium: 0.01 parts Evaluation was performed on the obtained lithographic printing plate precursor under the same conditions as in Example 1. The results are shown in the following Table 8.

TABLE 8

| | Support | Specific polymer compound | Non-image portion developing time (seconds) | Printing durability number of printed sheets (×10000 sheets) | Chemical resistance |
|---|---|---|---|---|---|
| Example 19 | A-1 | PU-2 | 3 | 12 | 1 |
| Example 20 | B-1 | PU-2 | 3 | 12 | 1 |
| Example 21 | C-1 | PU-2 | 3 | 12 | 1 |
| Example 22 | D-1 | PU-2 | 3 | 12 | 1 |
| Example 23 | E-1 | PU-2 | 3 | 12 | 1 |
| Example 24 | F-1 | PU-2 | 3 | 12 | 1 |
| Example 25 | A-1 | PU-5 | 4 | 11 | 1 |
| Example 26 | A-1 | PU-12 | 2 | 11 | 1 |
| Example 27 | A-1 | PU-14 | 2 | 11 | 1 |
| Example 28 | A-1 | PU-17 | 2 | 11 | 1 |
| Example 29 | A-1 | PU-20 | 3 | 11 | 1 |
| Example 30 | A-1 | PT-1 | 4 | 9 | 2 |
| Example 31 | A-1 | PT-2 | 2 | 9 | 2 |
| Example 32 | A-1 | PT-3 | 3 | 9 | 2 |
| Example 33 | A-1 | PK-1 | 3 | 8 | 1 |
| Example 34 | A-1 | PK-2 | 3 | 8 | 1 |
| Example 35 | A-1 | PA-1 | 3 | 15 | 1 |
| Example 36 | A-1 | PS-1 | 3 | 15 | 1 |
| Comparative Example 4 | A-1 | CP-1 | 150 | 9 | 2 |
| Comparative Example 5 | A-1 | CP-2 | 100 | 7 | 3 |
| Comparative Example 6 | A-1 | CP-3 | 18 | 4 | 2 |

As apparent from the results shown in Table 8, it is found that, in a case where the photosensitive resin composition of the present invention is used, chemical resistance, developability, and printing durability are improved.

Examples 37 to 54 and Comparative Examples 7 to 9

<Production of Support>

In the same manner as in Examples 1 to 18, supports A to F were produced.

<Formation of Undercoat>

An undercoat coating solution 2 shown below was applied to each of the supports A to F produced in the above manner, followed by drying at 80° C. for 15 seconds, whereby supports A-1 to F-1 provided with an undercoat were obtained. The coating amount after drying was 15 mg/m².

(Undercoat Coating Solution 2)

β-alanine: 0.5 parts

Methanol: 95 parts

Water: 5 parts

<Formation of Recording Layer>

After a coating solution composition (V) for forming an underlayer having the following compositional ratio was applied to the obtained supports A-1 to F-1 using a wire bar such that the coating amount became 1.5 g/m², the resulting product was dried in a drying oven at 160° C. for 40 seconds and, immediately, cooled until the temperature of the support reached 35° C. using a cold air at 17° C. to 20° C., whereby an underlayer was provided. After the underlayer was provided, a coating solution composition (VI) for forming an upper layer having the following compositional ratio was applied thereto using a wire bar such that the coating amount became 0.5 g/m², and by drying the resulting product at 130° C. for 40 seconds and slowly cooling using an air at 20° C. to 26° C., an upper layer was provided, whereby a lithographic printing plate precursor was obtained.

(Coating Solution Composition (V) for Forming Underlayer)

Specific polymer compound described in Table 9: 0.8 parts
Infrared absorbent (IR coloring agent (1): above structure): 0.017 parts
CRYSTAL VIOLET (manufactured by HODOGAYA CHEMICAL CO., LTD.): 0.017 parts
MEGAFAC F-177 (manufactured by DIC Corporation, fluorine-based surfactant): 0.015 parts
γ-Butyrolactone: 10 parts
Methyl ethyl ketone: 10 parts
1-Methoxy-2-propanol: 8 parts (Coating Solution Composition (VI) for Forming Upper Layer)

Styrene/acrylonitrile/methacrylic acid copolymers (compositional ratio of 69 mol %/25 mol %/6 mol %, weight-average molecular weight=45,000): 20 parts
Alkali-soluble resin: following polyurethane 1: 10 parts
Ethyl Violet: 0.03 parts
MEGAFAC F-177 (manufactured by DIC Corporation, fluorine-based surfactant): 0.05 parts
3-Pentanone: 60 parts
Propylene glycol monomethyl ether-2-acetate: 8 parts (Polyurethane 1)

A diisocyanate compound and a diol compound represented by the following formulae was polymerized to be a molar ratio of 1:1 (weight-average molecular weight of 36,000).

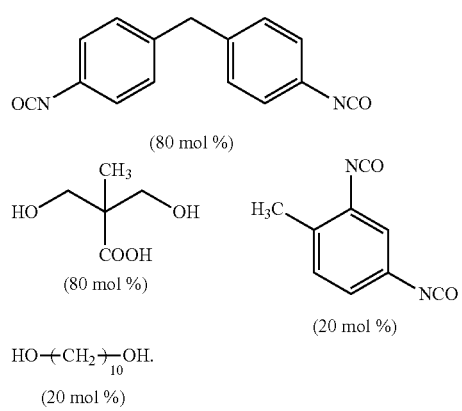

Evaluation was performed on the obtained lithographic printing plate precursor under the same conditions as in Example 1 except that the specific developer A described below was used in a development treatment. The results are shown in the following Table 9.

(Compositional Ratio of Specific Developer A)
Water: 796 parts
Sodium carbonate: 12.8 parts
Sodium hydrogen carbonate: 7.0 parts
Sodium gluconate: 15.5 parts
Softazoline LPB-R (30% aqueous solution): 154.0 parts
Softazoline LAO (30% aqueous solution): 38.0 parts
Ethylenediamine di succinate: 6.7 parts
pH 9.85

TABLE 9

| | Support | Specific polymer compound | Non-image portion developing time (seconds) | Printing durability number of printed sheets (×10000 sheets) | Chemical resistance |
|---|---|---|---|---|---|
| Example 37 | A-1 | PU-2 | 6 | 18 | 1 |
| Example 38 | B-1 | PU-2 | 6 | 18 | 1 |
| Example 39 | C-1 | PU-2 | 6 | 18 | 1 |
| Example 40 | D-1 | PU-2 | 6 | 18 | 1 |
| Example 41 | E-1 | PU-2 | 6 | 18 | 1 |
| Example 42 | F-1 | PU-2 | 6 | 18 | 1 |
| Example 43 | A-1 | PU-5 | 8 | 18 | 1 |
| Example 44 | A-1 | PU-12 | 4 | 17 | 1 |
| Example 45 | A-1 | PU-14 | 4 | 16 | 1 |
| Example 46 | A-1 | PU-17 | 4 | 16 | 1 |
| Example 47 | A-1 | PU-20 | 5 | 15 | 1 |
| Example 48 | A-1 | PT-1 | 4 | 13 | 2 |
| Example 49 | A-1 | PT-2 | 4 | 14 | 2 |
| Example 50 | A-1 | PT-3 | 4 | 14 | 2 |
| Example 51 | A-1 | PK-1 | 5 | 11 | 1 |
| Example 52 | A-1 | PK-2 | 5 | 11 | 1 |
| Example 53 | A-1 | PA-1 | 6 | 20 | 1 |
| Example 54 | A-1 | PS-1 | 6 | 20 | 1 |
| Comparative Example 7 | A-1 | CP-1 | 150 | 12 | 2 |
| Comparative Example 8 | A-1 | CP-2 | 100 | 10 | 3 |
| Comparative Example 9 | A-1 | CP-3 | 25 | 8 | 2 |

As apparent from the results shown in Table 9, it is found that, in a case where the photosensitive resin composition of the present invention is used, chemical resistance, developability, and printing durability are improved.

Examples 55 to 72 and Comparative Examples 10 to 12

<Production of Support>

In the same manner as in Examples 1 to 18, supports A to F were produced.

<Formation of Undercoat>

In the same manner as in Examples 37 to 54, supports A-1 to F-1 having an undercoat were produced.

<Formation of Recording Layer>

After a coating solution composition (VII) for forming an underlayer having the following compositional ratio was applied to the obtained supports A-1 to F-1 using a wire bar such that the coating amount became 1.5 g/m², the resulting product was dried in a drying oven at 160° C. for 40 seconds and, immediately, cooled until the temperature of the support reached 35° C. using a cold air at 17° C. to 20° C., whereby an underlayer was provided. After the underlayer was provided, a coating solution composition (VIII) for forming an upper layer having the following compositional ratio was applied thereto using a wire bar such that the coating amount became 0.5 g/m², and by drying the resulting product at 130° C. for 40 seconds and slowly cooling using an air at 20° C. to 26° C., an upper layer was provided, whereby a lithographic printing plate precursor was obtained.

(Coating Solution Composition (VII) for Forming Underlayer)
  N-phenylmaleimide/methacrylic acid/methacrylic amide copolymer (copolymerization ratio of 60 mol %/15 mol %/25 mol %, weight-average molecular weight=50,000): 0.8 parts
  Infrared absorbent (IR coloring agent (1): above structure): 0.017 parts
  CRYSTAL VIOLET (manufactured by HODOGAYA CHEMICAL CO., LTD.): 0.017 parts
  MEGAFAC F-177 (manufactured by DIC Corporation, fluorine-based surfactant): 0.015 parts
  γ-Butyrolactone: 10 parts
  Methyl ethyl ketone: 10 parts
  1-Methoxy-2-propanol: 8 parts (Coating Solution Composition (VIII) for Forming Upper Layer)
  Specific polymer compound described in Table 10: 20 parts
  Alkali-soluble resin: the above-described polyurethane 1: 10 parts
  Ethyl Violet: 0.03 parts
  MEGAFAC F-177 (manufactured by DIC Corporation, fluorine-based surfactant): 0.05 parts
  3-Pentanone: 60 parts
  Propylene glycol monomethyl ether-2-acetate: 8 parts Evaluation was performed on the obtained lithographic printing plate precursor under the same conditions as in Examples 37 to 54. The results are shown in the following Table 10.

TABLE 10

| | Support | Specific polymer compound | Non-image portion developing time (seconds) | Printing durability number of printed sheets (×10000 sheets) | Chemical resistance |
|---|---|---|---|---|---|
| Example 55 | A-1 | PU-2 | 5 | 15 | 1 |
| Example 56 | B-1 | PU-2 | 5 | 15 | 1 |
| Example 57 | C-1 | PU-2 | 5 | 15 | 1 |
| Example 58 | D-1 | PU-2 | 5 | 15 | 1 |
| Example 59 | E-1 | PU-2 | 5 | 15 | 1 |
| Example 60 | F-1 | PU-2 | 5 | 15 | 1 |
| Example 61 | A-1 | PU-5 | 6 | 15 | 1 |
| Example 62 | A-1 | PU-12 | 4 | 14 | 1 |
| Example 63 | A-1 | PU-14 | 4 | 14 | 1 |
| Example 64 | A-1 | PU-17 | 4 | 13 | 1 |
| Example 65 | A-1 | PU-20 | 4 | 13 | 1 |
| Example 66 | A-1 | PT-1 | 3 | 12 | 2 |
| Example 67 | A-1 | PT-2 | 3 | 12 | 2 |
| Example 68 | A-1 | PT-3 | 3 | 12 | 2 |
| Example 69 | A-1 | PK-1 | 4 | 11 | 1 |
| Example 70 | A-1 | PK-2 | 4 | 11 | 1 |
| Example 71 | A-1 | PA-1 | 4 | 18 | 1 |
| Example 72 | A-1 | PS-1 | 4 | 18 | 1 |
| Comparative Example 10 | A-1 | CP-1 | 120 | 11 | 2 |
| Comparative Example 11 | A-1 | CP-2 | 120 | 9 | 3 |
| Comparative Example 12 | A-1 | CP-3 | 16 | 6 | 2 |

As apparent from the results shown in Table 10, it is found that, in a case where the photosensitive resin composition of the present invention is used, chemical resistance, developability, and printing durability are improved.

Examples 73 to 90 and Comparative Examples 13 to 15

<Production of Support>
In the same manner as in Examples 1 to 18, supports A to F were produced.
<Formation of Undercoat>
In the same manner as in Examples 1 to 18, supports A-1 to F-1 having an undercoat were produced.
<Formation of Recording Layer>
After a coating solution composition (IX) having the following compositional ratio was applied to the obtained supports A-1 to F-1 using a wire bar, the resulting product was dried in a drying oven at 140° C. for 50 seconds, whereby a lithographic printing plate precursor having a coating amount of 1.0 g/m² was obtained.

(Coating Solution Composition (IX))
  m, p-Cresol novolac (m/p ratio=6/4, weight-average molecular weight of 5,000): 0.474 parts
  Specific polymer compound described in Table 11: 2.37 parts
  Infrared absorbent (above IR coloring agent (1)): 0.155 parts
  2-Methoxy-4-(N-phenylamino)benzenediazonium hexafluorophosphate: 0.03 parts
  Tetrahydrophthalic anhydride: 0.19 parts
  Product obtained by replacing an counter ion of ethyl violet with 6-hydroxy-β-naphthalenesulfonic acid: 0.11 parts
  Fluorine-based surfactant (MEGAFAC F-780, manufactured by Dainippon Ink and Chemicals): 0.07 parts
  p-Toluenesulfonic acid: 0.008 parts
  Bis-p-hydroxyphenyl sulfone: 0.13 parts
  3,3'-Dimyristyl thiodipropionate: 0.04 parts
  Lauryl stearate: 0.02 parts
  γ-Butyrolactone: 13 parts
  Methyl ethyl ketone: 24 parts
  1-Methoxy-2-propanol: 11 parts Evaluation was performed on the obtained lithographic printing plate precursor under the same conditions as in Example 1 except that a developer LH-DS manufactured by Fujifilm Corporation was used in a development treatment, and the results are shown in the following Table 11.

TABLE 11

| | Support | Specific polymer compound | Non-image portion developing time (seconds) | Printing durability number of printed sheets (×10000 sheets) | Chemical resistance |
|---|---|---|---|---|---|
| Example 73 | A-1 | PU-2 | 5 | 13 | 1 |
| Example 74 | B-1 | PU-2 | 5 | 13 | 1 |
| Example 75 | C-1 | PU-2 | 5 | 13 | 1 |
| Example 76 | D-1 | PU-2 | 5 | 13 | 1 |
| Example 77 | E-1 | PU-2 | 5 | 13 | 1 |
| Example 78 | F-1 | PU-2 | 5 | 13 | 1 |
| Example 79 | A-1 | PU-5 | 6 | 13 | 1 |
| Example 80 | A-1 | PU-12 | 4 | 12 | 1 |
| Example 81 | A-1 | PU-14 | 4 | 12 | 1 |
| Example 82 | A-1 | PU-17 | 4 | 12 | 1 |
| Example 83 | A-1 | PU-20 | 4 | 11 | 1 |
| Example 84 | A-1 | PT-1 | 3 | 11 | 2 |
| Example 85 | A-1 | PT-2 | 3 | 11 | 2 |
| Example 86 | A-1 | PT-3 | 3 | 11 | 2 |
| Example 87 | A-1 | PK-1 | 4 | 10 | 1 |
| Example 88 | A-1 | PK-2 | 4 | 10 | 1 |
| Example 89 | A-1 | PA-1 | 4 | 16 | 1 |
| Example 90 | A-1 | PS-1 | 4 | 16 | 1 |

TABLE 11-continued

| | Support | Specific polymer compound | Non-image portion developing time (seconds) | Printing durability number of printed sheets (×10000 sheets) | Chemical resistance |
|---|---|---|---|---|---|
| Comparative Example 13 | A-1 | CP-1 | 120 | 11 | 2 |
| Comparative Example 14 | A-1 | CP-2 | 120 | 8 | 3 |
| Comparative Example 15 | A-1 | CP-3 | 25 | 6 | 2 |

As apparent from the results shown in Table 11, it is found that, in a case where the photosensitive resin composition of the present invention is used, chemical resistance, developability, and printing durability are improved.

What is claimed is:

1. A positive type lithographic printing plate precursor comprising:
 a recording layer which contains a photosensitive resin composition on a support having a hydrophilic surface, wherein the photosensitive resin composition comprises:
 a polymer compound which has an amine bond or a quaternary ammonium salt bond in the main chain, and at least one bond selected from the group consisting of a urea bond, a urethane bond, and a carbonate bond in the main chain and has a sulfonamide group or a phenolic hydroxyl group in the main chain and/or the side chain; and
 an infrared absorbing material.

2. The positive type lithographic printing plate precursor according to claim 1, which is formed to include the recording layer having an underlayer and an upper layer in this order, on the support having a hydrophilic surface, wherein at least one of the underlayer or the upper layer contains the photosensitive resin composition.

3. The positive type lithographic printing plate precursor according to claim 1, comprising:
 an undercoat between the support and the recording layer.

4. A method for producing a lithographic printing plate, comprising in the following order:
 an exposure step of image-wise exposing the positive type lithographic printing plate precursor according to claim 1; and
 a development step of developing using an alkali aqueous solution having a pH of 8.5 to 13.5.

5. The positive type lithographic printing plate precursor according to claim 1, wherein the polymer compound has at least one constitutional unit represented by the following Formula 1 or 2 in the main chain,

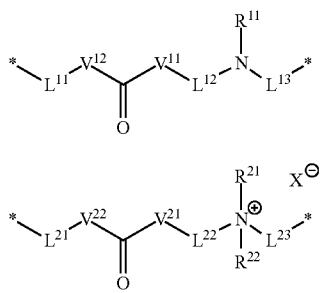

in Formulae 1 and 2, $R^{11}$ represents a hydrogen atom or a monovalent organic group, $L^{11}$ to $L^{13}$ each independently represent a divalent linking group, $V^{11}$ and $V^{12}$ each independently represent —N($R^{1A}$)— or —O—, $R^{1A}$ represents a hydrogen atom or a monovalent organic group, $R^{21}$ and $R^{22}$ each independently represent a hydrogen atom or a monovalent organic group, $L^{21}$ to $L^{23}$ each independently represent a divalent linking group, $V^{21}$ and $V^{22}$ each independently represent —N($R^{2A}$)— or —O—, $R^{2A}$ represents a hydrogen atom or a monovalent organic group, X represents an inorganic or organic conjugate base, and the "*" portions each independently represent a binding position with another structure.

6. The positive type lithographic printing plate precursor according to claim 5, wherein $V^{11}$ and $V^{12}$ represent —N($R^{1A}$)—, and
 $V^{21}$ and $V^{22}$ represent —N($R^{2A}$)—.

7. The positive type lithographic printing plate precursor according to claim 5, wherein at least one of $L^{11}$, $L^{12}$, or $L^{13}$ represents a linking group having a sulfonamide group or a phenolic hydroxyl group, and
 at least one of $L^{21}$, $L^{22}$, or $L^{23}$ represents a linking group having a sulfonamide group or a phenolic hydroxyl group.

8. The positive type lithographic printing plate precursor according to claim 5, wherein $L^{11}$ represents a linking group having a sulfonamide group or a phenolic hydroxyl group, and
 $L^{21}$ represents a linking group having a sulfonamide group or a phenolic hydroxyl group.

9. The positive type lithographic printing plate precursor according to claim 5, wherein $L^{11}$ and/or $L^{21}$ is represented by the following Formula A-1,

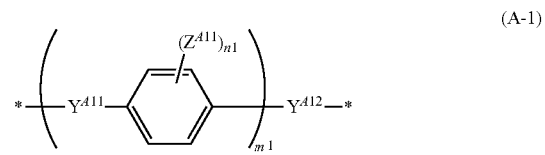

in Formula A-1, $Y^{411}$ and $Y^{412}$ each independently represent a single bond or a divalent linking group, $Z^{411}$'s each independently represent a sulfonamide group or a hydroxy group, m1 represents an integer of 1 or greater, n1 represents an integer of 1 to 4, and the "*" portions each independently represent a binding position with another structure.

10. The positive type lithographic printing plate precursor according to claim 5, wherein $L^{11}$ and/or $L^{21}$ is represented by the following Formula A-2,

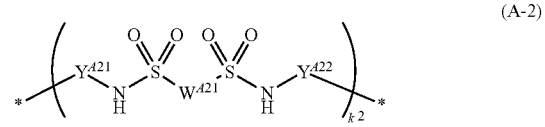

in Formula A-2, $Y^{421}$ and $Y^{422}$ each independently represent a divalent linking group, $W^{421}$ represents an arylene group or a combination of an arylene group and a divalent linking group, k2 represents an integer of 1 or greater, and the "*" portions each independently represent a binding position with another structure.

11. The positive type lithographic printing plate precursor according to claim 5, wherein $L^{11}$ and/or $L^{21}$ is represented by the following Formula A-3,

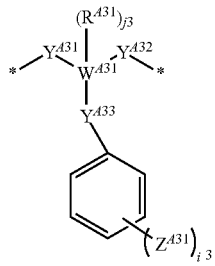

(A-3)

in Formula A-3, $R^{A31}$ represents a hydrogen atom or a monovalent organic group, $Y^{A31}$, $Y^{A32}$, and $Y^{A33}$ each independently represent a divalent linking group, $W^{A31}$ represents a carbon atom or a nitrogen atom, $Z^{A31}$'s each independently represent a sulfonamide group or a hydroxy group, i3 represents an integer of 1 to 5, j3 represents 1 or 0, and the "*" portions each independently represent a binding position with another structure.

* * * * *